United States Patent
Lee et al.

(10) Patent No.: US 12,167,587 B2
(45) Date of Patent: Dec. 10, 2024

(54) SEMICONDUCTOR MEMORY DEVICE AND METHOD OF FABRICATING THE SAME

(71) Applicant: Samsung Electronics Co., Ltd., Suwon-si (KR)

(72) Inventors: Jang Eun Lee, Hwaseong-si (KR); Suk Hoon Kim, Hwaseong-si (KR); Hyo-Sub Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 160 days.

(21) Appl. No.: 17/733,051

(22) Filed: Apr. 29, 2022

(65) Prior Publication Data

US 2023/0035899 A1     Feb. 2, 2023

(30) Foreign Application Priority Data

Jul. 28, 2021 (KR) .................. 10-2021-0098953

(51) Int. Cl.
*H10B 12/00* (2023.01)
(52) U.S. Cl.
CPC .......... *H10B 12/315* (2023.02); *H10B 12/34* (2023.02); *H10B 12/485* (2023.02)
(58) Field of Classification Search
CPC .. H10B 12/0335; H10B 12/315; H10B 12/34; H10B 12/482; H10B 12/485
See application file for complete search history.

(56) References Cited

U.S. PATENT DOCUMENTS

| | | | |
|---|---|---|---|
| 10,332,831 B2 | 6/2019 | Hong et al. | |
| 10,373,961 B2 | 8/2019 | Yoon et al. | |
| 10,439,048 B2 | 10/2019 | Lim et al. | |
| 10,644,008 B2 | 5/2020 | Lee et al. | |
| 10,777,562 B1 | 9/2020 | Sandhu et al. | |
| 10,886,277 B2 | 1/2021 | Hong et al. | |
| 2015/0061134 A1* | 3/2015 | Lee .................. | H10B 12/34 257/751 |
| 2015/0194438 A1* | 7/2015 | Kim .................. | H10B 12/488 257/324 |
| 2016/0005743 A1 | 1/2016 | Lim et al. | |
| 2016/0197042 A1 | 7/2016 | Lee et al. | |
| 2017/0117371 A1* | 4/2017 | Adusumilli ....... | H01L 29/41791 |
| 2021/0057339 A1 | 2/2021 | Lee et al. | |
| 2021/0066200 A1 | 3/2021 | Park et al. | |

* cited by examiner

*Primary Examiner* — Meiya Li
(74) *Attorney, Agent, or Firm* — Harness, Dickey & Pierce, P.L.C.

(57) ABSTRACT

A semiconductor memory device with an improved electric characteristic and reliability is provided. The semiconductor memory device including a substrate including an active region defined by device separation film, the active region including a first part and second parts, the second parts being on two opposite sides of the first part, respectively a bit line extending on the substrate and across the active region, and a bit line contact between the substrate and the bit line and connected to the first part of the active region may be provided. The bit line contact includes a first ruthenium pattern, and a width of upper surface of the first ruthenium pattern is smaller than a width of bottom surface of the first ruthenium pattern.

20 Claims, 56 Drawing Sheets

SEMICONDUCTOR MEMORY DEVICE AND METHOD OF FABRICATING THE SAME

CROSS-REFERENCE TO RELATED APPLICATION

This application claims priority to Korean Patent Application No. 10-2021-0098953, filed on Jul. 28, 2021, and all the benefits accruing therefrom under 35 U.S.C. § 119, the disclosure of which is incorporated herein by reference in its entirety.

BACKGROUND

1. Field

The present disclosure relates to semiconductor memory devices and/or methods of fabricating the same.

2. Description of the Related Art

As semiconductor devices are becoming highly integrated, individual circuit patterns for implementing as many semiconductor devices as possible in any given area are becoming more sophisticated. That is, as the integration density of semiconductor devices increases, the design rule for the elements of each semiconductor device decreases.

In a highly scaled semiconductor device, the critical dimension of electrodes becomes small. Thus, studies are being conducted on new integration techniques.

SUMMARY

Some example embodiments of the present disclosure provide semiconductor memory devices with an improved electric characteristic and reliability.

Some example embodiments of the present disclosure provide methods of fabricating a semiconductor memory device with an improved electric characteristic and reliability.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to an aspect of the present disclosure, a semiconductor memory device may include a substrate including an active region defined by device separation film, the active region including a first part and second parts, the second parts being on two opposite sides of the first part, respectively, a bit line on the substrate and extending across the active region, and a bit line contact between the substrate and the bit line and connected to the first part of the active region, wherein the bit line contact include a first ruthenium pattern, and a width of upper surface of the first ruthenium pattern is smaller than a width of bottom surface of the first ruthenium pattern.

According to another aspect of the present disclosure, a semiconductor memory device may include a substrate including an active region defined by a device separation film, the active region including a first part and second parts, the second parts being on two opposite sides of the first part, respectively, a first node pad and a second node pad connected to the second parts of active region adjacent in a first direction, respectively, a pad separation pattern on the substrate and separating the first node pad and the second node pad, and the pad separation pattern covering an upper surface of the first node pad and an upper surface of the second node pad, a bit line contact on the substrate and spaced apart from the first node pad in the first direction, and the bit line contact connected to the first part of the active region, a first bit line on the pad separation pattern and extending in a second direction, is the second direction being different from the first direction, and a second bit line connected to an upper surface of the bit line contact and spaced apart from the first bit line in the first direction, wherein each of the bit line contact, the first node pad, and the second node pad includes a ruthenium pattern.

According to still another aspect of the present disclosure, a semiconductor memory device may include a substrate including active region defined by a device separation film, the active region including a first part and second parts, the second parts being on two opposite sides of the first part, respectively, a word line extending in a first direction between the first part and a corresponding one of the second parts of the active region, the word line being in the substrate and the device separation film, a bit line contact connected to the first part of the active region, a node pad connected to the second part of the active region, a bit line on the bit line contact, connected to the bit line contact, and extending in a second direction, is the second direction being different from the first direction, a storage contact connected to the node pad, and a capacitor connected to the storage contact, wherein the bit line contact has a same stack structure as the node pad, each of the bit line contact and the node pad includes a ruthenium pattern, and an upper surface of the node pad is lower than an upper surface of the bit line contact.

According to further still another aspect of the present disclosure, a method of fabricating a semiconductor memory device may include forming a device separation film in a substrate to define an active region, the active region including a first part and second parts, the second parts being on two opposite sides of the first part, respectively, forming a conductive film including a ruthenium film on the substrate, forming a first conductive pattern and a second conductive pattern by etching the conductive film, the first conductive pattern having a circular shape in a plan view and overlapping the first part of the active region, the second conductive pattern overlapping the second part of the active region, forming a third conductive pattern by removing a part of the second conductive pattern, forming node pads overlapping the second parts of the active region by etching the third conductive patterns, forming a pad separation patterns between the node pads to cover upper surfaces of the node pads, forming bit line on the first conductive pattern, and forming bit line contact by etching the first conductive pattern using the bit line as a mask.

Other features and other example embodiments may be apparent from the following detailed description, the drawings, and the claims.

BRIEF DESCRIPTION OF THE DRAWINGS

The above and other example embodiments and features of the present disclosure will become more apparent by describing in detail some example embodiments thereof with reference to the attached drawings, in which.

DETAILED DESCRIPTION

Figure 1:
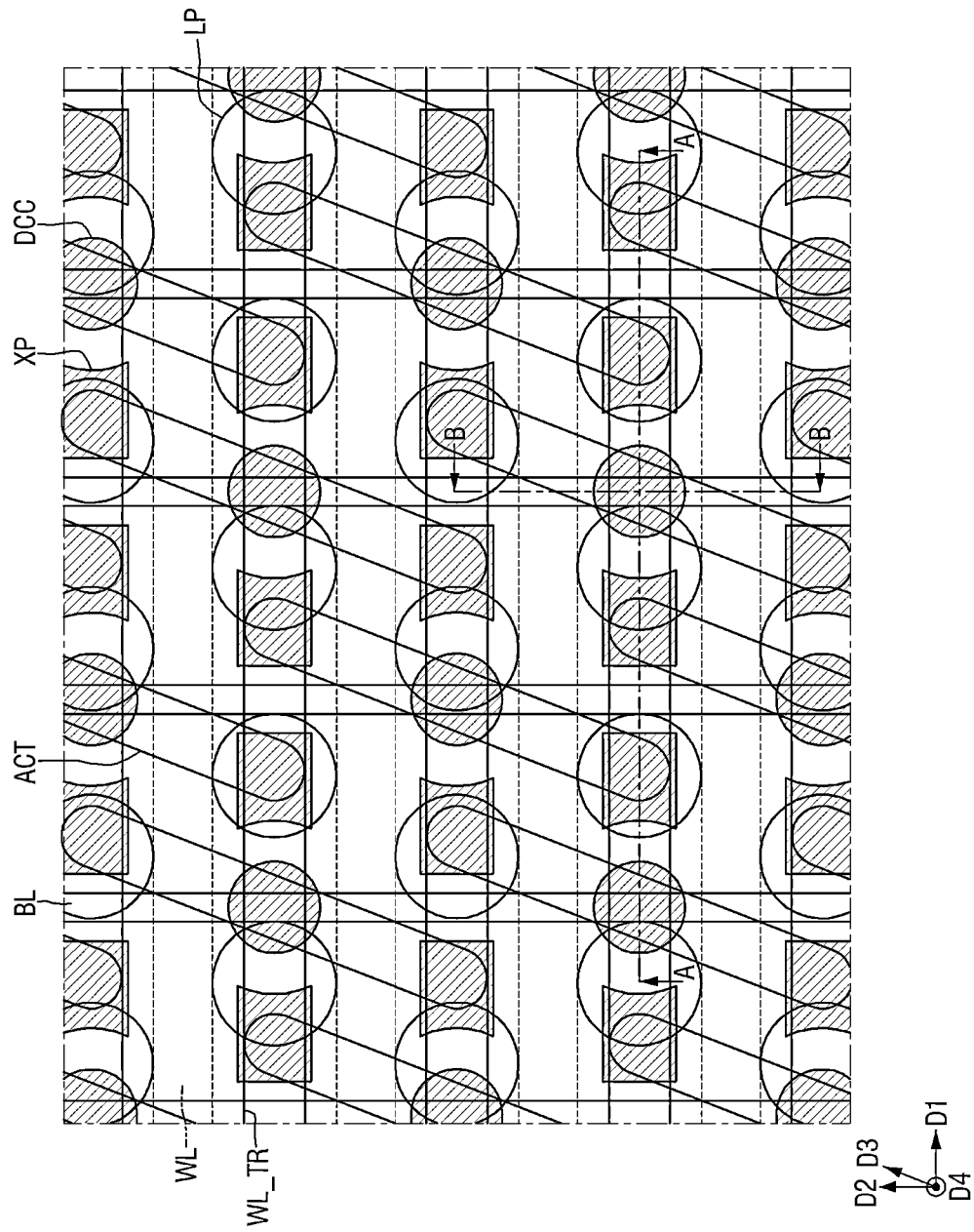
FIG. 1 is a plan view of a cell region of a semiconductor memory device according to some example embodiments of the present disclosure.
Figure 2:
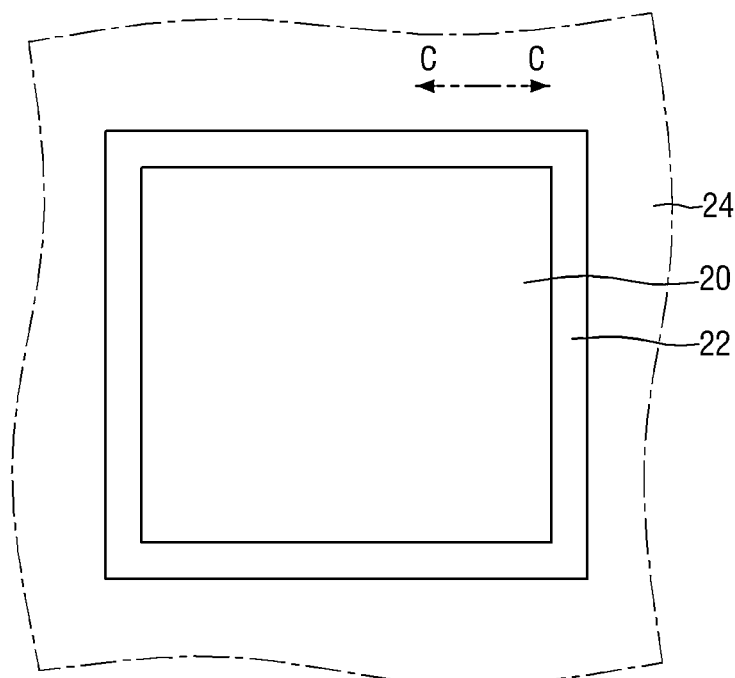
FIG. 2 is a layout view of a semiconductor memory device including the cell region of FIG. 1.
Figure 3:
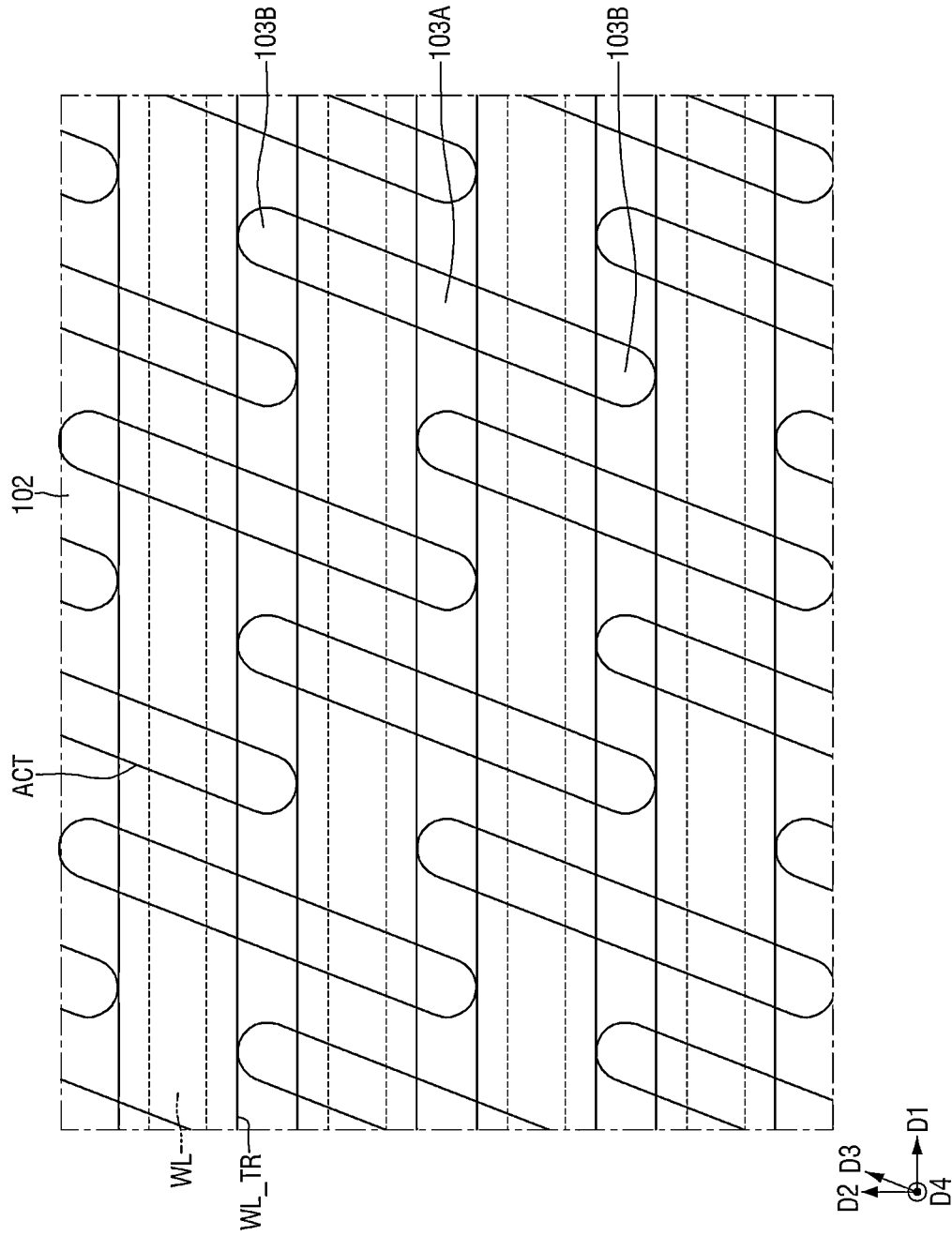
FIG. 3 is a plan view illustrating only word lines and active regions of FIG. 1.
Figure 4:
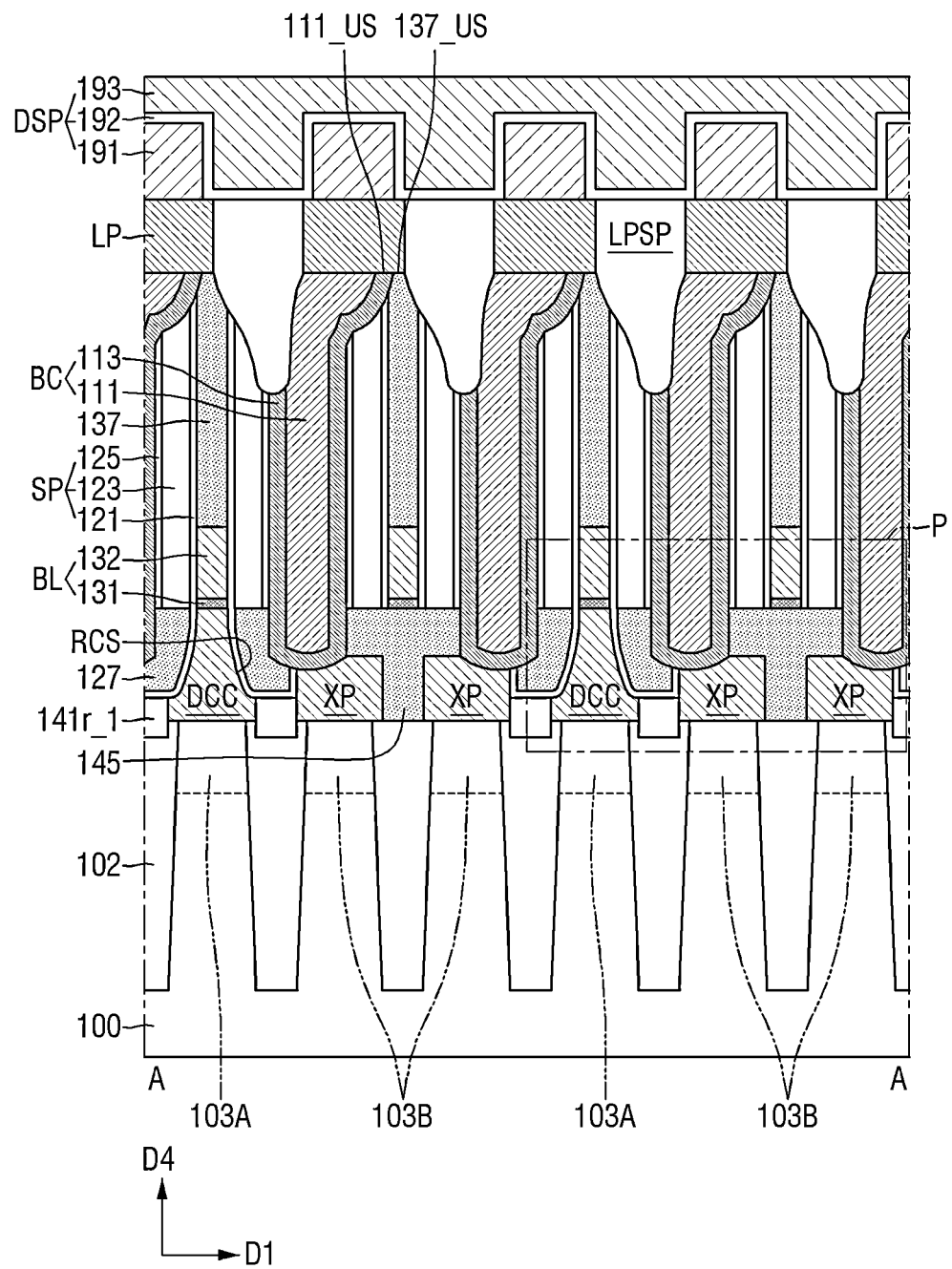
FIGS. 4 and 5 are cross-sectional views taken along lines A-A and B-B, respectively, of FIG. 1.
Figure 5:
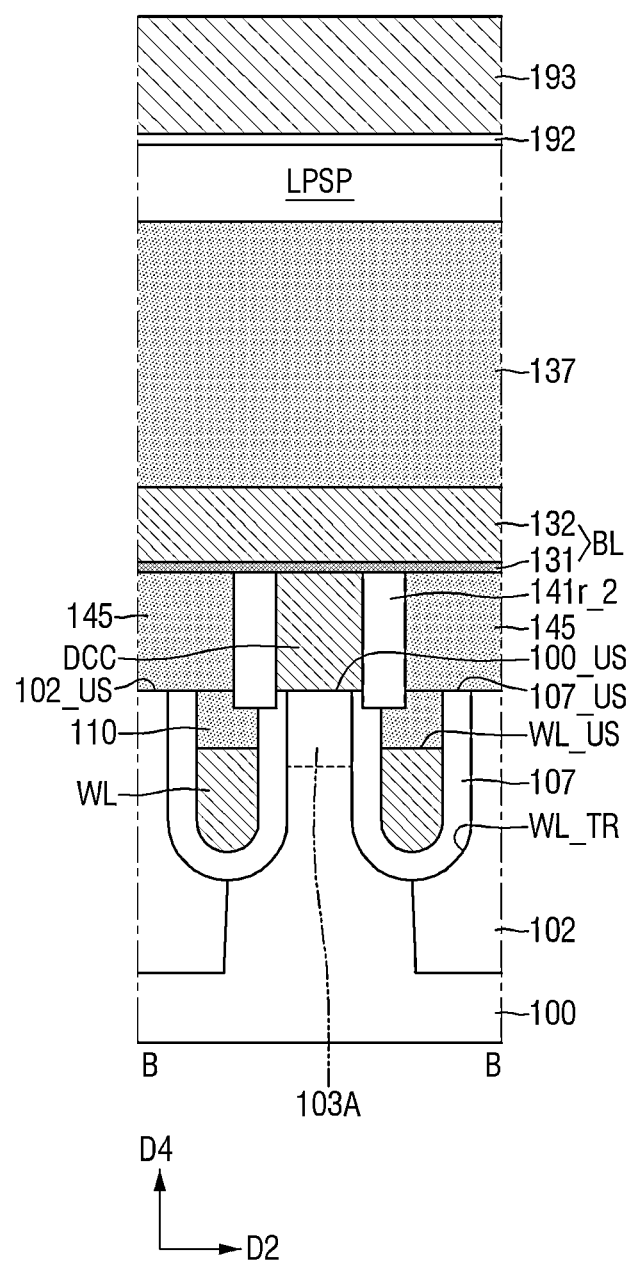
Figure 6:
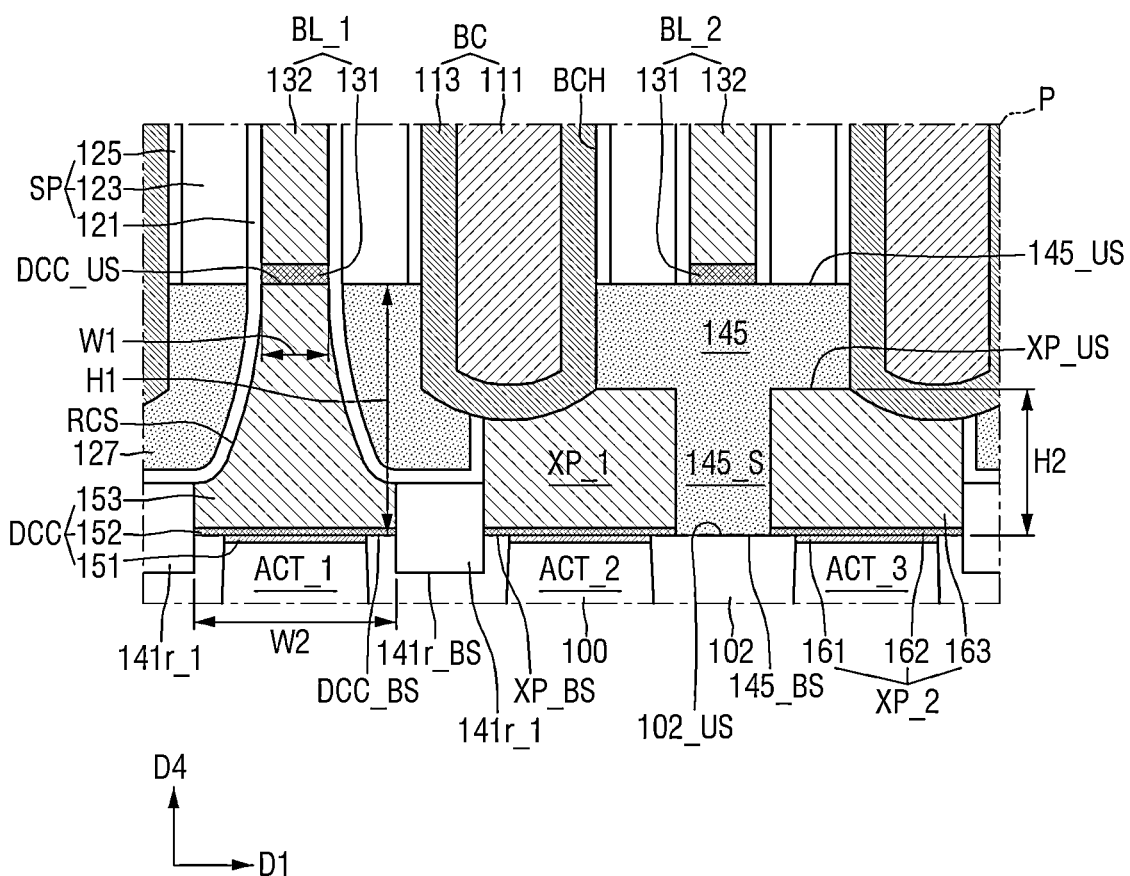
FIG. 6 is an enlarged cross-sectional view of part P of FIG. 4.
Figure 7:
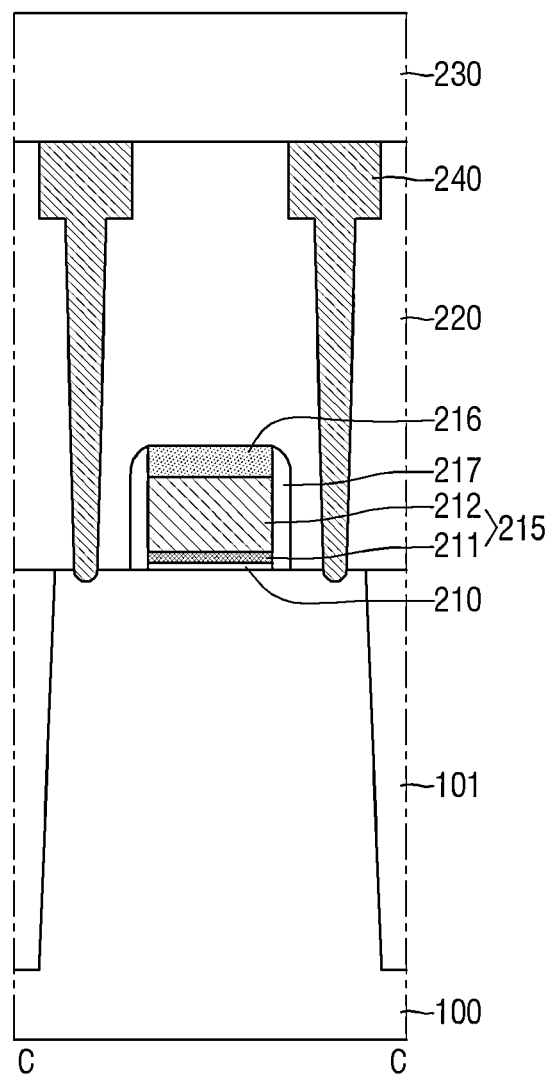
FIG. 7 is a cross-sectional view taken along line C-C of FIG. 2.

FIG. 1 is a plan view of a cell region of a semiconductor memory device according to some example embodiments of the present disclosure. FIG. 2 is a layout view of a semiconductor memory device including the cell region of FIG. 1. FIG. 3 is a plan view illustrating only word lines and active regions of FIG. 1. FIGS. 4 and 5 are cross-sectional views taken along lines A-A and B-B, respectively, of FIG. 1. FIG. 6 is an enlarged cross-sectional view of part P of FIG. 4. FIG. 7 is a cross-sectional view taken along line C-C of FIG. 2.

Specifically, FIG. 7 is a cross-sectional view of a transistor forming region in a peripheral region.

FIGS. 1 through 7 illustrate a dynamic random-access memory (DRAM) device as an example semiconductor memory device, but the present disclosure is not limited thereto.

Referring to FIGS. 1 through 3, the semiconductor memory device according to some example embodiments may include a cell region 20, a cell region separation film 22, and a peripheral region 24.

The cell region separation film 22 may be formed to surround the cell region 20. The cell region separation film 22 may separate the cell region 20 and the peripheral region 24. The peripheral region 24 may be defined on the periphery of the cell region 20.

The cell region 20 may include a plurality of cell active regions ACT. The cell active regions ACT may be defined by cell device separation films 102 (of FIG. 4), which are formed in a substrate 100 (of FIG. 4). As the design rule of the semiconductor memory device decreases, the cell active regions ACT may be arranged as diagonal or oblique bars. For example, the cell active regions ACT may extend in a third direction D3.

The cell active regions ACT may correspond to parts of the substrate 100 surrounded by the cell device separation films 102. The substrate 100 may include the cell active regions ACT, which are defined by the cell device separation films 102. The cell active regions ACT may be arranged in parallel to one another in the third direction D3. The end of one cell active region ACT may be disposed adjacent to the center of a neighboring cell active region ACT. The end of one cell active region ACT may be disposed adjacent to the center of a neighboring cell active region ACT in a first direction D1.

A plurality of gate electrodes may be arranged across the cell active regions ACT in the first direction D1. The gate electrodes may extend in parallel to one another. The gate electrodes may be, for example, word lines WL. The word lines WL may be arranged at regular intervals. The width of the word lines WL or the distance between the word lines WL may be determined by the design rule of the semiconductor memory device. The word lines WL may be disposed in word line trenches WL_TR. The word line trenches WL_TR may extend in the first direction D1. The word line trenches WL_TR may extend across the cell active regions ACT.

Each of the cell active regions ACT may be divided into three parts by two word lines WL extending in the first direction D1. For example, each of the cell active regions ACT may be divided into three parts by two word line trenches WL_TR extending in the first direction D1. Each of the cell active regions ACT may include a first part 103A and second parts 103B, which are defined on two opposite sides of the first part 103A, respectively. A first part 103A may be positioned in the middle of each of the cell active regions ACT, and second parts 103B may be positioned at both ends of each of the cell active regions ACT. The word lines WL may extend between the first part 103A and the second parts 103B of each of the cell active regions ACT.

For example, the first part 103A of each of the cell active regions ACT may be connected to a bit line BL, and the second parts 103B of each of the cell active regions ACT may be connected to an information storage unit DSP (of FIG. 4). In other words, the first part 103A of each of the cell active regions ACT may correspond to a common drain region, and the second parts 103B of each of the cell active regions ACT may correspond to source regions. The word lines WL and the first part 103A and the second parts 103B of each of the cell active regions ACT may form transistors.

A plurality of bit lines BL may be disposed on the word lines WL and may extend in a second direction D2 to intersect the word lines WL. The bit lines BL may be disposed on the substrate 100 (of FIG. 4). The bit lines BL may extend across the cell active regions ACT, which extend in the third direction D3. The bit lines BL may extend in parallel to one another. The bit lines BL may be arranged at regular intervals. The width of the bit lines BL and the distance between the bit lines BL may be determined by the design rule of the semiconductor memory device.

The semiconductor memory device according to some example embodiments may include various contact arrangements. The contact arrangements may include, for example, bit line contacts DCC, node pads XP, and landing pads LP.

Here, the bit line contacts DCC may refer to contacts electrically connecting the cell active regions ACT to the bit lines BL. The node pads XP may be connection pads connecting the cell active regions ACT to lower electrodes 191 (of FIG. 4) of capacitors. The contact areas of the node pads XP and the cell active regions ACT may be small. Thus, the landing pads LP, which have conductivity, may be provided to increase the contact areas of the cell active regions ACT and the lower electrodes 191.

The landing pads LP may be disposed between the node pads XP and the lower electrodes 191. As the contact areas of the cell active regions ACT and the lower electrodes 191 increase due to the provision of the landing pads LP, the contact resistance between the cell active regions ACT and the lower electrodes 191 may decrease.

The bit line contacts DCC may be connected to first parts 103A of the active regions ACT. The node pads XP may be connected to second parts 103B of active regions ACT. As the node pads XP are arranged at ends of the cell active regions ACT, the landing pads LP may be disposed to at least partially overlap the node pads XP, near both ends of each of the cell active regions ACT. In other words, the node pads XP may be formed to overlap parts of the cell active regions ACT between the word lines WL and between the bit lines BL and with the cell device separation films 102.

The word lines WL may be formed to be buried in the substrate 100. The word lines WL may be disposed across the cell active regions ACT, between the bit line contacts DCC or between the node pads XP. As illustrated, two word lines WL extends across one cell active region ACT. As the cell active regions ACT extend in the third direction D3, the word lines WL may form an angle of less than 90 degrees with the cell active regions ACT.

The bit line contacts DCC may be disposed in straight lines in the first and second directions D1 and D2. The node pads XP may be disposed on both sides, in the first direction D1, of the center of each of the bit line contacts DCC. The node pads XP may be arranged in the first and second directions D1 and D2. The node pads XP may be disposed in straight lines in the first direction D1. The node pads XP may be arranged in a zigzag fashion in the second direction D2, between the bit lines BL. The landing pads LP may be arranged in a zigzag fashion in the second direction D2, which is the direction in which the bit lines BL extend. The landing pads LP may overlap same side portion of the bit lines BL in the first direction D1, along which the word lines WL extend. For example, landing pads LP in a first line may overlap with left sides of their respective bit lines BL, and landing pads LP in a second line may overlap with right sides of their respective bit lines BL.

Referring to FIGS. 1 through 7, the semiconductor memory device according to some example embodiments may include the word lines WL, the bit lines BL, the node pads XP, the bit line contacts DCC, the information storage unit DSP, and peripheral gate electrodes 215.

The substrate 100 may include the cell region, the cell region separation film 22, and the peripheral region 24. The substrate 100 may be a silicon substrate or a silicon-on-insulator (SOI) substrate. In some example embodiments, the substrate 100 may include silicon germanium, silicon germanium-on-insulator (SGOI), indium antimonide, lead tellurium compound, indium arsenide, indium phosphide, gallium arsenide, or gallium antimonide, but the present disclosure is not limited thereto.

The word lines WL, the bit lines BL, the node pads XP, the bit line contacts DCC, and the information storage unit DSP may be disposed in the cell region 20. The peripheral gate electrodes 215 may be disposed in the peripheral region 24.

The cell device separation films 102 may be formed in the substrate 100, in the cell region 20. The cell device separation films 102 may have a shallow trench separation (STI) structure having an excellent device separation characteristic. The cell device separation films 102 may define the cell active regions ACT in the cell region 20. As illustrated in FIG. 1, the cell active regions ACT, which are defined by the cell device separation films 102, may be formed as long islands each having a short axis and a long axis. The cell active regions ACT may be formed as diagonal bars forming an angle of less than 90 degrees with the word lines WL, which are formed in the cell device separation films 102. Also, the cell active regions ACT may be formed as diagonal bars forming an angle of less than 90 degrees with the bit lines BL, which are formed on the cell device separation films 102.

The cell region separation film 22 may have an STI structure. The cell region 20 may be defined by the cell region separation film 22. Peripheral device separation films 101 may be formed in the substrate 100, in the peripheral region 24. The peripheral device separation films 101 may have an STI structure. The peripheral device separation films 101 may define a peripheral active region of the peripheral region 24.

The peripheral device separation films 101, the cell device separation films 102, and the cell region separation film 22 may include at least one of, for example, silicon oxide, silicon nitride, or silicon oxynitride, but the present disclosure is not limited thereto. FIGS. 4 through 7 illustrate each of the peripheral device separation films 101 and the cell device separation films 102 as single-layer insulating films, but the present disclosure is not limited thereto. That is, the peripheral device separation films 101 and the cell device separation films 102 may be formed as single-layer insulating films or multilayer insulating films depending on the widths of the peripheral device separation films 101 and the cell device separation films 102.

The word lines WL may be disposed in the substrate 100 and the cell device separation films 102. The word lines WL may be formed across the cell device separation films 102 and the cell active regions ACT, which are defined by the cell device separation films 102. The word lines WL may be disposed in the word line trenches WL_TR, which are formed in the cell device separation films 102 and the cell active regions ACT.

Although not specifically illustrated, the word line trenches WL_TR may be deeper in the cell device separation films 102 than in the cell active regions ACT. The bottom surfaces of the word lines WL may be curved.

Upper surfaces WL_US of the word lines WL may be lower than an upper surface 100_US of the substrate 100 (e.g., the upper surfaces of the cell active regions Act). The upper surfaces WL_US of the word lines WL may be lower than upper surfaces 102_US of the cell device separation films 102.

The word lines WL may include at least one of metal, a metal alloy, conductive metal nitride, conductive metal carbonitride, conductive metal carbide, metal silicide, a doped semiconductor material, conductive metal oxynitride, or conductive metal oxide. The word lines WL may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbon-nitride (TiAlC-N), titanium aluminum carbide (TiAlC), titanium carbide (TiC), tantalum carbon nitride (TaCN), tungsten (W), aluminum (Al), copper (Cu), cobalt (Co), titanium (Ti), tantalum (Ta), nickel (Ni), platinum (Pt), nickel-platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), silver (Ag), gold (Au), zinc (Zn), vanadium (V), ruthenium titanium nitride (RuTiN), titanium silicon (TiSi), tantalum silicon (TaSi), nickel silicon (NiSi), cobalt silicon (CoSi), iridium oxide (IrOx), ruthenium oxide (RuO$_x$), or a combination thereof, but the present disclosure is not limited thereto.

Cell gate insulating films 107 may extend along the sidewalls and bottom of each of the word line trenches WL_TR. The cell gate insulating films 107 may extend along at least parts of the profiles of the word line trenches WL_TR. The word lines WL may be disposed on the cell gate insulating films 107. The cell gate insulating films 107 may include at least one of silicon oxide, silicon nitride, silicon oxynitride, or a high-k material having a greater dielectric constant than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The cell gate insulating films 107 may extend to the upper surface 100_US of the substrate 100. Upper surfaces 107_US of the cell gate insulating films 107 may be placed on the same plane as the upper surfaces 102_US of the cell device separation films 102, but the present disclosure is not limited thereto.

Word line capping patterns 110 may be disposed on the word lines WL. The word line capping patterns 110 may be in the form of lines extending in the first direction D1 along the upper surfaces WL_US of the word lines WL. The word line capping patterns 110 may cover the entire upper surfaces WL_US of the word lines WL. The word line capping patterns 110 may fill parts of the word line trenches WL_TR that are not filled with the word lines WL. The cell gate insulating films 107 may extend along the sidewalls of each of the word line capping patterns 110, but the present disclosure is not limited thereto. The word line capping patterns 110 may include at least one of, for example, silicon nitride (SiN), silicon oxynitride (SiON), silicon oxide (SiO$_2$), silicon carbonitride (SiCN), silicon oxycarbonitride (SiOCN), or a combination thereof.

The bit lines BL may be disposed on the substrate 100. The bit lines BL may extend across the word line capping patterns 110 and the word lines WL. The bit lines BL may include lower conductive lines 131 and upper conductive lines 132, which are on the lower conductive lines 131. The lower conductive lines 131 and the upper conductive lines 132 may extend in the second direction D2.

The lower conductive lines 131 may include at least one of, for example, Ti, TiN, TiSiN, Ta, TaN, WN, graphene, or metal silicide. The upper conductive lines 132 may include at least one of, for example, W, Al, Cu, Ru, Rh, Ir, Mo, ruthenium aluminum (RuAl), nickel aluminum (NiAl), niobium diboride (NbB$_2$), molybdenum diboride (MoB$_2$), tantalum diboride (TaB$_2$), vanadium aluminum carbide (V$_2$AlC), or chromium aluminum carbide (CrAlC). For example, the upper conductive lines 132 may include tungsten (W), in which case, the bit lines BL may include W lines. In another example, the upper conductive lines 132 may include ruthenium (Ru), in which case, the bit lines BL may include Ru lines.

Bit line capping films 137 may be disposed on the bit lines BL. The bit line capping films 137 may extend in the second direction D2 along the upper surfaces of the bit lines BL. The bit line capping films 137 may include at least one of, silicon nitride, silicon oxynitride, silicon carbonitride, or silicon oxycarbonitride. The bit line capping films 137 may include, for example, silicon nitride films. The bit line capping films 137 are illustrated as being single-layer films, but the present disclosure is not limited thereto.

The bit line contacts DCC may be disposed between the substrate 100 and the bit lines BL. The bit line contacts DCC may be disposed between the first parts 103A of the cell active regions ACT and the bit lines BL. The bit line contacts DCC may connect the first parts 103A of the cell active regions ACT and the bit lines BL.

In the plan view of FIG. 1, the bit line contacts DCC may have a circular or elliptical shape. The planar area of the bit line contacts DCC may be greater than the overlapping area of the first parts 103A of the cell active regions ACT and the bit lines BL. The planar area of the bit line contacts DCC may be greater than the planar area of the first parts 103A of the cell active regions ACT.

Referring to FIGS. 4 and 6, the bit line contacts DCC may have upper surfaces DCC_US, which are connected to the bit lines BL, and bottom surfaces DCC_BS, which are connected to the cell active regions ACT. The upper surfaces DCC_US of the bit line contacts DCC may have a first width W1 in the first direction D1. The bottom surfaces DCC_BS of the bit line contacts DCC may have a second width W2 in the first direction D1. The first width W1 of the upper surfaces DCC_US of the bit line contacts DCC may be smaller than the second width W2 of the bottom surfaces DCC_BS of the bit line contacts DCC. The width of the bit line contacts DCC may gradually increase away from the bit lines BL. That is, the width of the bit line contacts DCC may gradually increase in a direction from the tops to the bottoms of the bit line contacts DCC.

The node pads XP may be disposed on the substrate 100. The node pads XP may be disposed on the second parts 103B of each of the cell active regions ACT. The node pads XP may be connected to the second parts 103B of each of the cell active regions ACT.

In a plan view, the node pads XP may have a rectangle-like shape. First sidewalls of the node pads XP that face the bit line contacts DCC may be depressed in a direction away from the bit line contacts DCC (e.g., in the first direction D1). One sidewall of each of the node pads XP may be concavely curved. For example, bottom surfaces XP_BS of the node pads XP may be in contact with the cell active regions ACT and the cell device separation films 102. The bottom surfaces XP_BS of the node pads XP may be in contact with the upper surfaces 102_US of the cell device separation films 102.

The upper surfaces XP_US of the node pads XP may be lower than the upper surfaces DCC_US of the bit line contacts DCC with respect to the upper surfaces 102_US of the cell device separation films 102. A height H1 from the upper surfaces 102_US of the cell device separation films 102 to the upper surfaces DCC_US of the bit line contacts DCC may be greater than a height H2 from the upper surfaces 102_US of the cell device separation films 102 to the upper surfaces XP_US of the node pads XP. The upper surfaces XP_US of the node pads XP may be lower than the bottom surfaces of the bit lines BL with respect to the upper surfaces 102_US of the cell device separation films 102.

Referring to FIGS. 4 and 6, each of the bit line contacts DCC may include a contact silicide pattern 151, a contact barrier pattern 152, and a contact Ru pattern 153, which are sequentially stacked. The contact barrier pattern 152 may be disposed between the contact silicide pattern 151 and the contact Ru pattern 153. Each of the node pads XP may include a pad silicide pattern 161, a pad barrier pattern 162, and a pad Ru pattern 163, which are sequentially stacked. The pad barrier pattern 162 may be disposed between the pad silicide pattern 161 and the pad Ru pattern 163.

Contact silicide patterns 151 and pad silicide patterns 161 may include a metal silicide material. The contact silicide patterns 151 and the pad silicide patterns 161 may include the same metal silicide material. Contact barrier patterns 152 and pad barrier patterns 162 may include at least one of, for example, Ti, TiN, TiSiN, Ta, TaN, or WN. The contact barrier patterns 152 and the pad barrier patterns 162 may include the same conductive material. Contact Ru patterns 153 and pad Ru patterns 163 may include Ru. For example, the contact Ru patterns 153 and the pad Ru patterns 163 may be Ru patterns. For example, the bit line contacts DCC and the node pads XP may both have a conductive film stack structure. The bit line contacts DCC may have the same conductive film stack structure as the node pads XP.

The thickness of the pad Ru patterns 163 may be smaller than the thickness of the contact Ru patterns 153. That is, the upper surfaces XP_US of the node pads XP may be lower than the upper surfaces DCC_US of the bit line contacts DCC due to the difference in thickness between the contact Ru patterns 153 and the pad Ru patterns 163. The upper surfaces DCC_US of the bit line contacts DCC may be the upper surfaces of the contact Ru patterns 153.

The width of the upper surfaces of the contact Ru patterns 153 may be the same as the width W1 of the upper surfaces DCC_US of the bit line contacts DCC. The width of the bottom surfaces of the contact Ru patterns 153 may be the same as the width W2 of the bottom surfaces DCC_BS of the bit line contacts DCC.

Contact separation patterns 141r may be interposed between the bit line contacts DCC and the node pads XP. The contact separation patterns 141r may include an insulating material such as, for example, silicon oxide, but the present disclosure is not limited thereto.

Figure 30:
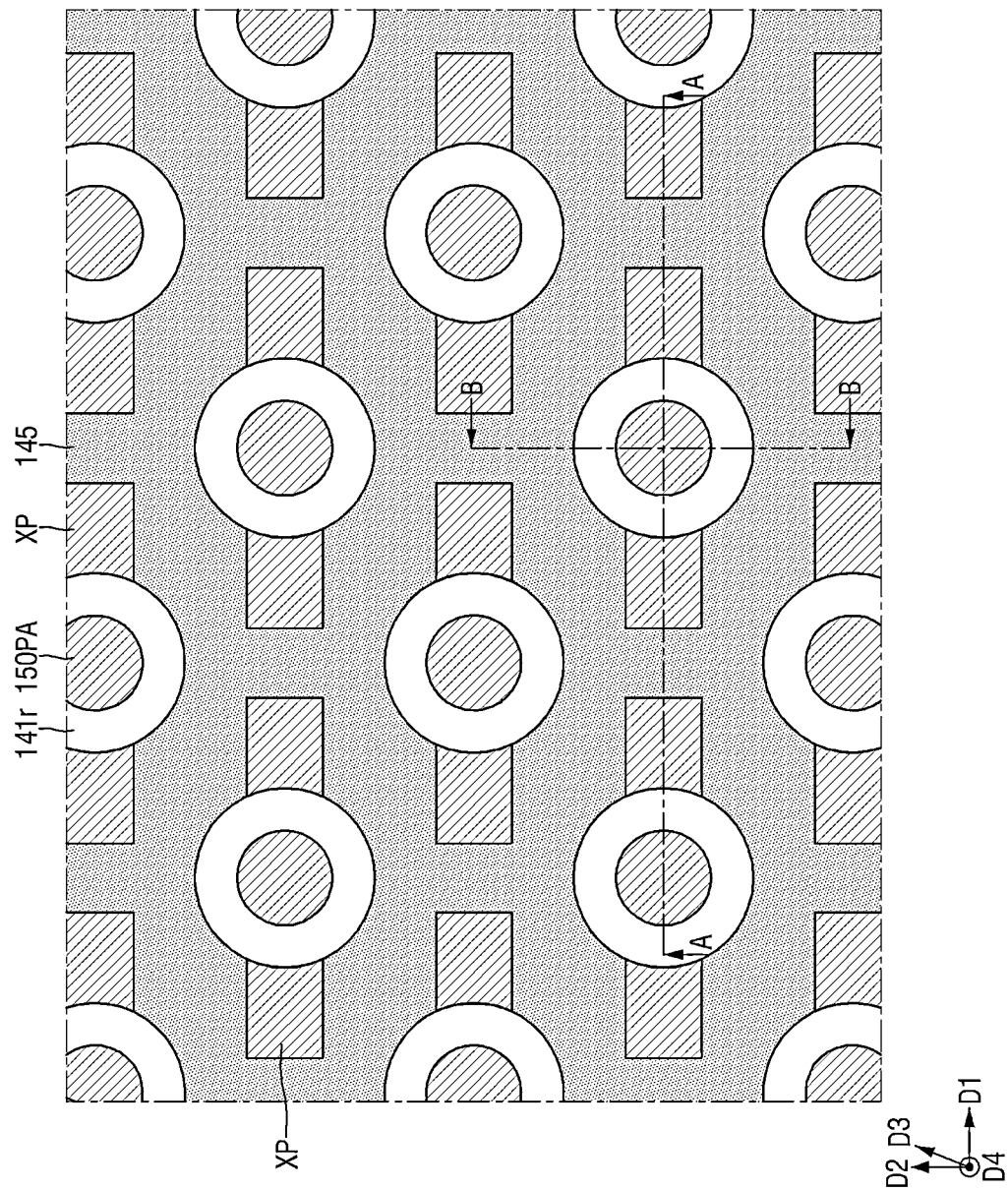

The contact separation patterns 141r may have a donut shape in a plan view, as illustrated in FIG. 30, and may surround the bit line contacts DCC. Parts of the contact separation patterns 141r may extend below the bit lines BL, as illustrated in FIG. 5. The contact separation patterns 141r may include first insulating parts 141r_1 between the bit line contacts DCC and the node pads XP and second insulating parts 141r_2 below the bit lines BL. The height of the first insulating parts 141r_1 may be smaller than the height of the second insulating parts 141r_2. The contact insulating patterns 141r may be in contact with the bottom surfaces of the bit lines BL.

Bottom surfaces 141r_BS of the contact separation patterns 141r may be lower than the upper surfaces 102_US of the cell device separation films 102. In some example embodiments, the bottom surfaces 141r_BS of the contact separation patterns 141r may be at the same height as the upper surfaces 102_US of the cell device separation films 102. The bottom surfaces 141r_BS of the contact separation patterns 141r may be at the same height as, or lower than, the upper surfaces 107_US of the cell gate insulating films 107. The bottom surfaces 141r_BS of the contact separation patterns 141r may be at the same height as, or lower than, the upper surfaces of the word line capping patterns 110.

Bit line spacers SP may be disposed on sidewalls of the bit lines BL and sidewalls of the bit line capping films 137. The bit line spacers SP may include spacer liners 121, first spacers 123, and second spacers 125, which are sequentially disposed on the sidewalls of the bit lines BL and the sidewalls of the bit line capping films 137. For example, the spacer liners 121 and the first spacers 123 may include the same material, for example, silicon oxide. In another example, the spacer liners 121 may include a material having etching selectivity with respect to the first spacers 123, in which case, the spacer liners 121 and the first spacers 123 may include, but are not limited to, silicon nitride and silicon oxide, respectively. The second spacers 125 may include an insulating material having etching selectivity with respect to the first spacers 123, for example, silicon nitride.

The spacer liners 121 may include silicon oxide. The lower the content of silicon nitride in the bit line spacers SP and the higher the content of silicon oxide in the bit line spacers SP, the higher the dielectricity of the bit line spacers SP because silicon oxide has a smaller dielectric constant than silicon nitride. As the spacer liners 121 include silicon oxide, the interference between the bit lines BL and storage contacts BC may be reduced. As a result, reliability of the semiconductor memory device can be improved.

The spacer liners 121 are illustrated as being single-layer films, but the present disclosure is not limited thereto. In a case where the spacer liners 121 are multilayer films, the spacer liners 121 may include additional liners extending to the upper surfaces DCC_US of the bit line contacts DCC. The additional liners may include silicon oxide containing carbon, but the present disclosure is not limited thereto.

Recess regions RCS may be defined by sidewalls of the bit line contacts DCC, the upper surfaces of contact separation patterns 141r, and sidewalls of the node pads XP. The spacer liners 121 may extend to cover the sidewalls of the bit line contacts DCC, the upper surfaces of the contact separation patterns 141r, and the sidewalls of the node pads XP. Buried insulating patterns 127 may be positioned on the spacer liners 121. The buried insulating patterns 127 may fill the recess regions RCS.

Referring to FIGS. 4 and 6, first, second, and third cell active regions ACT_1, ACT_2, and ACT_3 may be arranged in a row in the first direction D1 The first cell active region ACT_1 may be a first part 103A of a cell active region. A bit line contact DCC may cover the upper surface of the first cell active region ACT_1. The second cell active region ACT_2 may be a second part 103B of a cell active region. A first node pad XP_1 may cover the upper surface of the second cell active region ACT_2. The third cell active region ACT_3 may be a second part 103B of a cell active region. A second node pad XP_2 may cover the upper surface of the third cell active region ACT_3. The first and second node pads XP_1 and XP_2 may be connected to second parts 103B of cell active regions ACT adjacent in the first direction D1. The first node pad XP_1 may be spaced apart from the bit line contact DCC in the first direction D1.

Referring further to FIG. 6, a pad separation pattern 145 may be interposed between a pair of adjacent node pads XP, for example, between the first and second node pads XP_1 and XP_2. The pad separation pattern 145 may be disposed on the substrate 100. The pad separation pattern 145 may separate the first and second node pads XP_1 and XP_2 in the first direction D1 The pad separation pattern 145 may cover upper surfaces XP_US of the first and second node pads XP_1 and XP_2. The pad separation pattern 145 may include a separating part 145_S between the first and second node pads XP_1 and XP_2.

Upper surfaces 145_US of pad separation patterns 145 may be placed on the same plane as the upper surfaces DCC_US of the bit line contacts DCC. The upper surfaces 145_US of the pad separation patterns 145 may be positioned at the same height as the upper surface DCC_US of the bit line contacts DCC with respect to the upper surfaces 102_US of the cell device separation films 102. The upper surfaces 145_US of the pad separation patterns 145 may be positioned at the same height as the bottom surfaces of the bit lines BL with respect to the upper surfaces 102_US of the cell device separation films 102.

The pad separation patterns 145 may include an insulating material, for example, silicon nitride. Bottom surfaces 145_BS of the pad separation patterns 145 may be positioned at the same height as the upper surfaces 102_US of the cell device separation films 102, but the present disclosure is not limited thereto. The bottom surfaces 145_BS of the pad separation patterns 145 may be lower than the upper surfaces 102_US of the cell device separation films 102.

Referring to FIG. 5, the pad separation patterns 145 may be disposed below the bit lines BL and may be in contact with sidewalls of the second insulating parts 141r_2 of the contact separation patterns 141r, the upper surfaces of the word line capping patterns 110, the upper surfaces 107_US of the cell gate insulating films 107, and the upper surfaces 102_US of the cell device separation films 102. The pad separation patterns 145 may be in contact with the bottom surfaces of the bit lines BL.

Referring to FIG. 6, a first bit line BL_1 may be disposed on the bit line contact DCC on the first cell active region ACT_1. The first bit line BL_1 is connected to the upper surface DCC_US of the bit line contact DCC. A second bit line BL_2, which is adjacent to the first bit line BL_1, may be positioned on the pad separation pattern 145 between the first and second nodes XP_1 and XP_2 and may overlap the separating part 145_S of the pad separation pattern 145 in a fourth direction D4.

Figure 41:
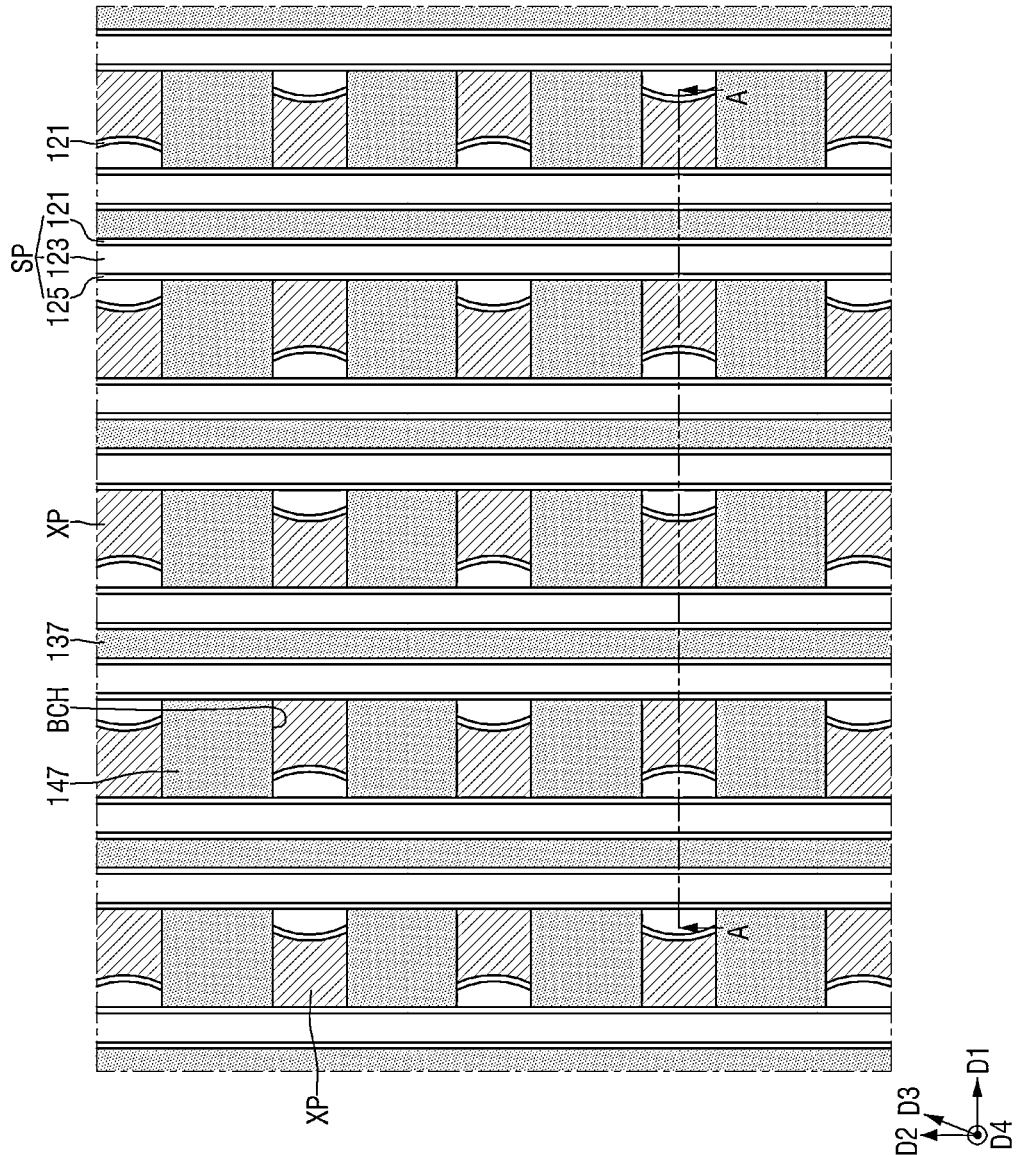
Figure 42:
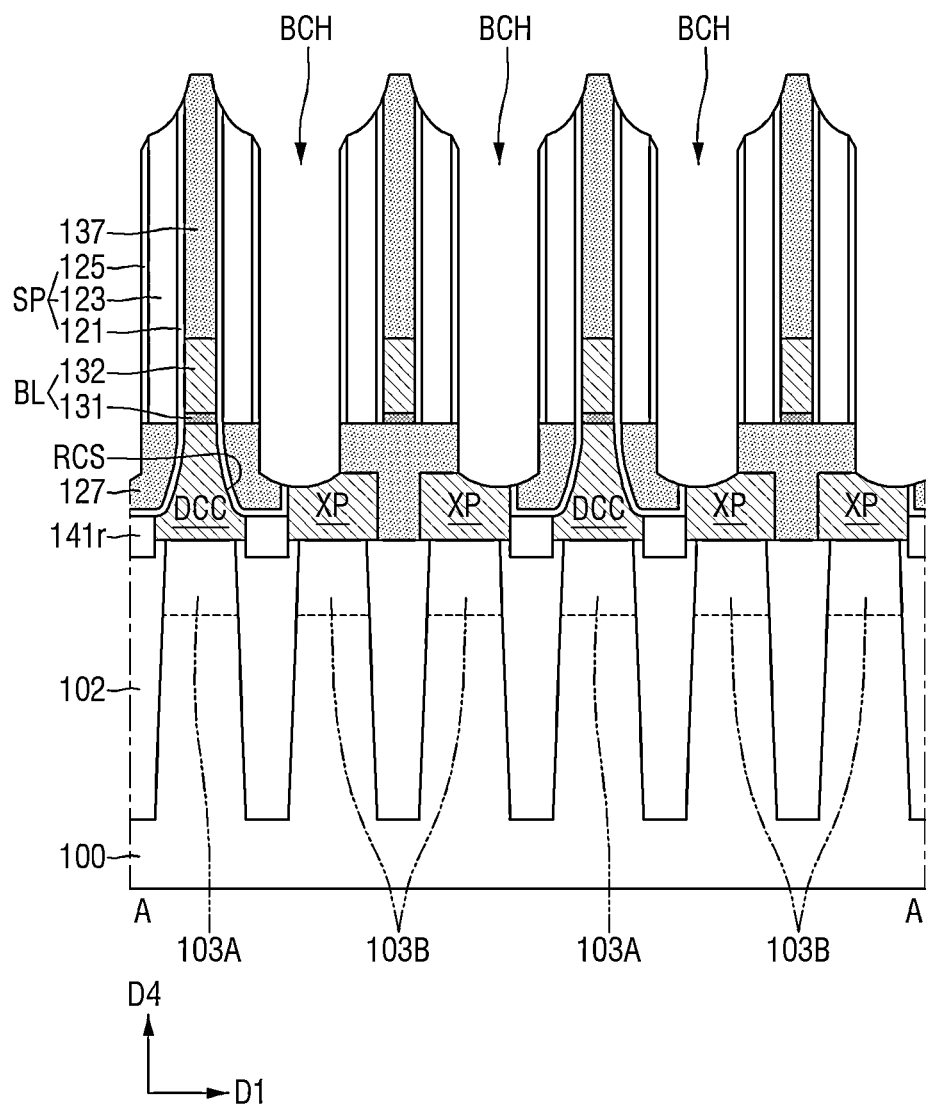

Referring further to FIG. 6, a storage contact BC may be interposed between a pair of adjacent bit lines BL, for example, between the first and second bit lines BL_1 and BL_2. The storage contact BC is connected to a node pad XP. The storage contact BC may be disposed in a storage contact hole BCH between the first and second bit lines BL_1 and BL_2. Although not specifically illustrated in FIGS. 1A and 1B, a plurality of node separation patterns 147 may be disposed between the bit line spacers SP, as illustrated in FIGS. 41 and 42. The node separation patterns 147 may be arranged in rows between the bit line spacers SP and may be spaced apart from one another. The node separation patterns 147 may overlap the word lines WL. Storage contact holes BCH may be defined between the bit line spacers SP and between the node separation patterns 147. The node separation patterns 147 may include an insulating material, for example, silicon nitride.

The storage contacts BC may include contact filling films 113 and contact barrier films 111. The contact barrier films 111 may extend along sidewalls and bottom surfaces of the storage contact holes BCH. The contact filling films 113 are disposed on the contact barrier films 111. The contact barrier films 111 may include at least one of, for example, Ti, TiN, TiSiN, Ta, TaN, or WN. The contact filling films 113 may include metal, for example, W, Al, Cu, Co, or Mo.

As the storage contacts BC include metal, a metal deposition process for forming the storage contacts BC may be performed at low temperature. Thus, any defects that may be caused by high-temperature processes can be reduced or prevented. Further, due to low-temperature processes, silicon oxide can be used to form the spacer liners 121, and thus the insulating property of the bit line spacers SP can be improved.

Upper surfaces 111_US of the contact barrier films 111 may be placed on the same plane as the upper surfaces 137_US of the bit line capping films 137. The upper surfaces of the contact filling films 113 may be placed on the same plane as the upper surfaces 111_US of the contact barrier films 111.

The landing pads LP may be disposed on the storage contacts BC. In the plan view of FIG. 1, the landing pads LP may have an island shape. One landing pad LP may be surrounded by six landing pads LP to form a hexagonal shape. The landing pads LP may be arranged to form a honeycomb shape.

The landing pads LP may be in contact with the upper surfaces 111_US of the contact barrier films 111, the upper surfaces 137_US of the bit line capping films 137, and the upper surfaces of the contact filling films 113. The landing pads LP may include metal, for example, W, All, Cu, Co, or Mo, but the present disclosure is not limited thereto.

Landing pad separation patterns LPSP may be disposed between the landing pads LP. Parts of the landing pad separation patterns LPSP may be interposed between the storage contacts BC and the bit line spacers SP. Thus, the bottoms of the landing pad separation patterns LPSP may be lower than the tops of the bit line spacers SP.

The landing pad separation patterns LPSP may include an insulating material and may thus electrically isolate the landing pads LP from one another. For example, the landing pad separation patterns LPSP may include silicon oxide films, silicon nitride films, silicon oxynitride films, silicon oxycarbonitride films, and/or silicon carbonitride films, but the present disclosure is not limited thereto.

The information storage unit DSP may be disposed on the landing pads LP. The information storage unit DSP may be connected to the landing pads LP. The information storage unit DSP may be connected to the storage contacts BC through the landing pads LP. The information storage unit DSP may include, for example, capacitors. The information storage unit DSP may include the lower electrodes 191, a capacitor dielectric film 192, and an upper electrode 193.

The lower electrodes 191 may be disposed on the landing pads LP. The lower electrodes 191 may have a pillar shape, but the present disclosure is not limited thereto. In some example embodiments, the lower electrodes 191 may have a cylindrical shape. The capacitor dielectric film 192 is disposed on the lower electrodes 191. The capacitor dielectric film 192 may be formed along the profiles of the lower electrodes 191. The upper electrode 193 is disposed on the capacitor dielectric film 192. The upper electrode 193 may surround the outer sidewalls of each of the lower electrodes 191.

The lower electrodes 191 and the upper electrode 193 may include, for example, a doped semiconductor material, conductive metal nitride (e.g., titanium nitride, tantalum nitride, niobium nitride, or tungsten nitride), metal (e.g., Ru, Ir, Ti, or Ta), or conductive metal oxide (e.g., iridium oxide or niobium oxide), but the present disclosure is not limited thereto.

The capacitor dielectric film 192 may include at least one of, for example, silicon oxide, silicon nitride, silicon oxynitride, a high-k material, or a combination thereof. The high-k material may be a dielectric material having a greater dielectric constant than silicon oxide. The capacitor dielectric film 192 may have a structure in which zirconium oxide, aluminum oxide, and zirconium oxide are sequentially stacked. The capacitor dielectric film 192 may include a dielectric film containing hafnium (Hf). The capacitor dielectric film 192 may have a structure in which a ferroelectric material film and a paraelectric material film are stacked.

In some example embodiments, the information storage unit DSP may include magnetic tunnel junction patterns, in which case, the semiconductor memory device may be a magnetic random-access memory (MRAM) device. In some example embodiments, the information storage unit DSP may include a phase-change material or a variable resistance material, in which case, the semiconductor memory device may be a phase-change random-access memory (PRAM) or resistive random-access memory (ReRAM) device.

The peripheral gate electrodes 215 may be disposed on the substrate 100, in the peripheral region 24. The peripheral gate electrodes 215 may be disposed in a peripheral active region defined by the peripheral device separation films 101.

Each of the peripheral gate electrodes 215 may include first and second peripheral gate conductive films 211 and 212, which are sequentially stacked on the substrate 100. The first peripheral gate conductive film 211 may include the same material as the lower conductive lines 131 of the bit lines BL. The second peripheral gate conductive film 212 may include the same material as the upper conductive lines 132 of the bit lines BL.

First peripheral gate conductive films 211 may be formed on the same level as the lower conductive lines 131. Second peripheral gate conductive films 212 may be formed on the same level as the upper conductive lines 132. Here, two elements formed on the same level may indicate that the two elements are formed by the same manufacturing process. The peripheral gate electrodes 215 may have the same conductive film stack structure as the bit lines BL.

Peripheral gate insulating films 210 may be disposed between the substrate 100 and the peripheral gate electrodes 215. The peripheral gate insulating films 210 may include, for example, silicon oxide, silicon nitride, silicon oxynitride, or a high-k material having a greater dielectric constant than silicon oxide.

Peripheral gate capping films 216 may be disposed on the peripheral gate electrodes 215. The peripheral gate capping films 216 may include at least one of, for example, silicon nitride, silicon oxynitride, silicon oxycarbide, silicon oxycarbonitride, or silicon carbonitride.

Peripheral gate spacers 217 may be disposed on sidewalls of the peripheral gate electrodes 215, sidewalls of the peripheral gate capping films 216, and sidewalls of the peripheral gate insulating films 210. The peripheral gate spacers 217 may include at least one of, for example, silicon nitride, silicon oxynitride, silicon oxycarbide, silicon oxycarbonitride, or silicon carbonitride.

A first peripheral interlayer insulating film 220 may be disposed on the substrate 100. The first peripheral interlayer insulating film 220 may be disposed around each of the peripheral gate electrodes 215. The first peripheral interlayer insulating film 220 may include, for example, an oxide-based insulating material, but the present disclosure is not limited thereto.

Peripheral contact plugs 240 may be disposed on both sides of each of the peripheral gate electrodes 215. The peripheral contact plugs 240 may be disposed in the first peripheral interlayer insulating film 220. The peripheral contact plugs 240 may be connected to the substrate 100, in the peripheral region 240. The peripheral contact plugs 260 may include the same material as the landing pads LP, but the present disclosure is not limited thereto. For example, the upper surfaces of the peripheral contact plugs 240 may be placed on the same plane as the upper surfaces of the landing pads LP, but the present disclosure is not limited thereto.

A second peripheral interlayer insulating film 230 may be disposed on the first peripheral interlayer insulating film 220. Although not specifically illustrated, the second peripheral interlayer insulating film 230 may cover sidewalls of the information storage unit DSP. The second peripheral interlayer insulating film 230 may include an insulating material.

Figure 8:
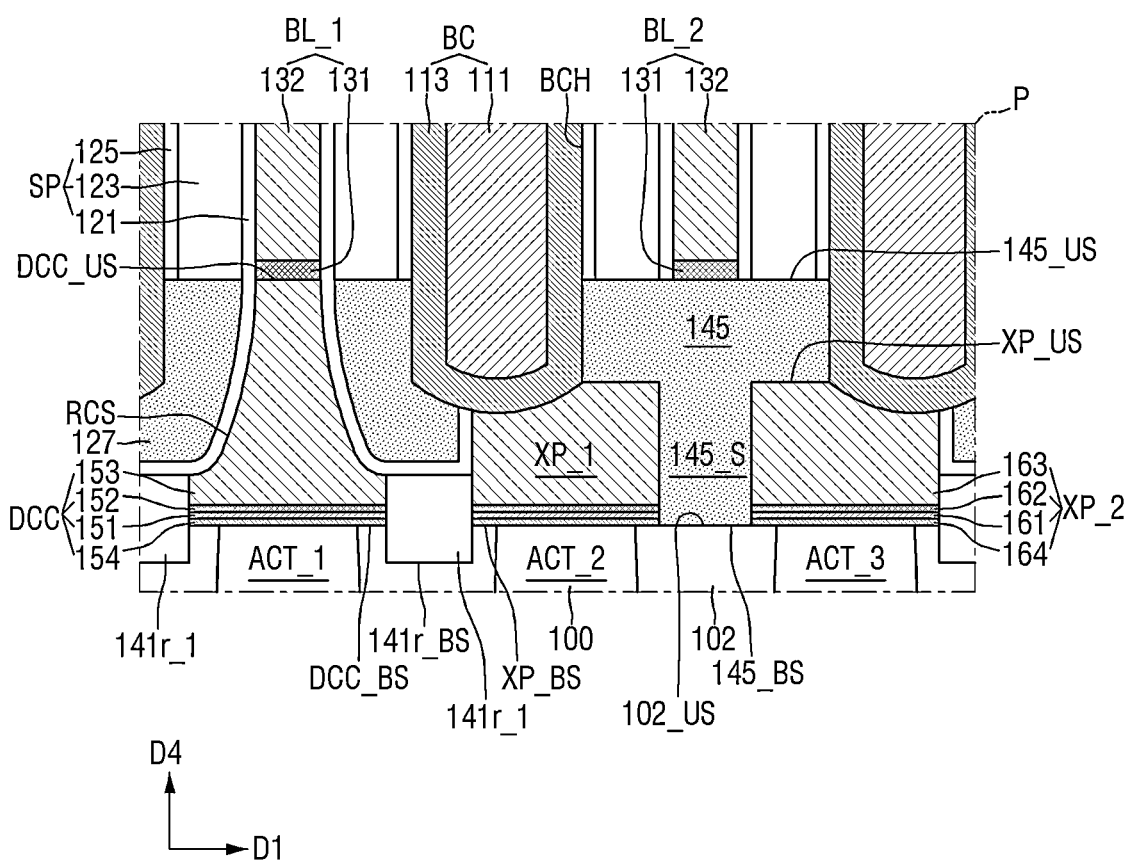
FIG. 8 is a cross-sectional view of a semiconductor memory device according to some example embodiments of the present disclosure.

FIG. 8 is a cross-sectional view of a semiconductor memory device according to some example embodiments of the present disclosure. For convenience, the semiconductor memory device of FIG. 8 will hereinafter be described, focusing mainly on the differences with the semiconductor memory device of FIGS. 1 through 7.

Referring to FIG. 8, in the semiconductor memory device according to some example embodiments, bit line contacts DCC may further include contact semiconductor patterns 154, and node pads XP may further include node semiconductor patterns 164.

The contact semiconductor patterns 154 may be disposed between a substrate 100 and the contact silicide patterns 151. The node semiconductor patterns 164 may be disposed between the substrate 100 and the node silicide patterns 161. The contact semiconductor patterns 154 and the node semiconductor patterns 164 may also be disposed on the upper surfaces 102_US of the cell device separation films 102.

The contact semiconductor patterns 154 and the node semiconductor patterns 164 may include polysilicon. For example, the contact semiconductor patterns 154 and the node semiconductor patterns 164 may be polysilicon patterns.

Figure 9:
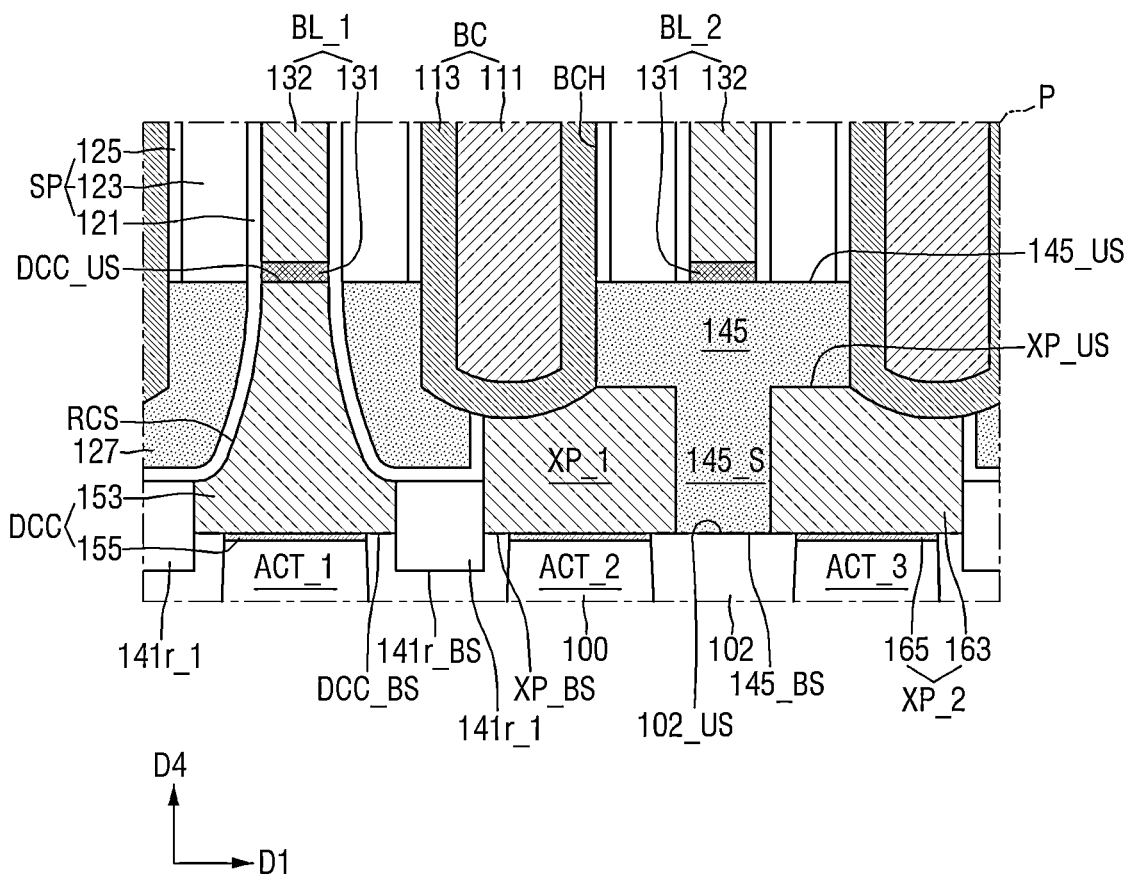
FIGS. 9 and 10 are cross-sectional views of semiconductor memory devices according to some example embodiments of the present disclosure, respectively.
Figure 10:
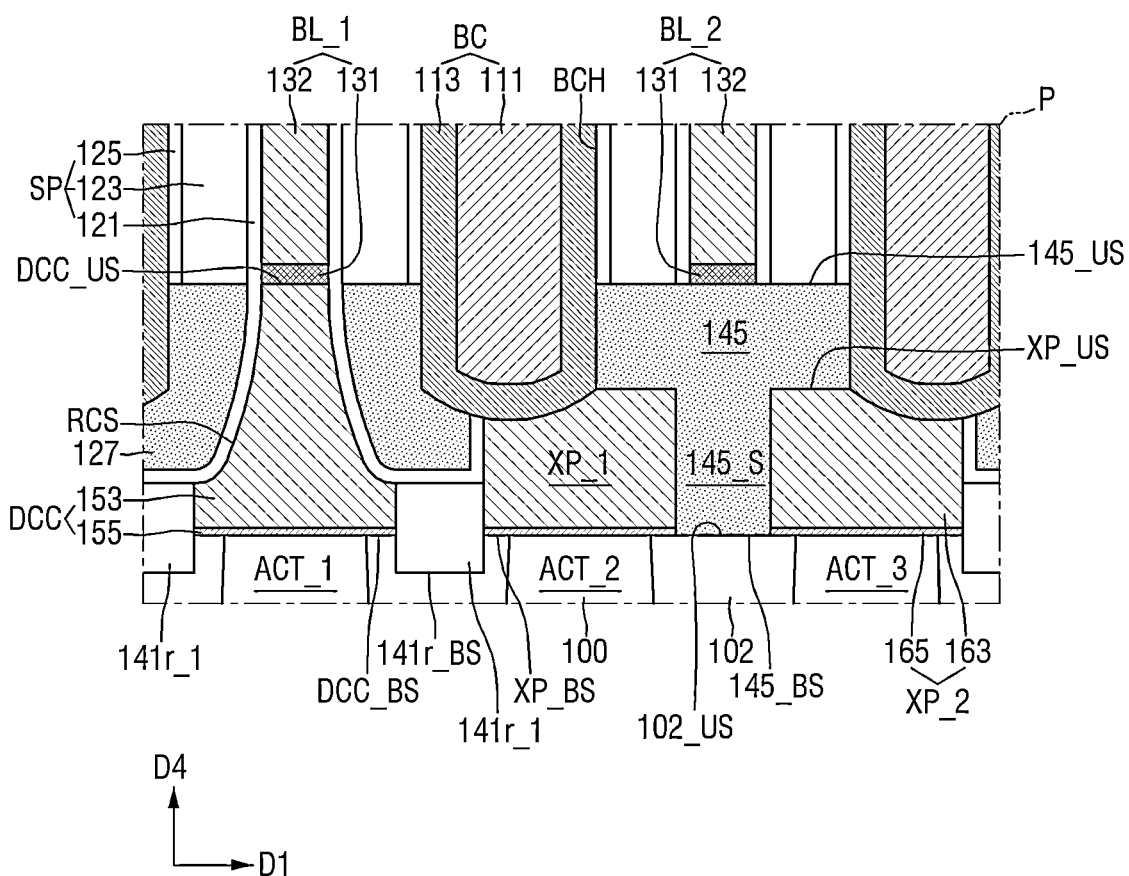

FIGS. 9 and 10 are cross-sectional views of semiconductor memory devices according to some example embodiments of the present disclosure, respectively. For convenience, the semiconductor memory devices of FIGS. 9 and 10 will hereinafter be described, focusing mainly on the differences with the semiconductor memory device of FIGS. 1 through 7.

Referring to FIGS. 9 and 10, in the semiconductor memory device according to some example embodiments, each of bit line contacts DCC may include a contact graphene pattern 155 and a contact Ru pattern 153, which are sequentially stacked, and each of node pads XP may include a pad graphene pattern 165 and a pad Ru pattern 163, which are sequentially stacked.

Contact graphene patterns 155 may be disposed between a substrate 100 and contact Ru patterns 153. Node semiconductor patterns 164 may be disposed between the substrate 100 and pad Ru patterns 163.

The contact graphene patterns 155 and the pad graphene patterns 165 may include graphene. The contact graphene patterns 155 and the pad graphene patterns 165 may be graphene patterns.

For example, the graphene included in the contact graphene patterns 155 and the pad graphene patterns 165 may include a doped metal. The doped metal may include, for example, one or more transition metals such as Ti, V, Ta, Hf, Zr, W, Mo, Ru, Co, and/or Ni, but the present disclosure is not limited thereto. As graphene is doped with metal, the resistance of the graphene can be reduced not only in a horizontal direction, but also in the fourth direction D4, which is a vertical direction, and the bonding energy between films of the graphene can be raised. In this manner, the contact graphene patterns 155 and the pad graphene patterns 165 can be thickly formed. In another example, the graphene may not include doped metal.

Referring to FIG. 9, the contact graphene patterns 155 and the pad graphene patterns 165 may be formed only on parts of the substrate 100 in cell active regions (ACT_1, ACT_2, and ACT_3). Referring to FIG. 10, parts of the contact graphene pattern 155 and/or parts of the pad graphene pattern 165 may extend along the upper surfaces 102_US of the cell device separation films 102.

Semiconductor memory devices according to some example embodiments of the present disclosure will hereinafter be described using the contact graphene patterns 155 and the pad graphene patterns 165 of the semiconductor memory device of FIG. 9.

Figure 11:
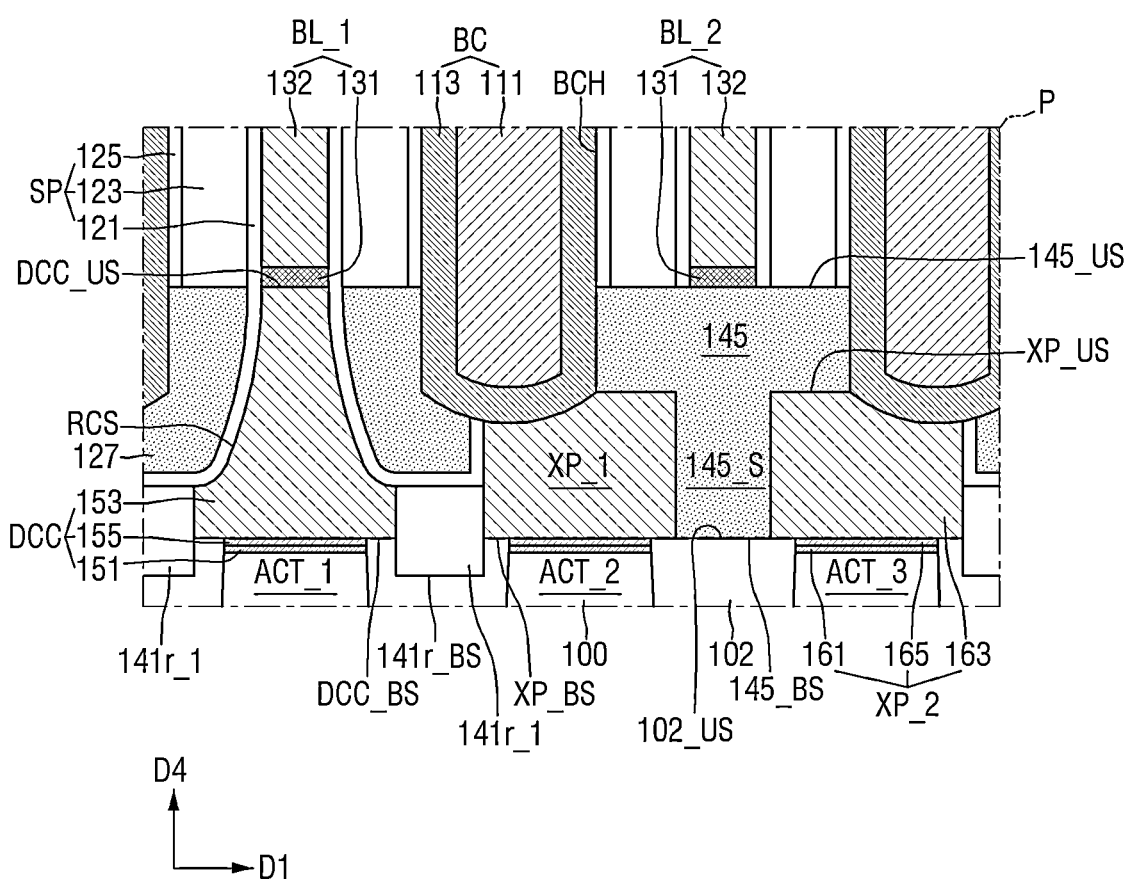
FIG. 11 is a cross-sectional view of a semiconductor memory device according to some example embodiments of the present disclosure.
Figure 12:
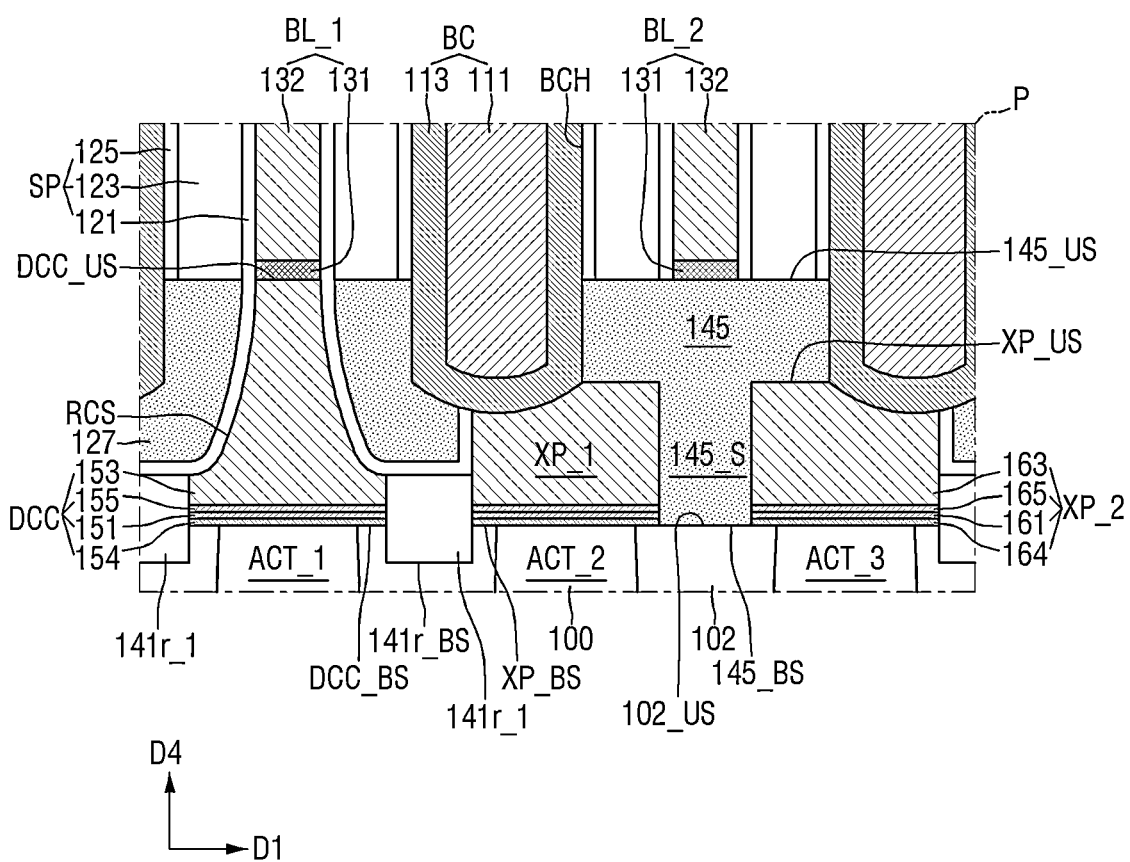
FIG. 12 is a cross-sectional view of a semiconductor memory device according to some example embodiments of the present disclosure.

FIG. 11 is a cross-sectional view of a semiconductor memory device according to some example embodiments of the present disclosure. FIG. 12 is a cross-sectional view of a semiconductor memory device according to some example embodiments of the present disclosure. For convenience, the semiconductor memory devices of FIGS. 11 and 12 will hereinafter be described, focusing mainly on the differences with the semiconductor memory devices of FIGS. 9 and 10.

Referring to FIGS. 11 and 12, in the semiconductor memory device according to some example embodiments, bit line contacts DCC may further include contact silicide patterns 151, and node pads XP may further include node silicide patterns 161.

The contact silicide patterns 151 may be disposed between a substrate 100 and contact graphene patterns 155. The node silicide patterns 161 may be disposed between the substrate 100 and node graphene patterns 165.

Referring to FIG. 11, the contact silicide patterns 151 and the node silicide patterns 161 may be in direct contact with the substrate 100.

Referring to FIG. 12, the bit line contacts DCC may further include contact semiconductor patterns 154, which are disposed between the substrate 100 and the contact silicide patterns 151, and the node pads XP may further include node semiconductor patterns 164, which are disposed between the substrate 100 and the node silicide patterns 161.

Figure 13:
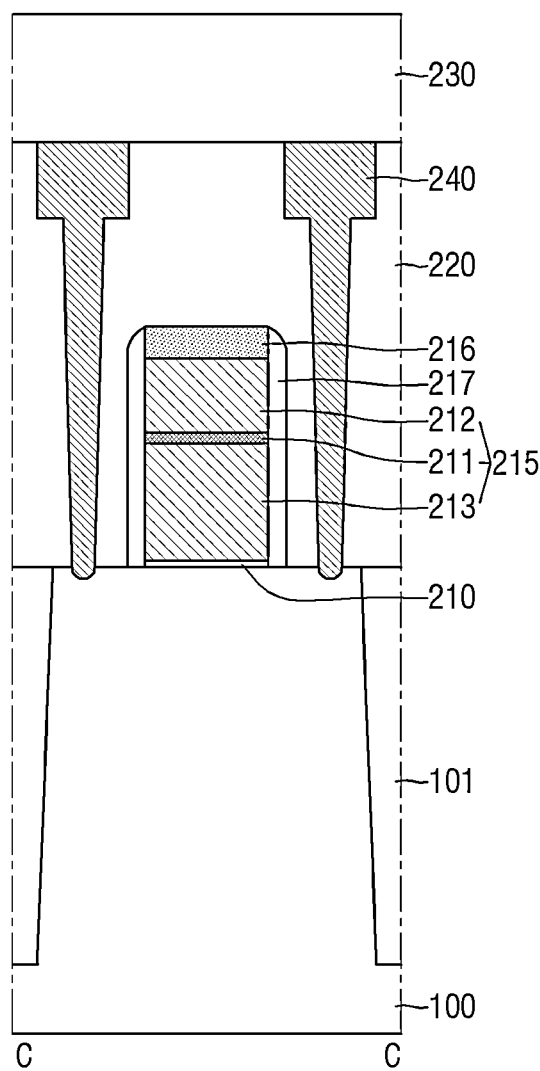
FIG. 13 is a cross-sectional view of a semiconductor memory device according to some example embodiments of the present disclosure.

FIG. 13 is a cross-sectional view of a semiconductor memory device according to some example embodiments of the present disclosure. For convenience, the semiconductor memory device of FIG. 13 will hereinafter be described, focusing mainly on the differences with the semiconductor memory device of FIGS. 1 through 7.

Referring to FIG. 13, in the semiconductor memory device according to some example embodiments, each of peripheral gate electrodes 215 may further include a third peripheral gate conductive film 213 between a peripheral gate insulating film 210 and a first peripheral gate conductive film 211.

Third peripheral gate conductive films 213 may have stacks of the same conductive films as the bit line contacts DCC and the node pads XP. The third peripheral gate conductive films 213 may have the same conductive film stack structure as bit line contacts DCC and node pads XP.

FIGS. 14 through 42 illustrate a method of fabricating a semiconductor memory device according to some example embodiments of the present disclosure. FIG. 15A is a cross-sectional view taken along line A-A of FIG. 14, and FIG. 15B is a cross-sectional view taken along line B-B of FIG. 14.

Figure 14:
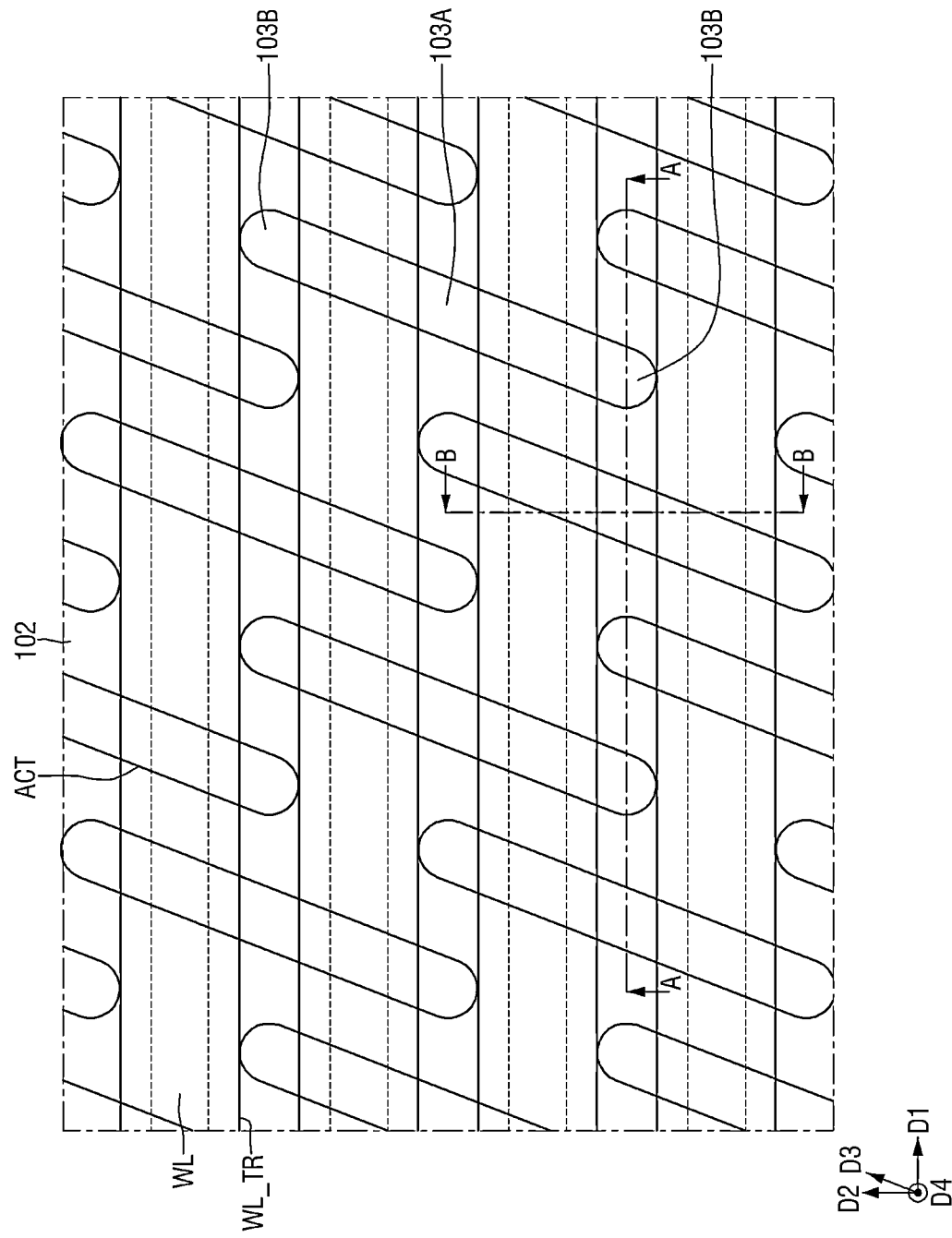
FIGS. 14 through 42 illustrate a method of fabricating a semiconductor memory device according to some embodiments of the present disclosure.
Figure 15A:
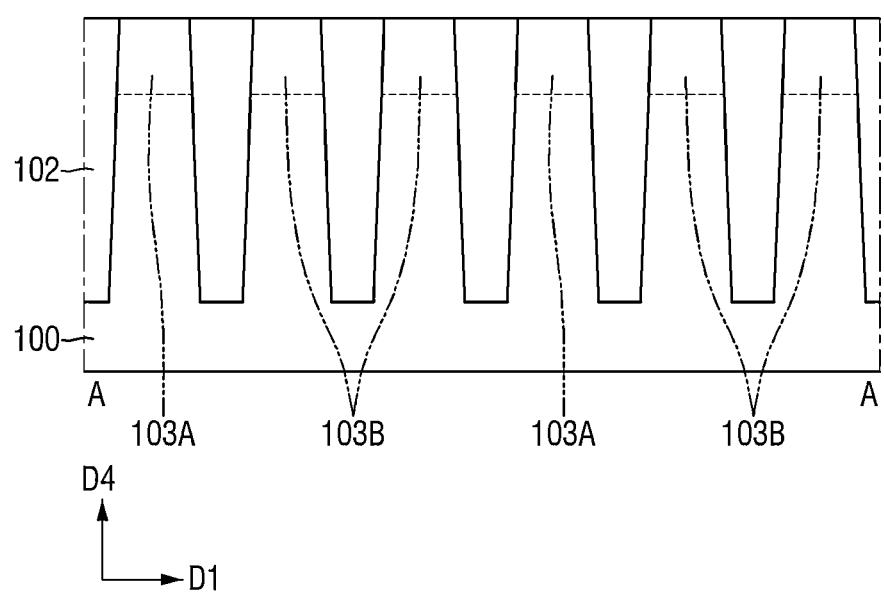
Figure 15B:
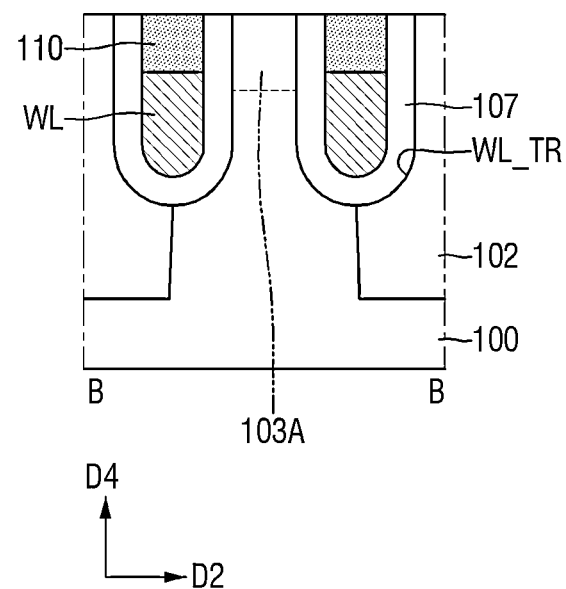

Referring to FIGS. 14 and 15B, cell device separation films 102 may be formed in a substrate 100. Due to the cell device separation films 102, cell active regions ACT may be defined in the substrate 100.

Word line trenches WL_TR may be formed to extend in a first direction D1. The word line trenches WL_TR may extend across the cell active regions ACT and the cell device separation films 102. The word line trenches WL_TR may divide each of the cell active regions ACT into three parts. The word line trenches WL_TR may divide each of the cell active regions ACT into a first part 103A and second parts 103B.

Cell gate insulating films 107 may be formed along the profiles of the word line trenches WL_TR. Gate conductive films may be formed on the cell gate insulating films 107. Word lines WL may be formed on the cell gate insulating films 107 by etching back parts of the gate conductive films. The word lines WL may extend across the cell active regions ACT. Word line capping patterns 110, which fill parts of the word line trenches WL_TR that are yet to be filled, may be formed on the word lines WL.

Figure 16:
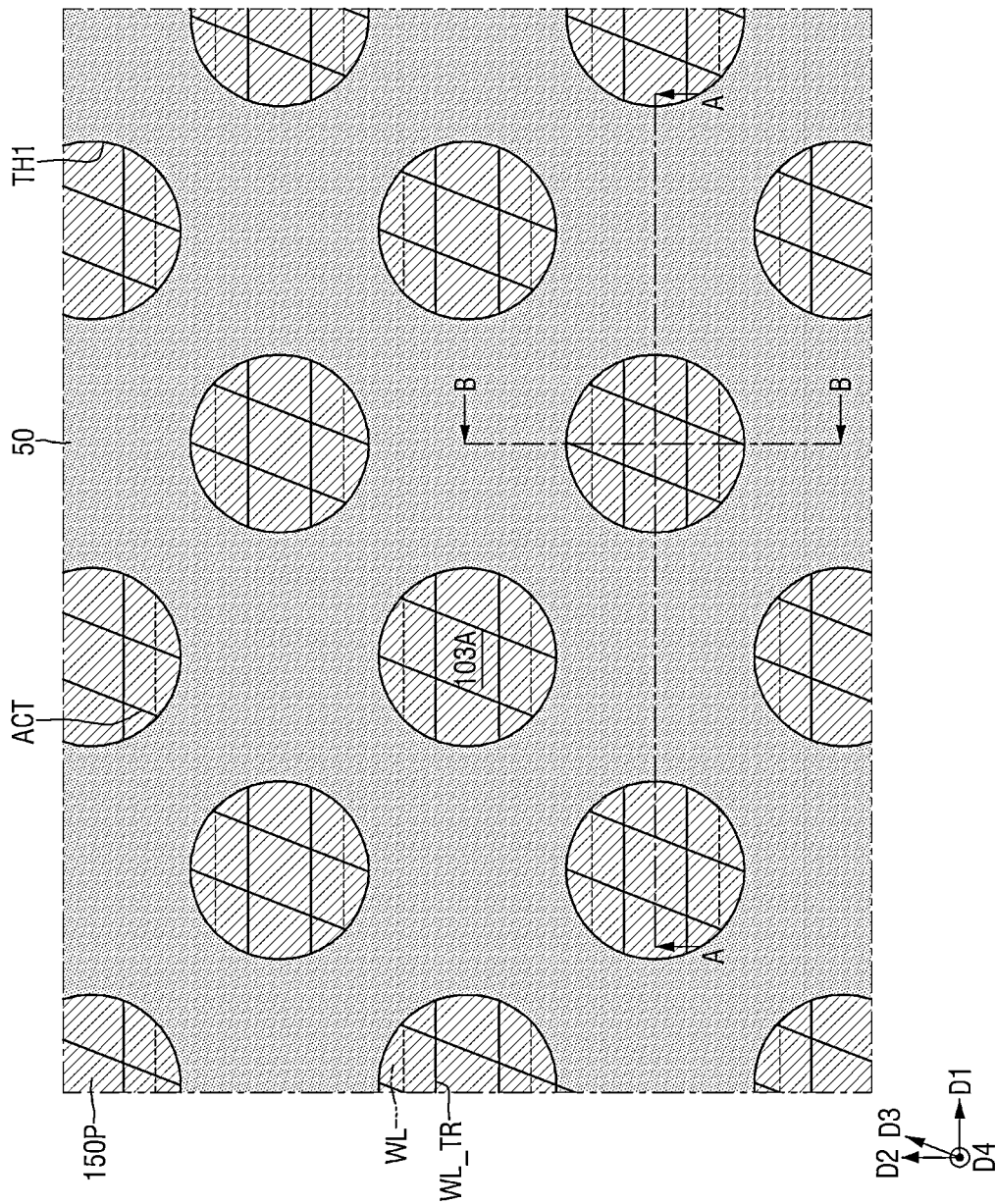
Figure 17A:
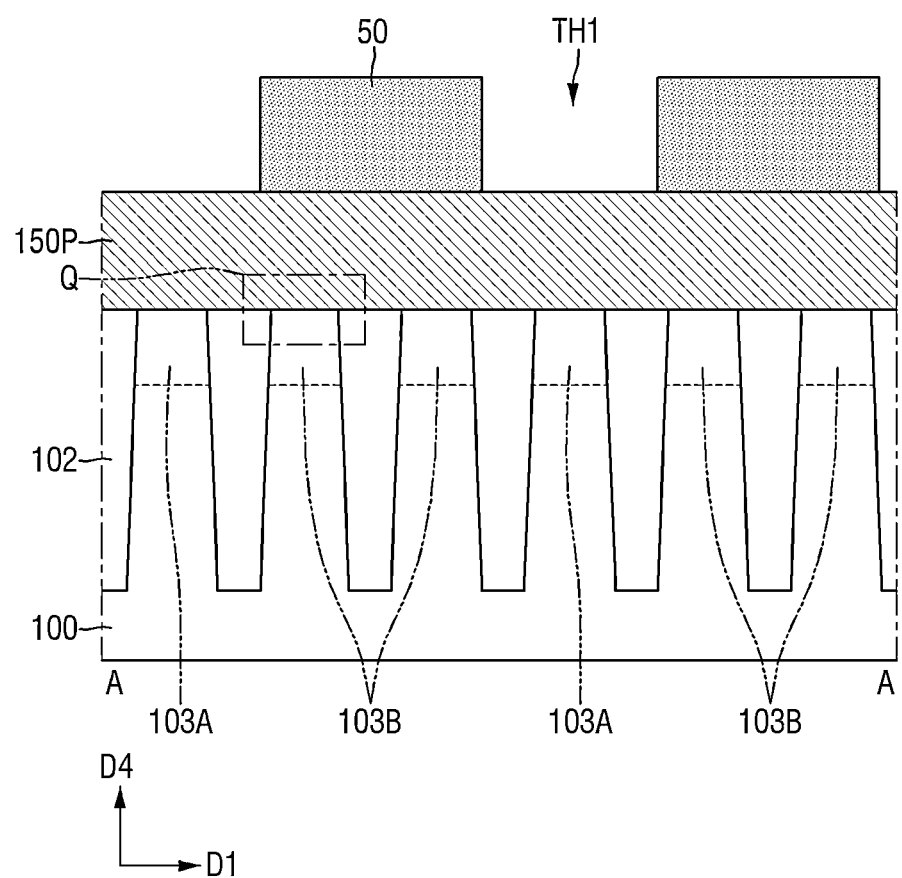
Figure 17B:
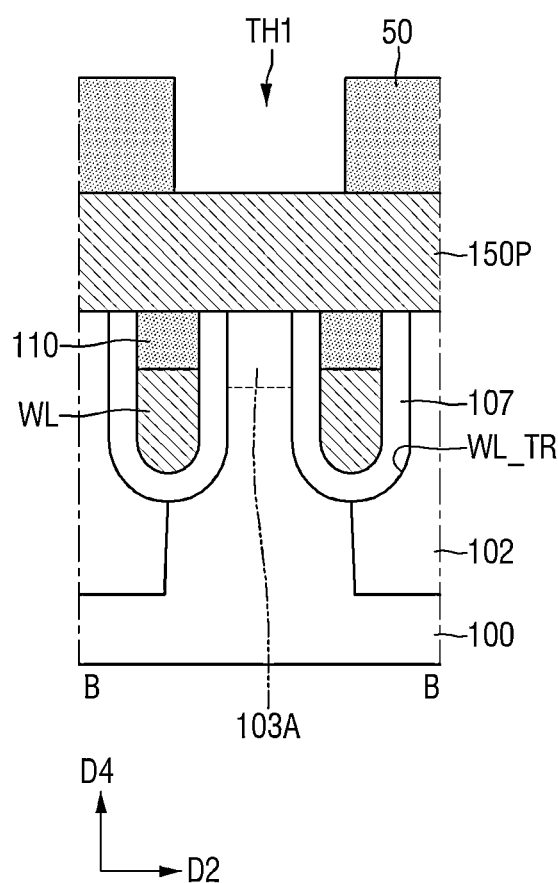
Figure 17C:
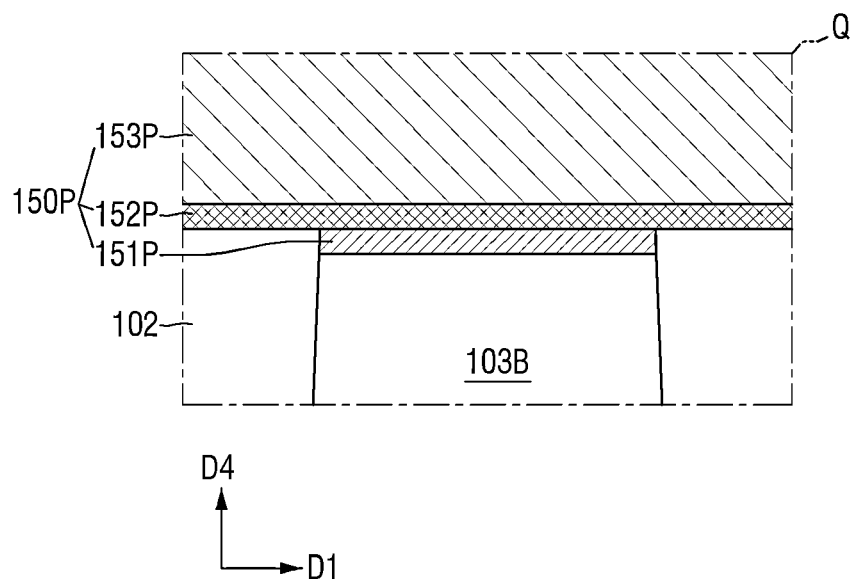

Referring to FIGS. 16 through 17C, a stack conductive film 150P may be formed on the substrate 100. The stack conductive film 150P may cover the substrate 100.

Referring to FIG. 17C, which is an enlarged cross-sectional view of part Q of FIG. 17A, the stack conductive film 150P may include a silicide film 151P, a barrier film 152P, and a Ru film 153P, which are sequentially stacked. FIG. 17C illustrates a conductive film stack structure corresponding to that illustrated in FIG. 6.

The conductive film stack structure of the stack conductive film 150P may be modified to realize the conductive film stack structures of the bit line contacts DCC and the node pads XP of each of the semiconductor memory devices of FIGS. 8 through 12.

A first mask patterns 50 may be formed on the stack conductive film 150P. The first mask pattern 50 may include, for example, silicon nitride, but the present disclosure is not limited thereto.

The first mask pattern 50 may include a plurality of first openings TH1. The first openings TH1 may overlap first parts 103A of the cell active regions ACT in a fourth direction D4.

Figure 18:
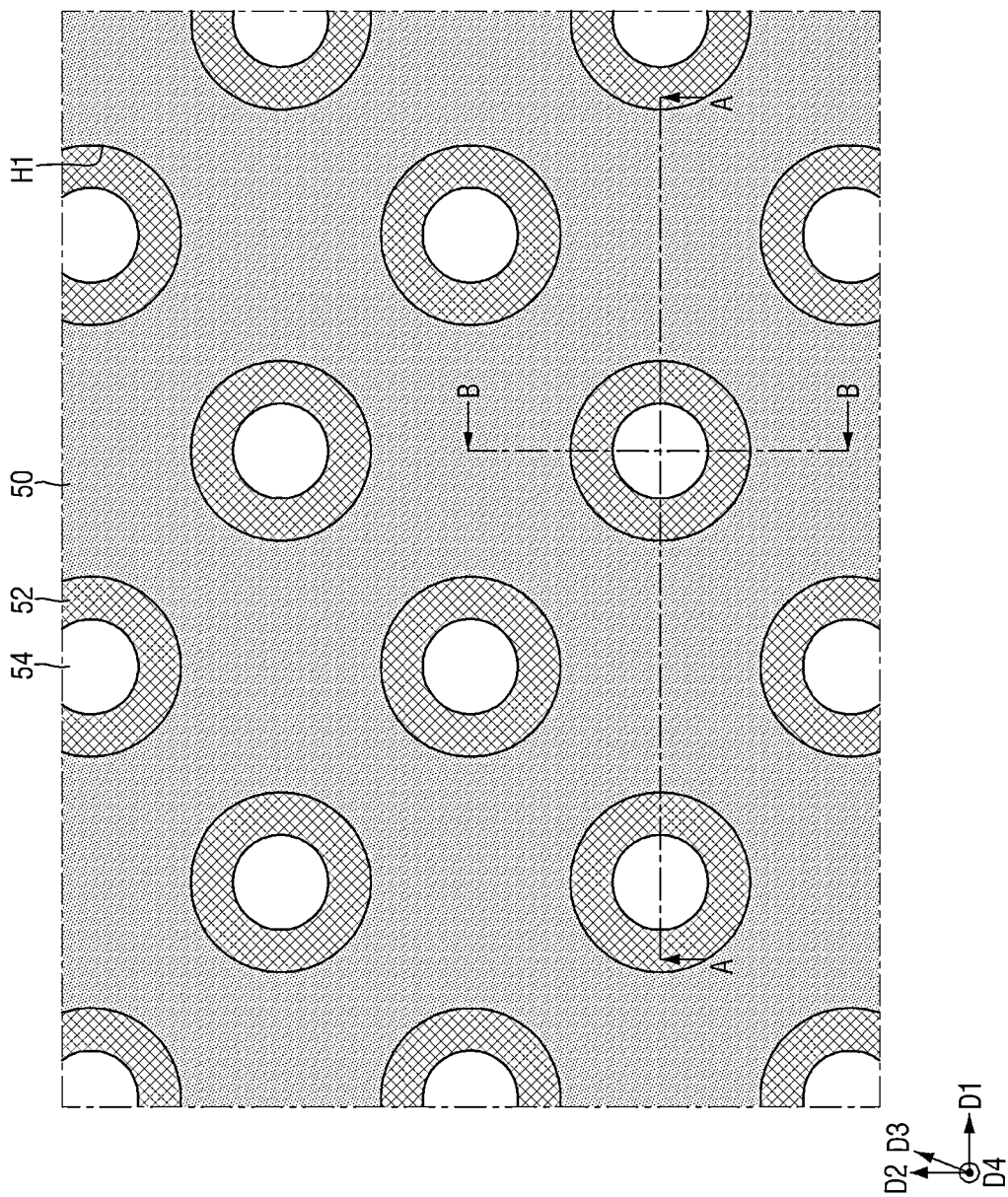
Figure 19A:
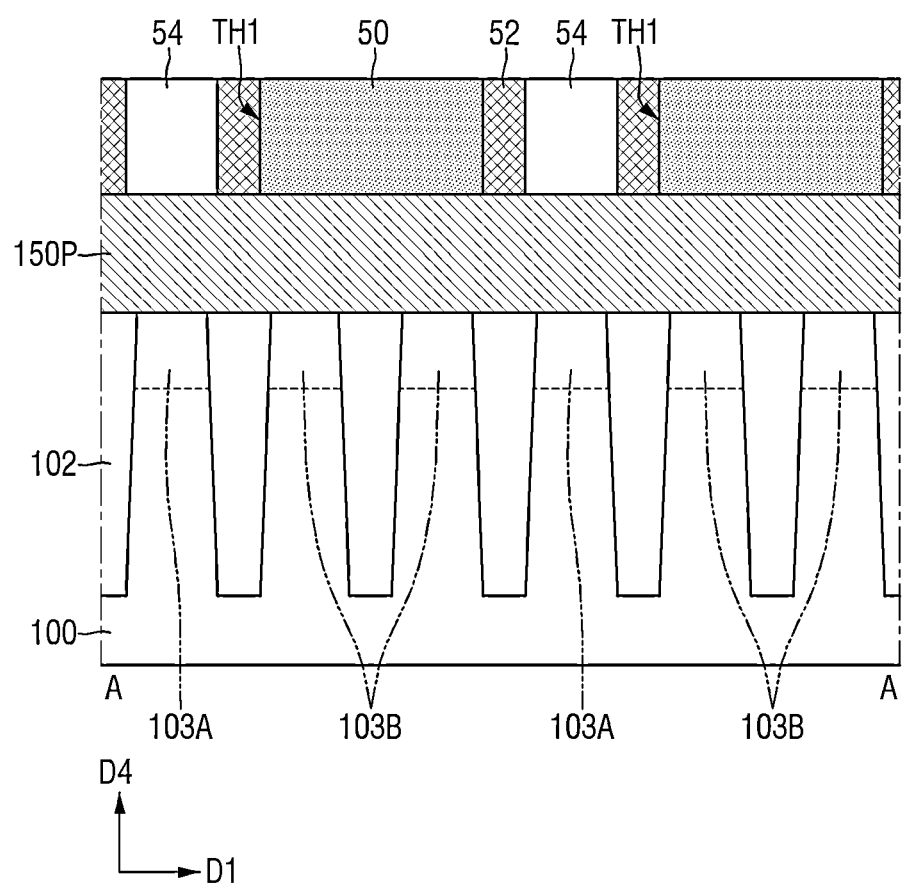
Figure 19B:
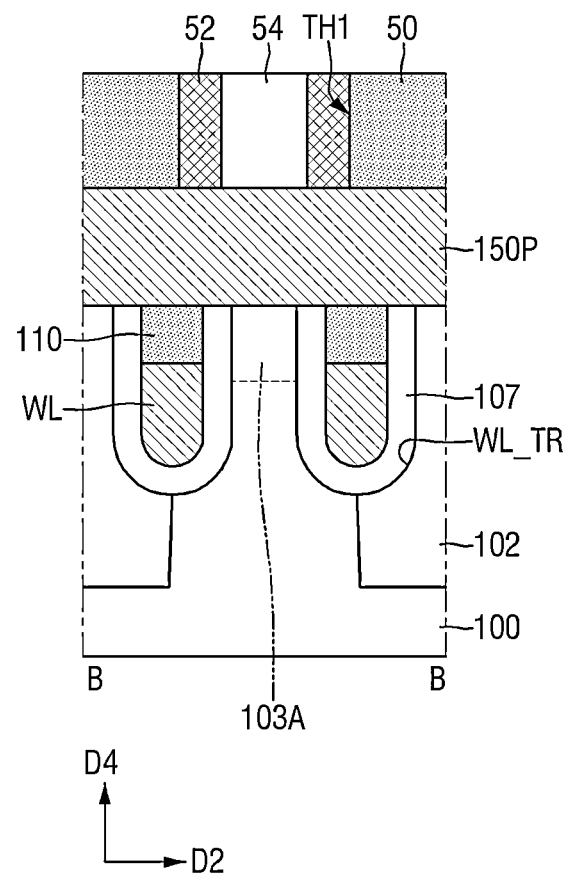

Referring to FIGS. 18 through 19B, mask spacers 52 may be formed on the stack conductive film 150P. The mask spacers 52 may be formed along sidewalls of the first openings TH1. In a case where the first openings TH1 have a circular shape, the mask spacers 52 may have a ring- or donut-shape in a plan view.

A spacer film may be formed on the first mask pattern 50. The spacer film may be formed along the upper surfaces of the first mask pattern 50, the sidewalls of the first openings TH1, and parts of the stack conductive film 150P that overlap the first openings TH1. The mask spacers 52 may be formed on the stack conductive film 150P by etching back the spacer film.

The mask spacers 52 may include a material having etching selectivity with respect to the first mask pattern 50. In a case where the first mask pattern 50 includes silicon nitride, the mask spacers 52 may include a material having etching selectivity with respect to silicon nitride. For example, the mask spacers 52 may include TiN or titanium oxide ($TiO_2$), but the present disclosure is not limited thereto.

Second mask patterns 54 may be formed on the stack conductive film 150P. The second mask patterns 54 may fill parts of the first openings TH1 that are not filled with the mask spacers 52. The second mask patterns 54 may be disposed to overlap the first parts 103A of the cell active regions ACT in the fourth direction D4. The second mask patterns 54 may include, for example, silicon oxide, but the present disclosure is not limited thereto.

Figure 20:
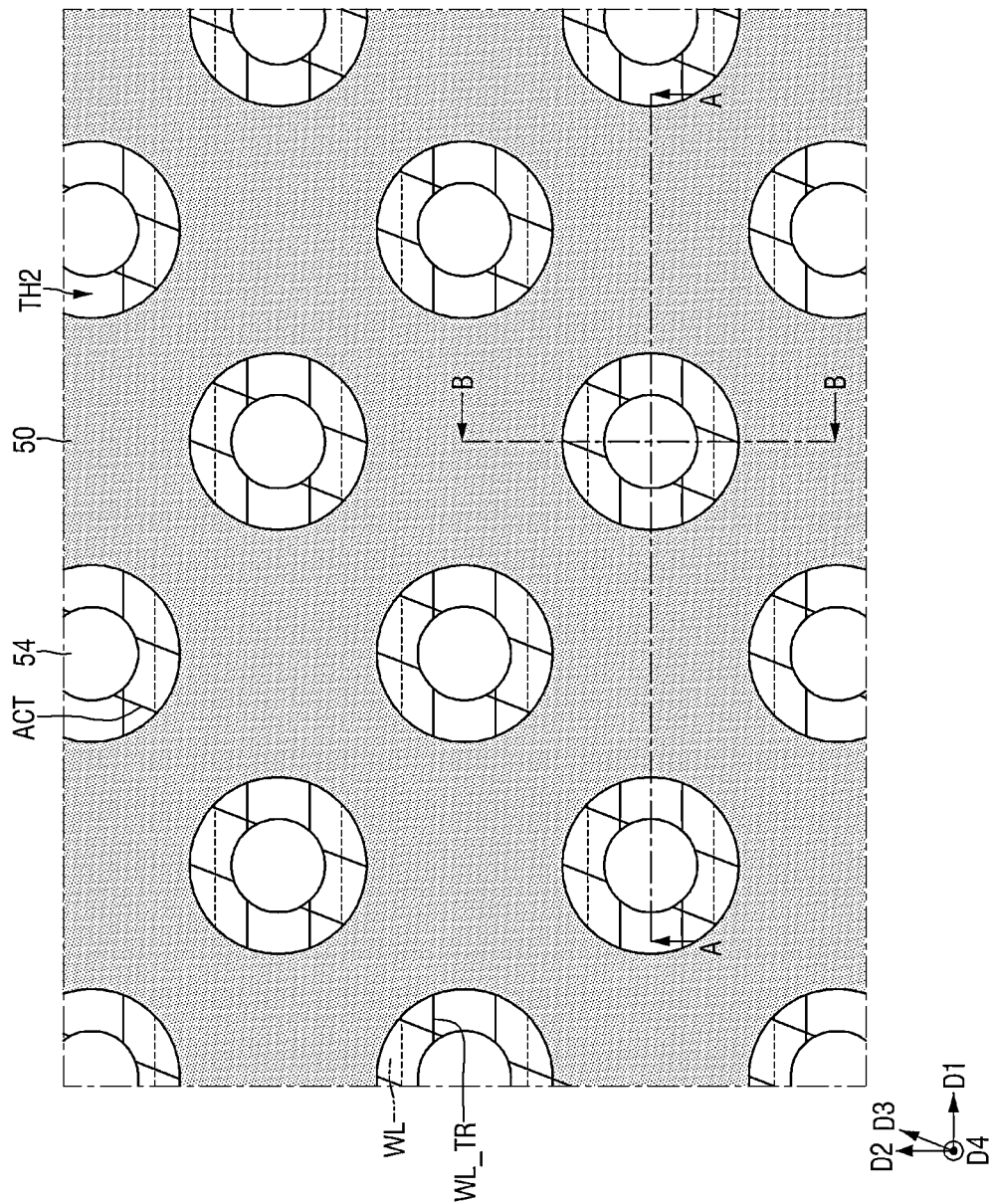
Figure 21A:
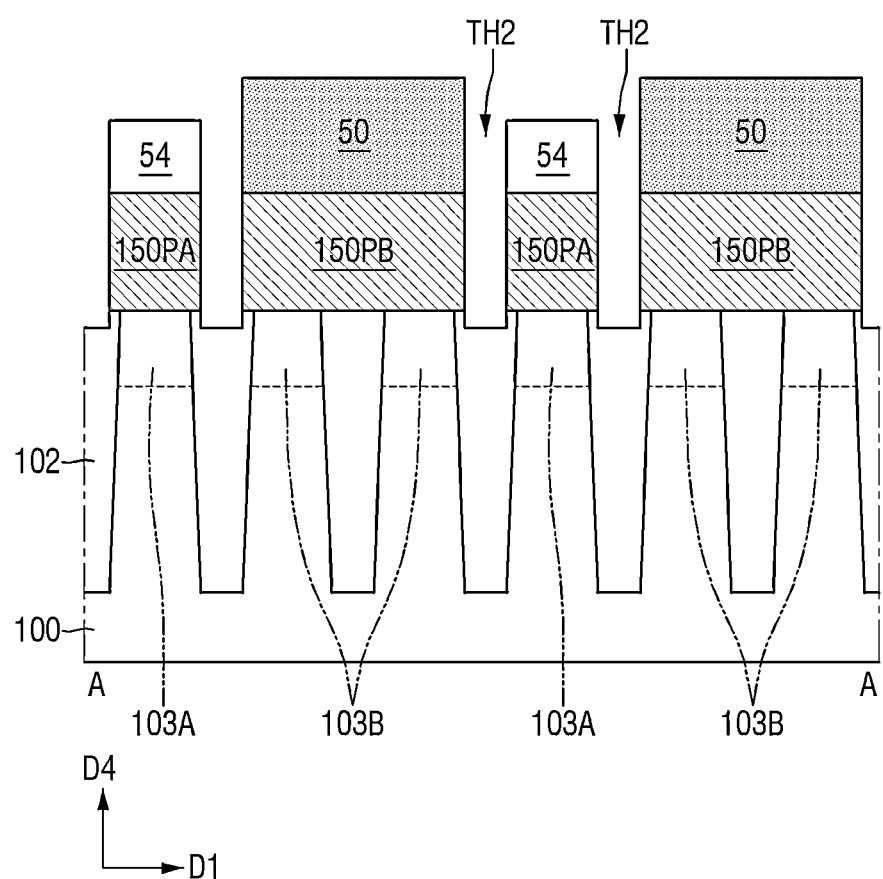
Figure 21B:
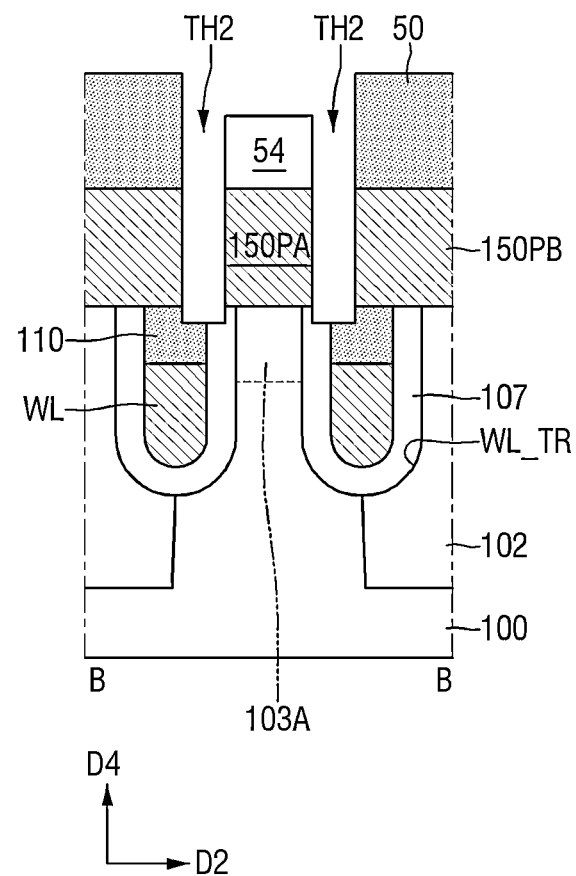

Referring to FIGS. 20 and 21B, second openings TH2 may be formed between the first mask pattern 50 and the second mask patterns 54 by removing the mask spacers 52.

Thereafter, parts of the stack conductive film 150 that overlap the second openings TH2 may be removed using the first mask pattern 50 and the second mask patterns 54. The second openings TH2 may extend to the upper surfaces of the cell device separation films 102.

Due to the presence of the second openings TH2, the stack conductive film 150P may be separated into first conductive patterns 150PA and a second conductive pattern 150PB. The first conductive patterns 150PA may overlap the second mask patterns 54 in the fourth direction D4. The second conductive pattern 150PB may overlap the first mask pattern 50 in the fourth direction D4.

The first conductive patterns 150PA may have a circular or elliptical shape in a plan view. The first conductive patterns 150PA may overlap the first parts 103A of the cell active regions ACT. The second conductive pattern 150PB may cover second parts 103B of every two adjacent cell active regions ACT. The second conductive pattern 150PB may have a mesh shape in a plan view.

The second openings TH2 may have a donut shape, as illustrated in FIG. 20. Upper portions of the cell device separation films 102, the cell gate insulating films 107, and the word line capping patterns 110 may be partially removed by an etching process, but the present disclosure is not limited thereto.

The Ru film 153P of the stack conductive film 150P may be removed using an etching gas containing oxygen. The etching gas may have a high etching selectivity for the first mask pattern 50 and the second mask patterns 54. That is, during the removal of the Ru film 153P, the first mask pattern 50 and the second mask patterns 54 may not be removed or may be removed only slightly.

Due to the difference between the material of the first mask pattern 50 and the material of the second mask patterns 54, the upper surfaces of the second mask patterns 54 may become lower than the upper surface of the first mask pattern 50 during the formation of the first conductive patterns 150PA and the second conductive pattern 150PB.

Figure 22:
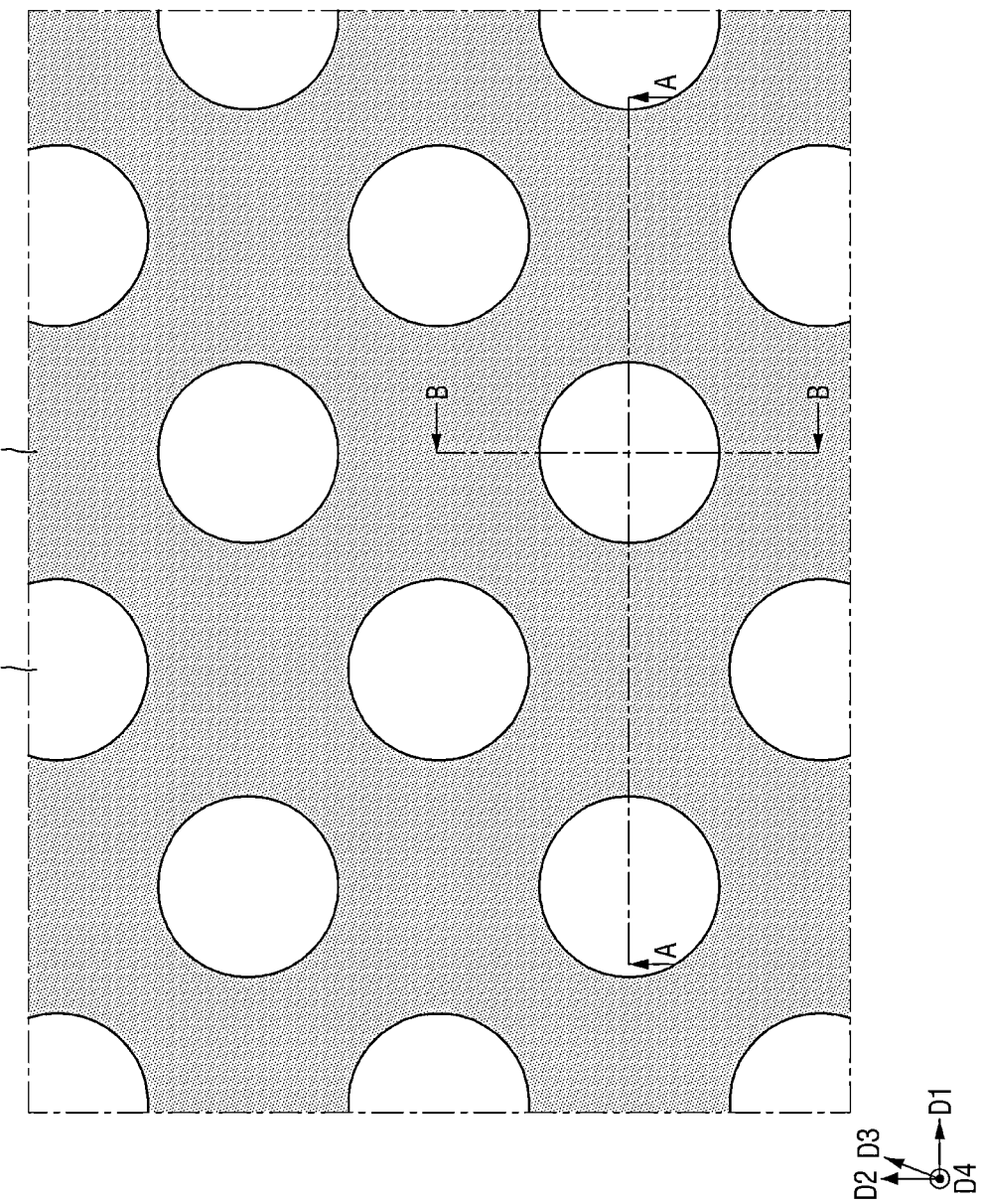
Figure 23A:
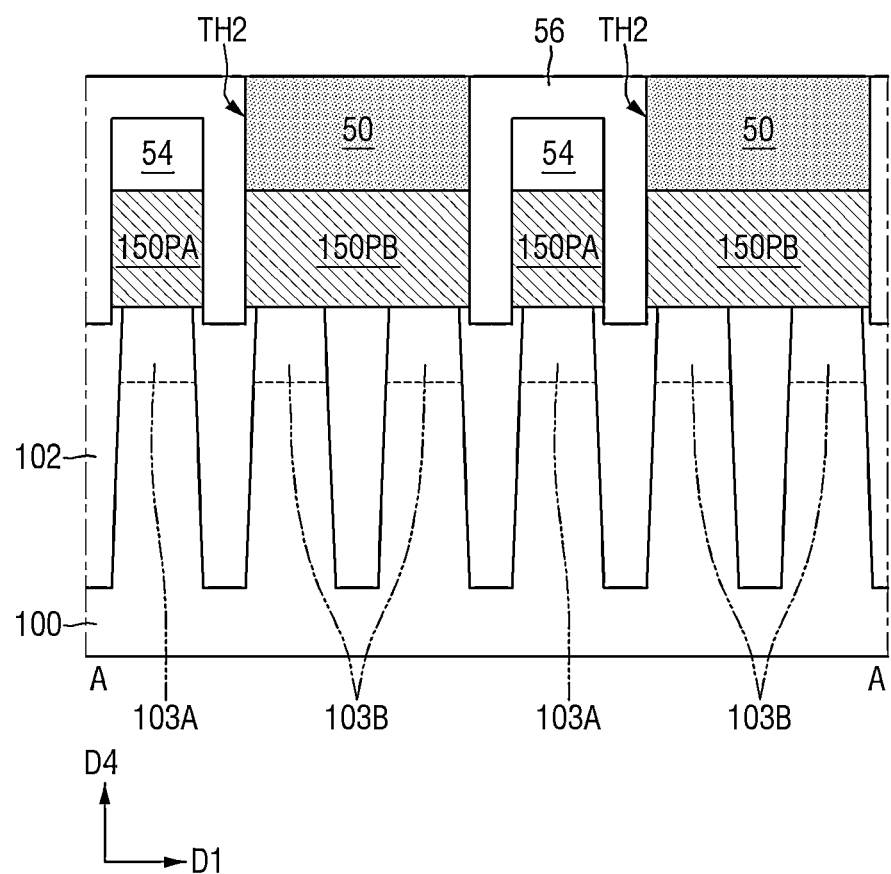
Figure 23B:
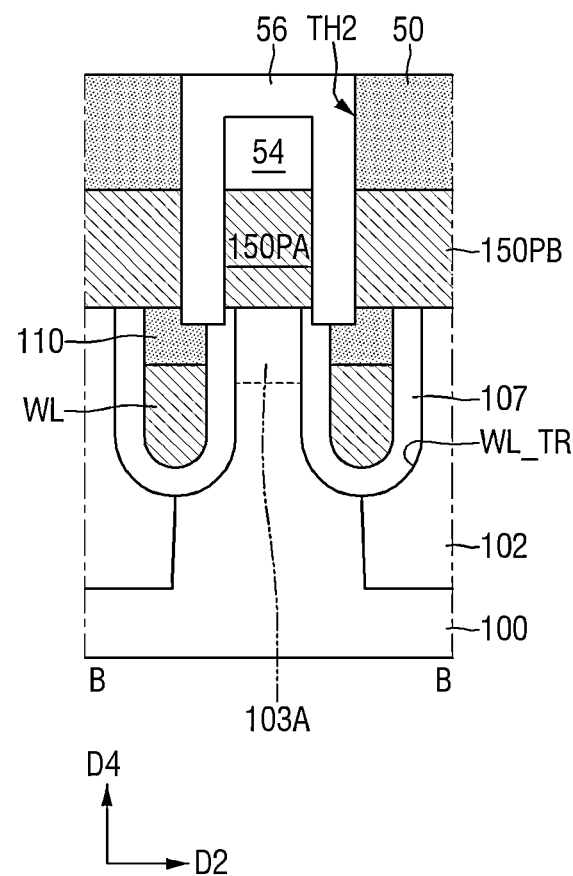

Referring to FIGS. 22 through 23B, capping mask patterns 56, which fill the second openings TH2, may be formed on the substrate 100.

The capping mask patterns 56 may cover the upper surfaces of the second mask patterns 54. The upper surfaces of the capping mask patterns 56 may be placed on the same plane as the upper surface of the first mask pattern 50. The capping mask patterns 56 may include, for example, silicon oxide, but the present disclosure is not limited thereto.

Figure 24:
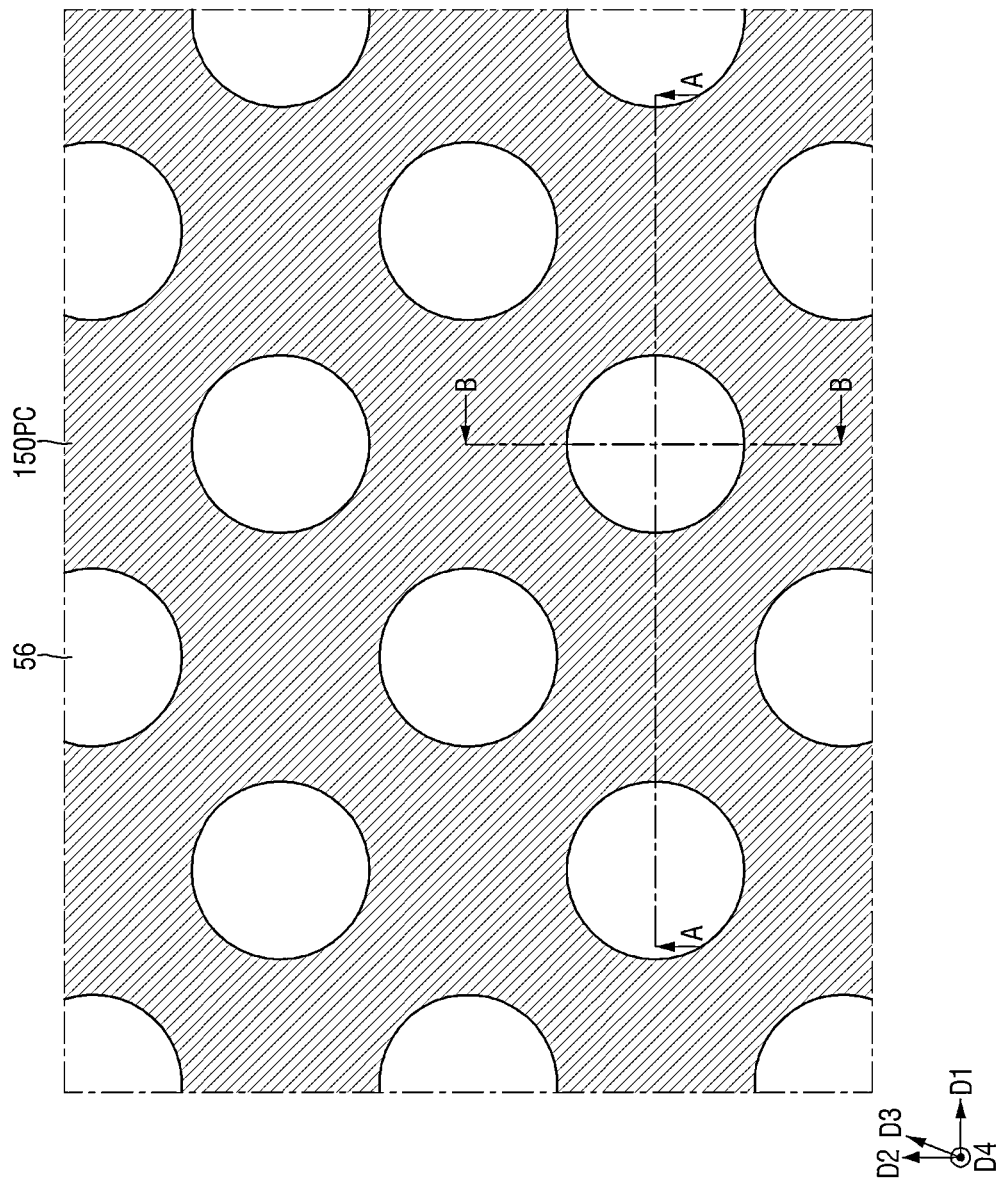
Figure 25A:
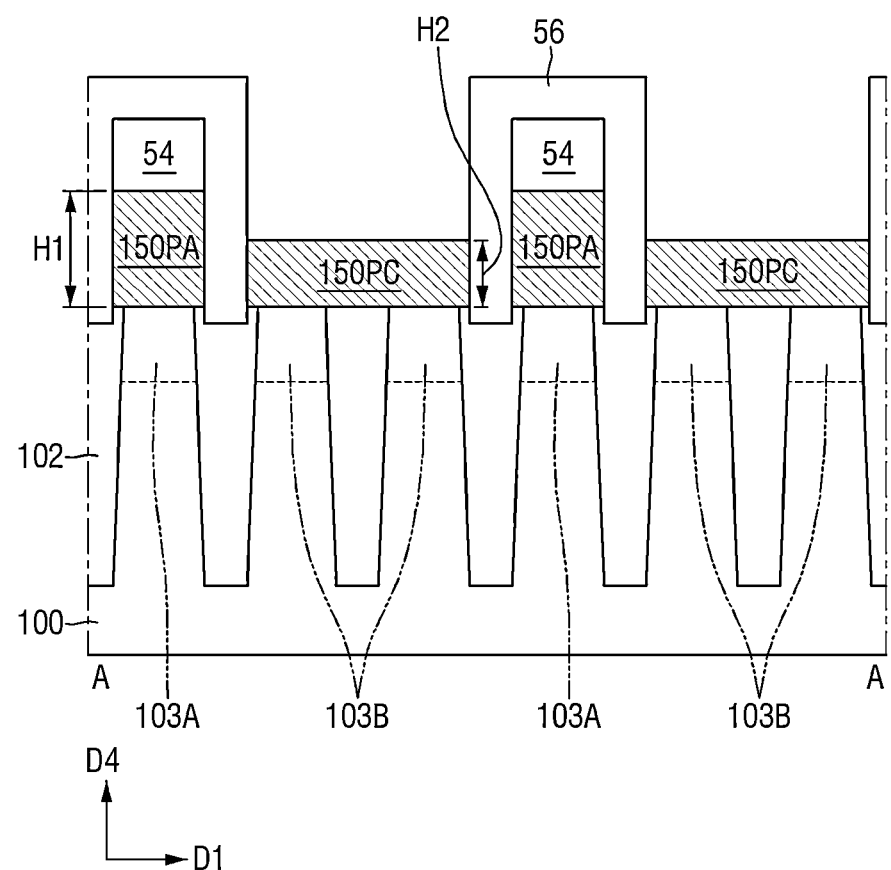
Figure 25B:
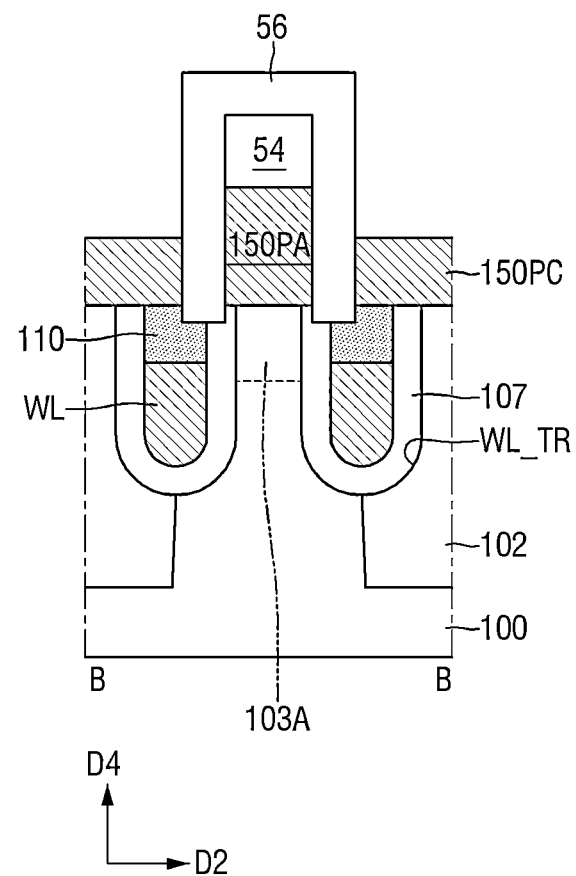

Referring to FIGS. 24 through 25B, the second conductive pattern 150PB may be exposed by removing the first mask pattern 50.

A third conductive pattern 150PC may be formed by removing part of the second conductive pattern 150PB. The third conductive pattern 150PC may be formed by removing an upper portion of the second conductive pattern 150PB. In other words, as the thickness of the second conductive pattern 150PB decreases, the third conductive pattern 150PC may be formed. During the formation of the third conductive pattern 150PC, the capping mask patterns 56 may protect the first conductive patterns 150PA.

A height H1 from the upper surfaces of the cell device separation films 102 to the upper surfaces of the first conductive patterns 150PA may be greater than a height H2 from the upper surfaces of the cell device separation films 102 to the upper surface of the third conductive pattern 150PC.

Figure 26:
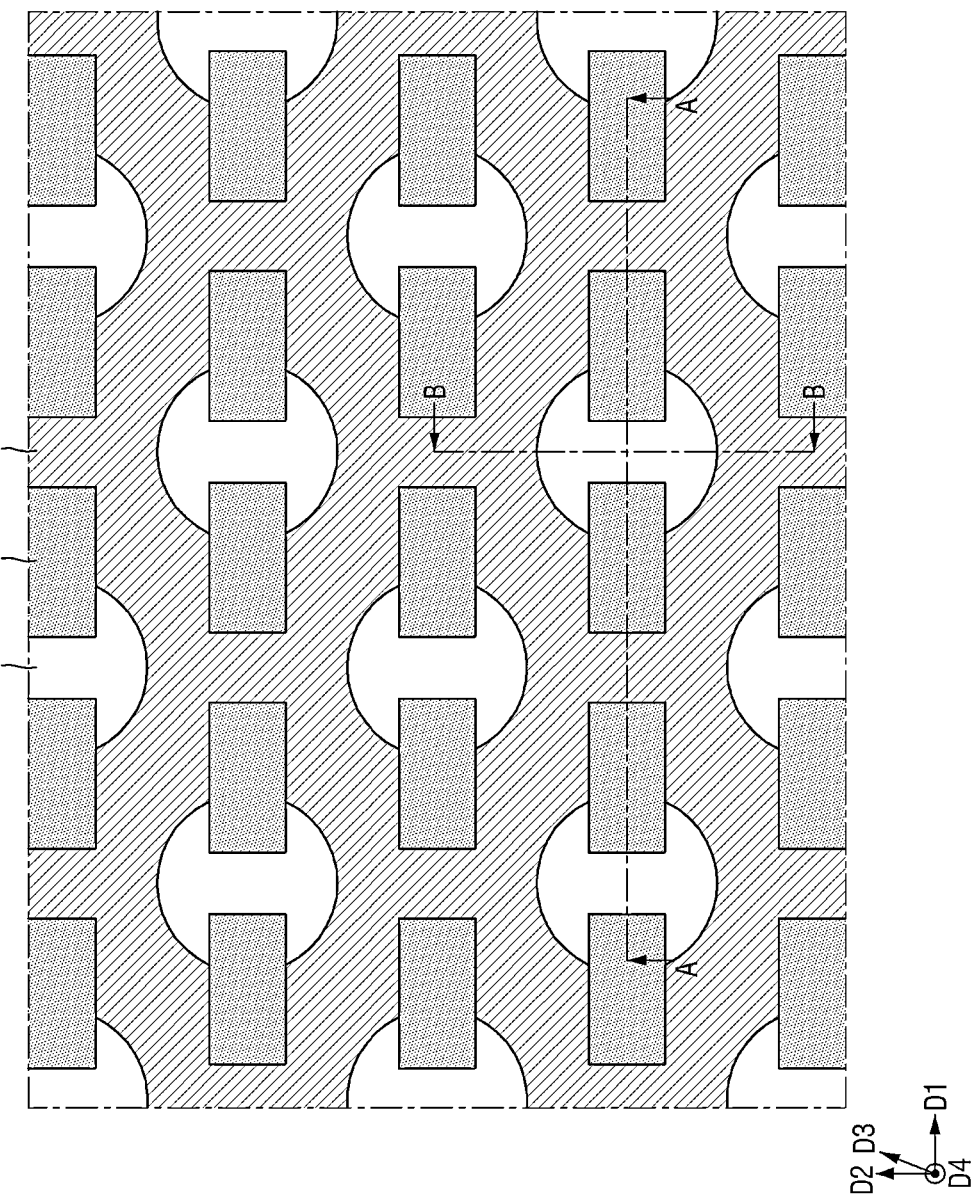
Figure 27A:
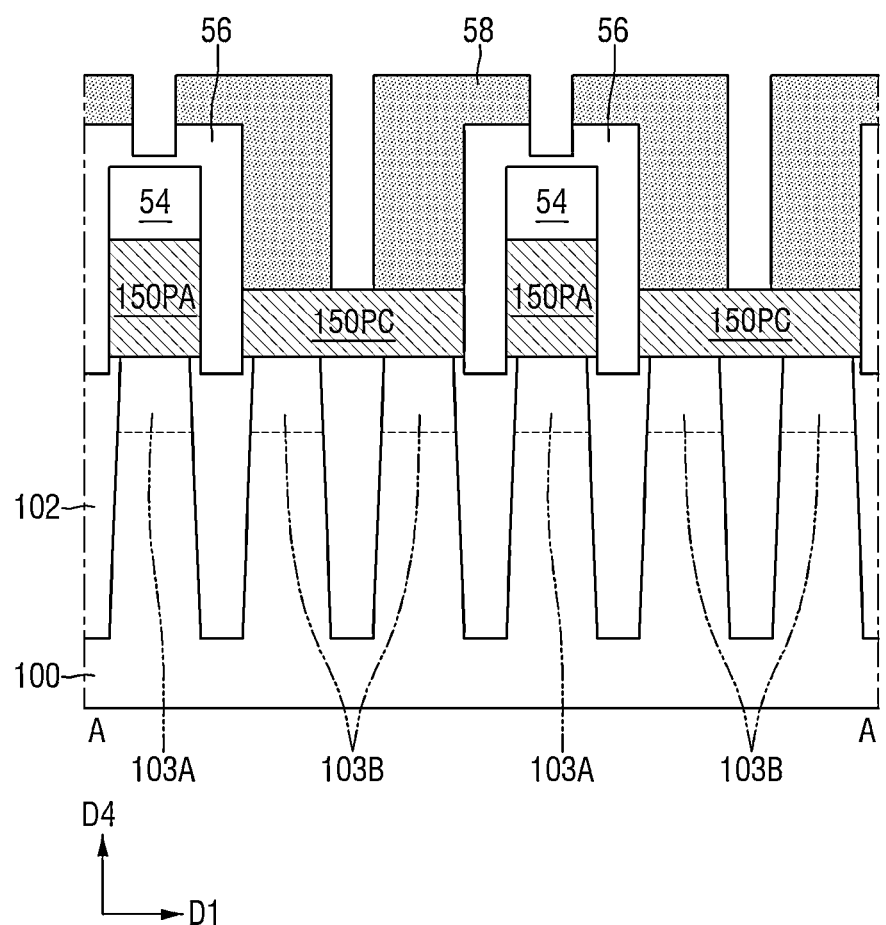
Figure 27B:
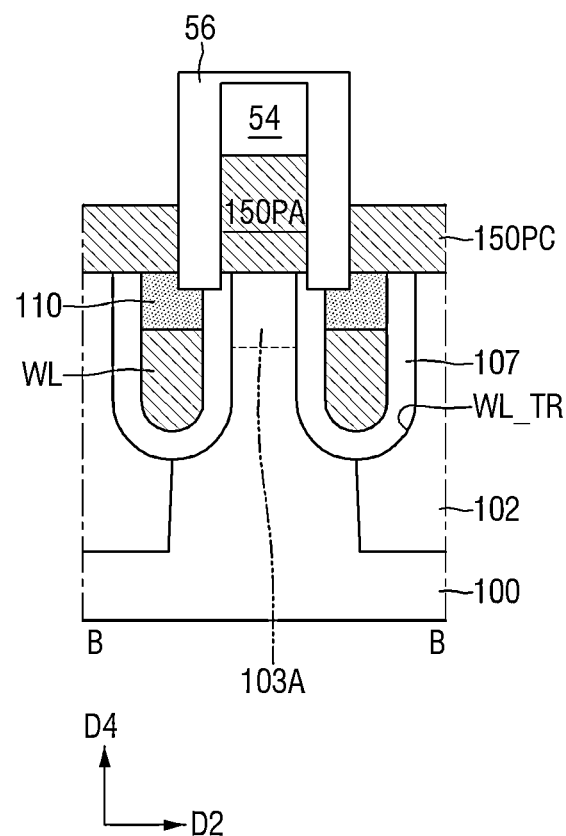

Referring to FIGS. 26 through 27B, third mask patterns 58 may be formed on the capping mask patterns 56 and the third conductive pattern 150PC. The third mask patterns 58 may include, for example, a spin-on-hard mask (SOH) material, an amorphous carbon layer (ACL), silicon nitride, silicon oxynitride, or photoresist.

The third mask patterns 58 may be arranged two-dimensionally in the first direction D1 and a second direction D2. The third mask patterns 58 may be positioned on the substrate 100, between the word lines WL, and on the cell device separation films 102. Two adjacent third mask patterns 58 may overlap one capping mask pattern 56. The third conductive pattern 150PC and the capping mask patterns 56 may be exposed between the third mask patterns 58.

The third mask patterns 58 may be formed by various patterning processes such as double patterning technology (DPT), quadruple patterning technology (QPD), or a litho-etch, litho-etch (LELE) process. During the formation of the third mask patterns 58, parts of the capping mask patterns 56 may be removed, but the present disclosure is not limited thereto. In some example embodiments, during the formation of the third mask patterns 58, the capping mask patterns 56 may not be removed. In some example embodiments, during the formation of the third mask patterns 58, not only the capping mask patterns 56, but also parts of the second mask patterns 54, may be removed.

Figure 28:
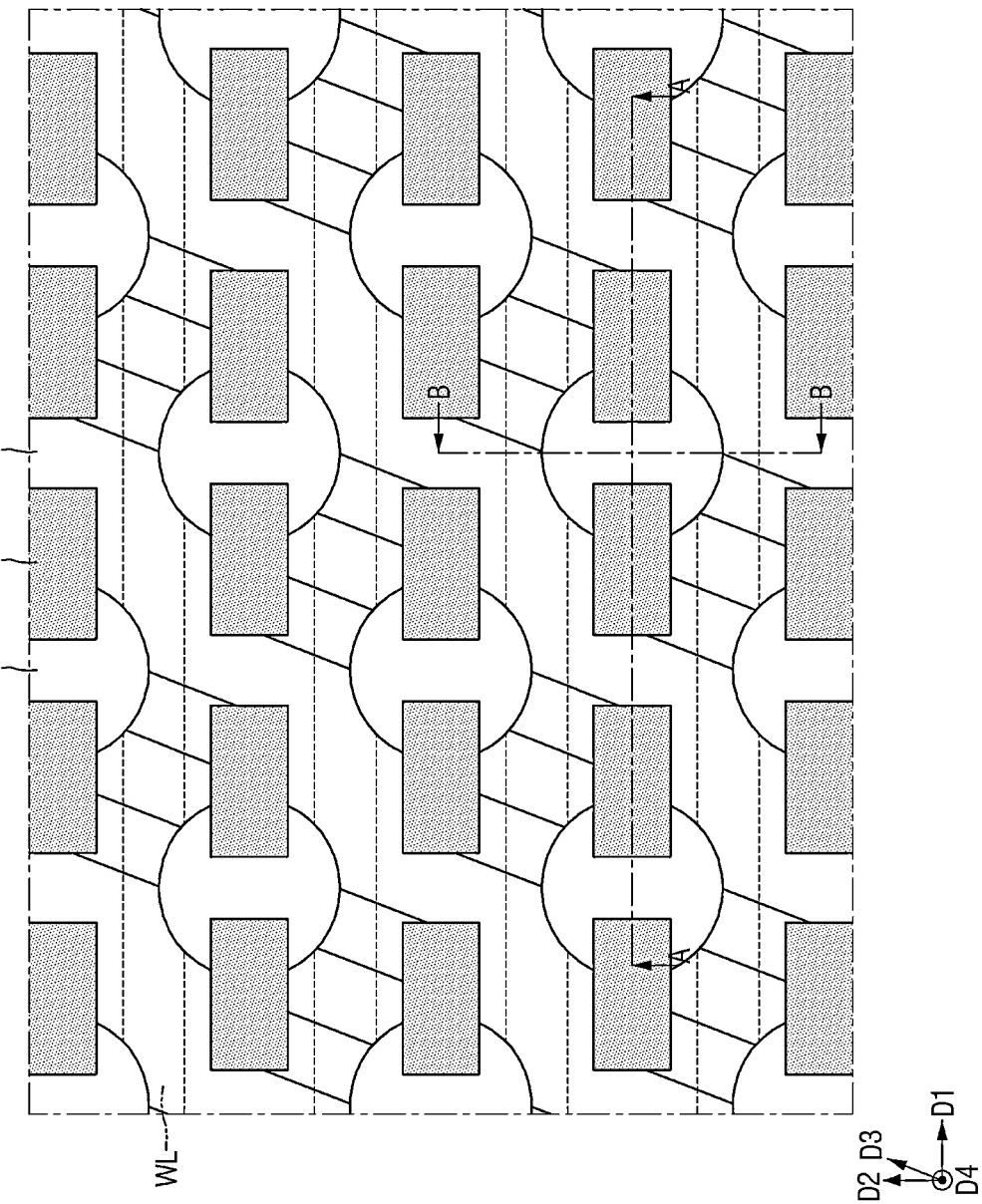
Figure 29A:
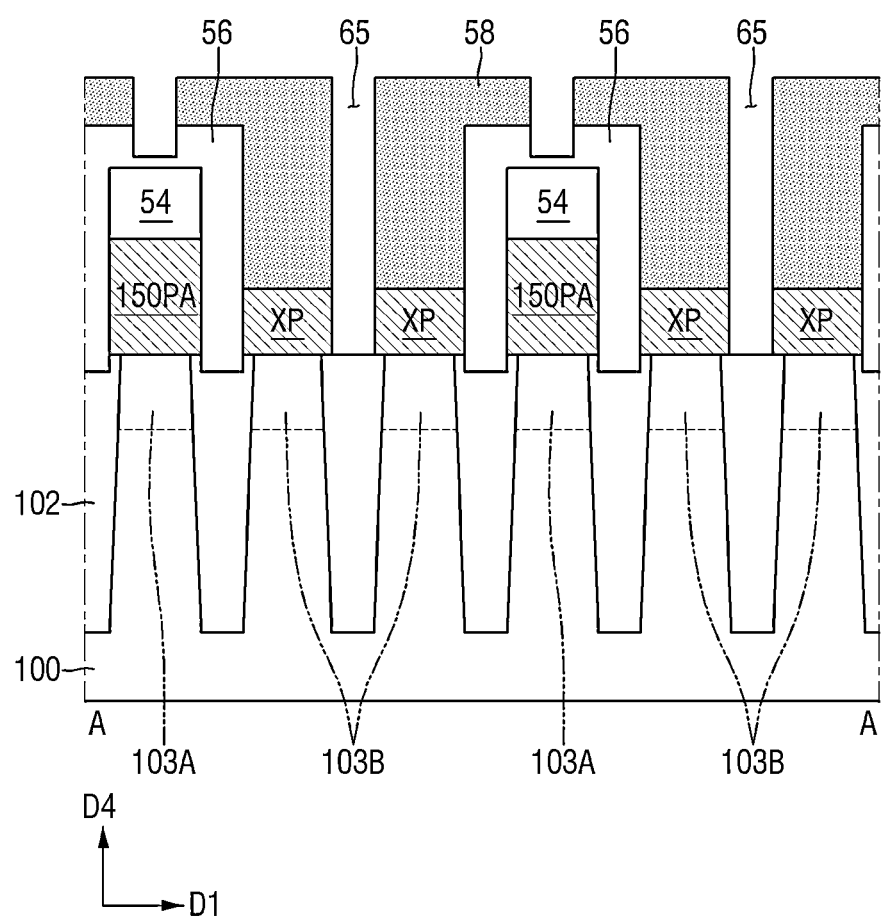
Figure 29B:
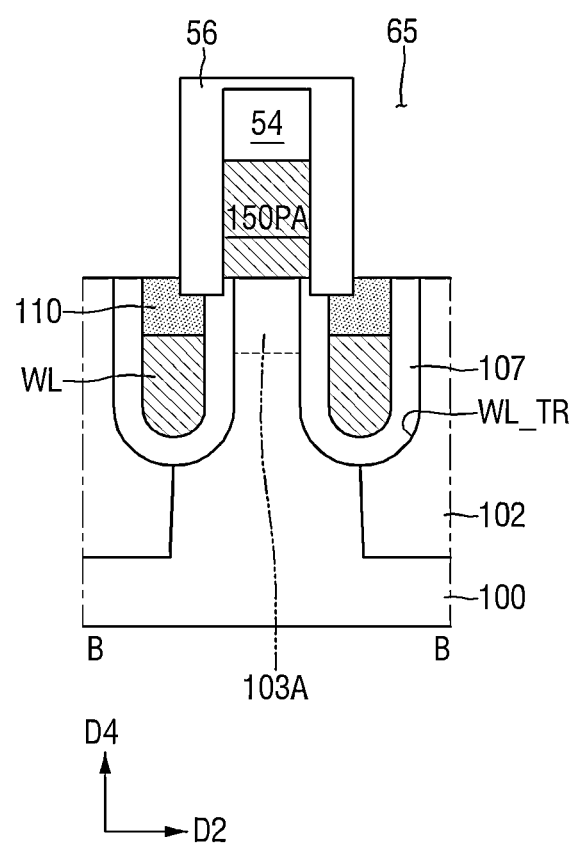

Referring to FIGS. 28 through 29B, node pads XP, which are spaced apart from one another, may be formed by etching the third conductive pattern 150PC using the third mask patterns 58 as a mask. Pad separation spaces 65 may be formed between the node pads XP. The node pads XP may overlap the second parts 103B of the cell active regions ACT.

The cell device separation films 102 may be exposed by the pad separation spaces 65. The capping mask patterns 56 and the second mask patterns 54 may block or prevent the first conductive patterns 150PA from being etched and may protect the first conductive patterns 150PA.

Figure 31A:
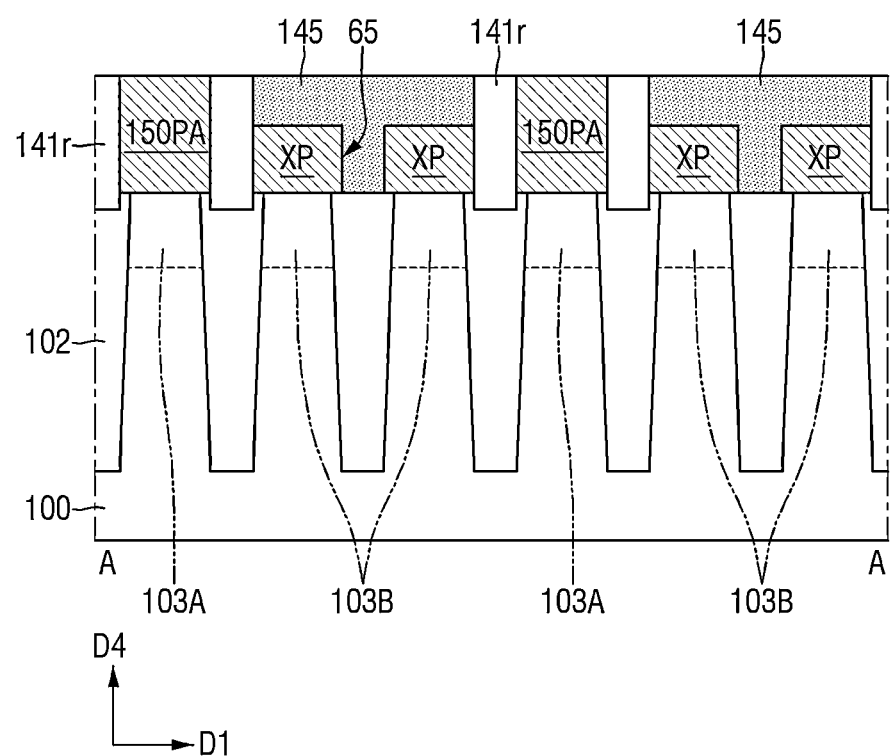
Figure 31B:
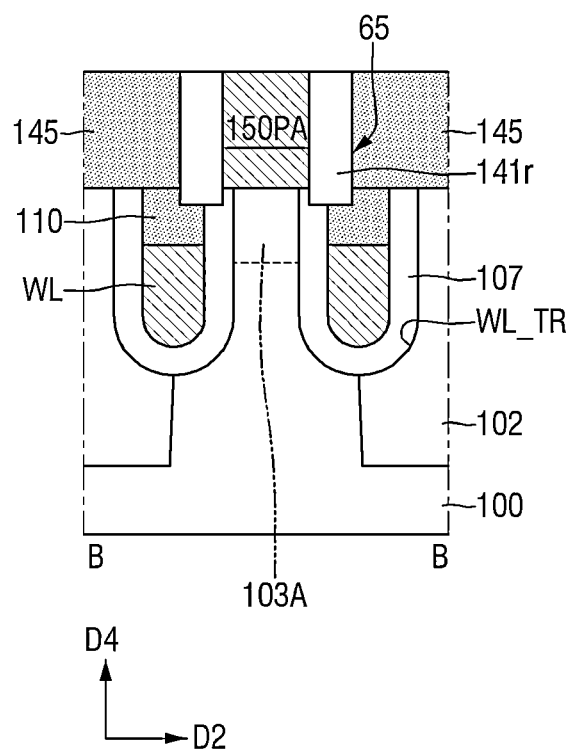

Referring to FIGS. 30 through 31B, the upper surfaces of the node pads XP may be exposed by removing the third mask patterns 58.

Pad separation films may be formed on the substrate 100. The pad separation films may fill the pad separation spaces 65 and may cover the upper surfaces of the node pads XP. The pad separation films, the capping mask patterns 56, and the second mask patterns 54 may be partially removed by chemical mechanical polishing (CMP). As a result, the upper surfaces of the first conductive patterns 150PA may be exposed, and at the same time, contact separation patterns 141r may be formed along sidewalls of the first conductive patterns 150PA. The contact separation patterns 141r may be parts of the capping mask patterns 56. The contact separation patterns 141r may have a donut shape in a plan view.

Pad separation patterns 145 may be formed between the node pads XP. The pad separation patterns 145 may fill the pad separation spaces 65 and may cover the upper surfaces of the node pads XP. The pad separation patterns 145 may be parts of the pad separation film. The pad separation pattern 145 may include, for example, silicon nitride, but the present disclosure is not limited thereto.

The upper surfaces of the pad separation patterns 145 may be placed on the same plane as the upper surfaces of the first conductive patterns 150PA and the upper surfaces of the contact separation patterns 141*r*.

Figure 32:
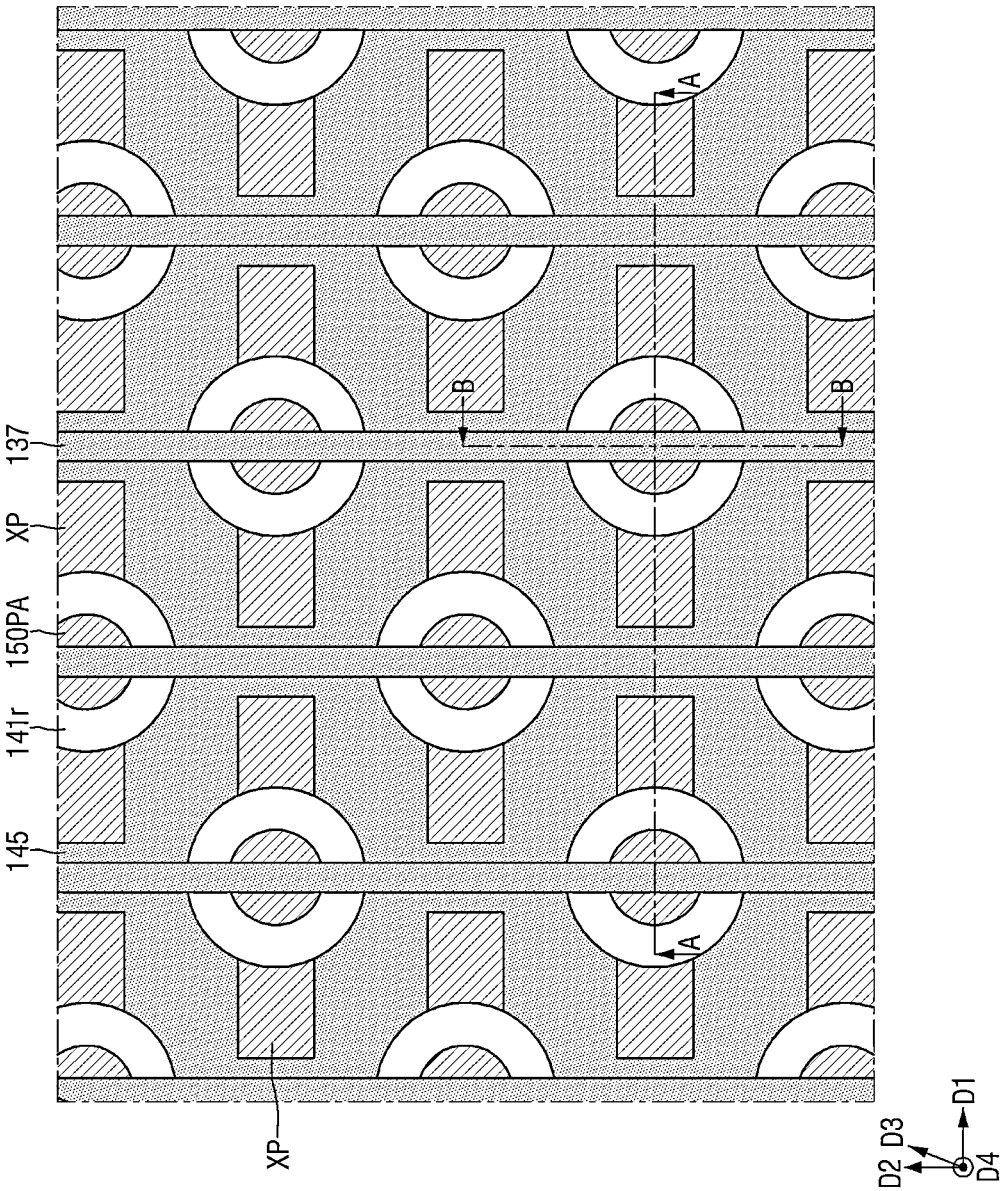
Figure 33A:
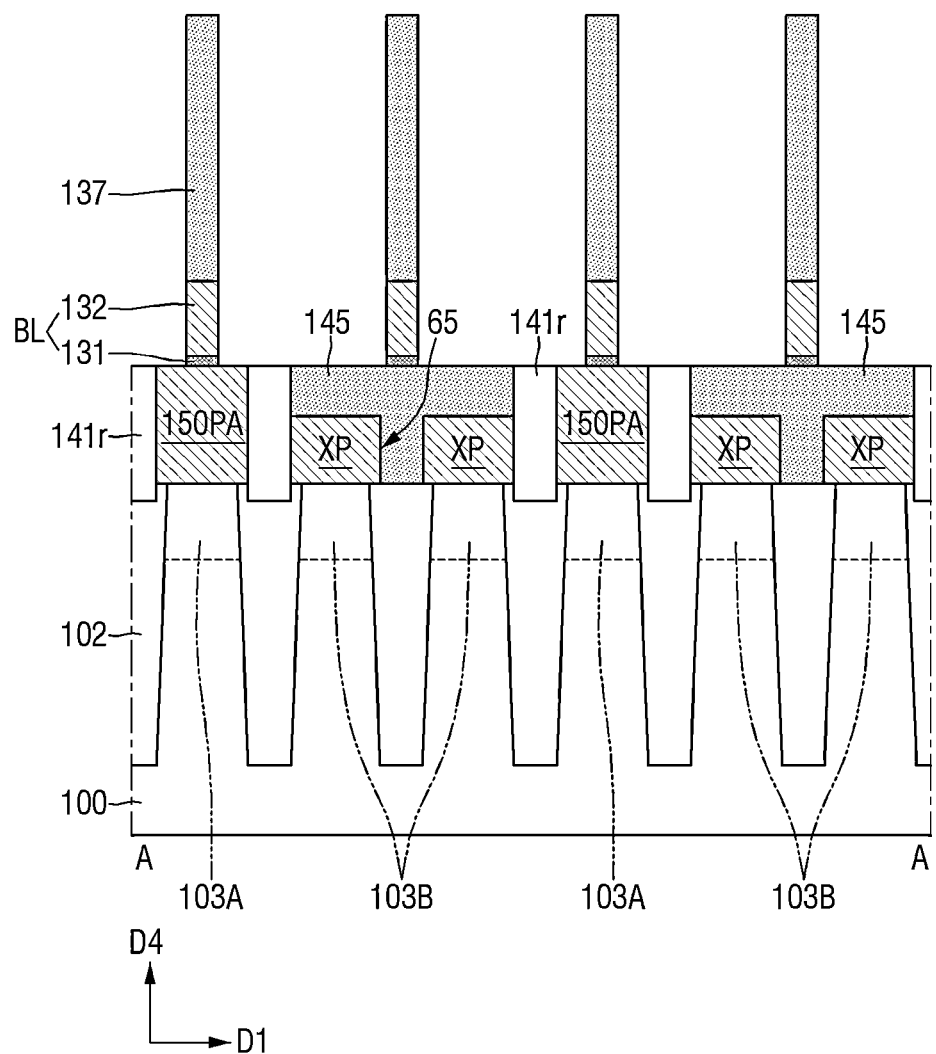
Figure 33B:
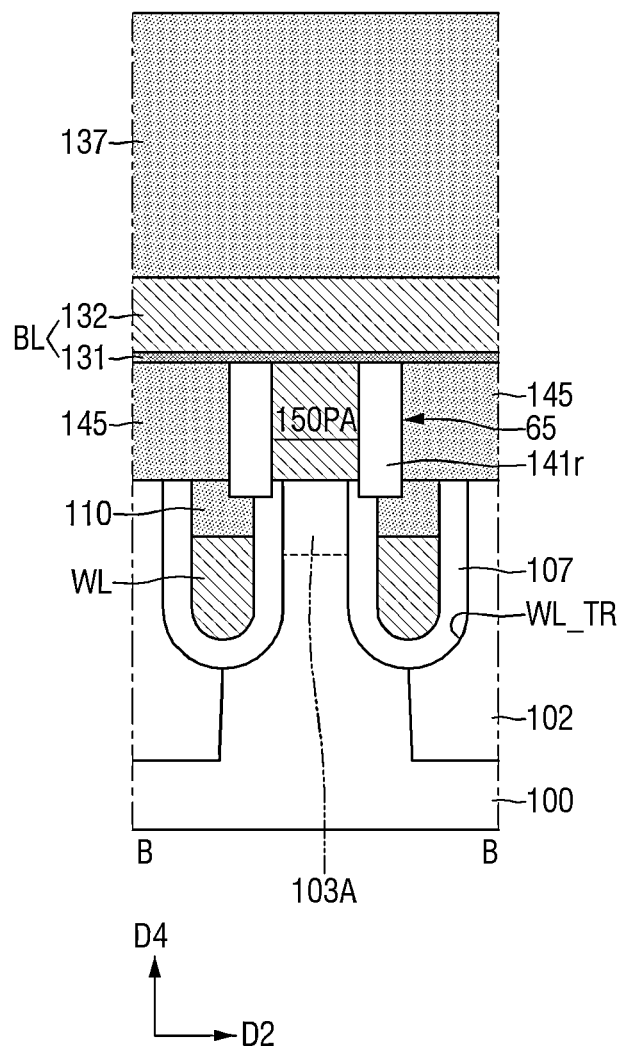

Referring to FIGS. 32 through 33B, bit lines BL and bit line capping films 137 may be formed on the first conductive patterns 150PA, the contact separation patterns 141*r*, and the pad separation patterns 145.

A lower conductive film and an upper conductive film may be sequentially formed on the first conductive patterns 150PA, the contact separation patterns 141*r*, and the pad separation patterns 145. The bit line capping films 137 may be formed on the upper conductive film. The bit lines BL may be formed by etching the lower conductive film and the upper conductive film using the bit line capping films 137 as a mask.

Figure 34A:
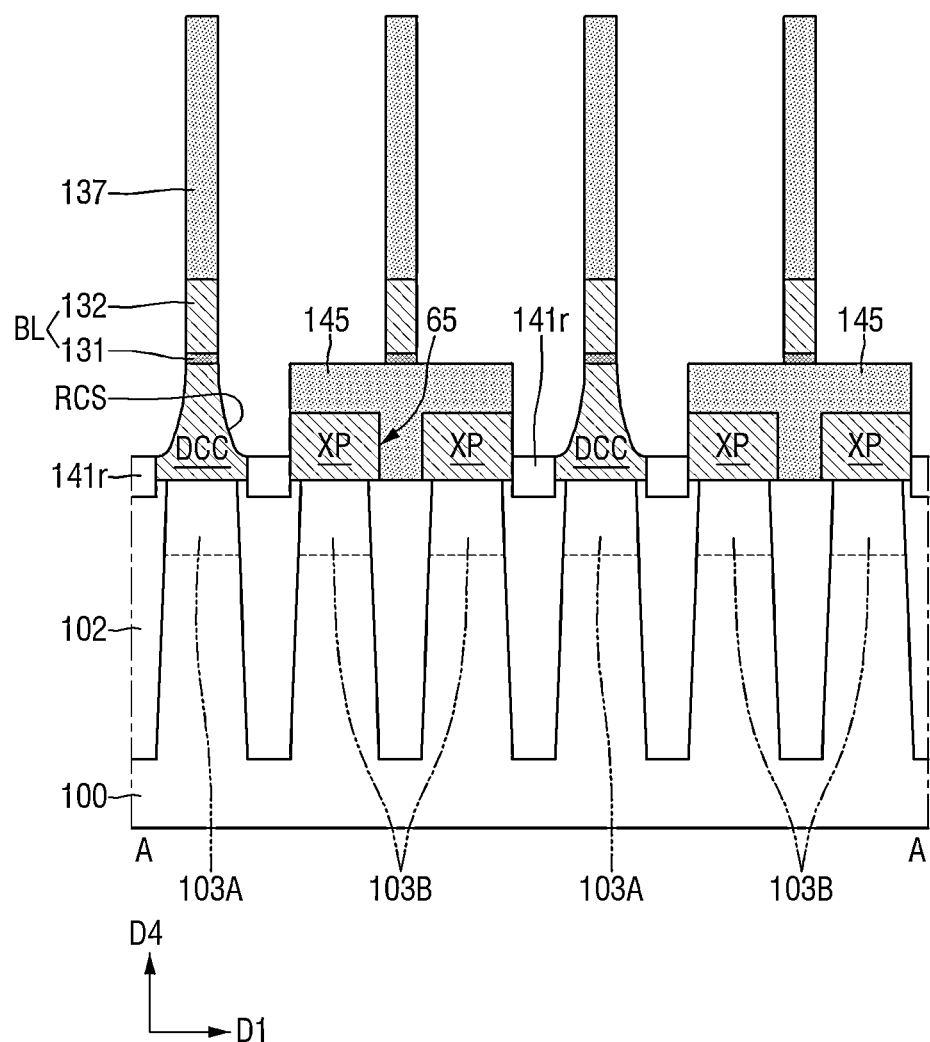
Figure 34B:
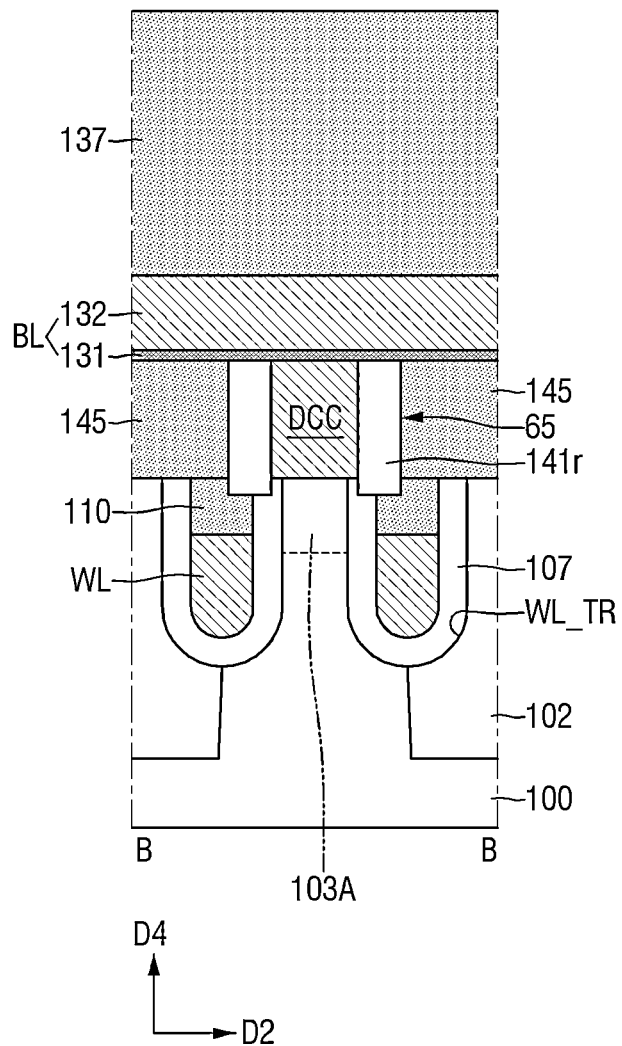

Referring to FIGS. 32, 34A, and 34B, bit line contacts DCC may be formed by etching the first conductive patterns 150PA, which protrude beyond the bit line capping films 137 in the first direction D1, using the bit line capping films 137 and the bit lines BL as an etching mask.

Even the contact separation patterns 141*r*, which do not overlap the bit line capping films 137, may be etched so that upper portions of the contact separation patterns 141*r* may be removed. Further, recess regions RCS may be formed on sides of the bit line contacts DCC. Due to the presence of the recess regions RCS, sidewalls of the node pads XP and sidewalls of the pad separation patterns 145 may be exposed.

Figure 35:
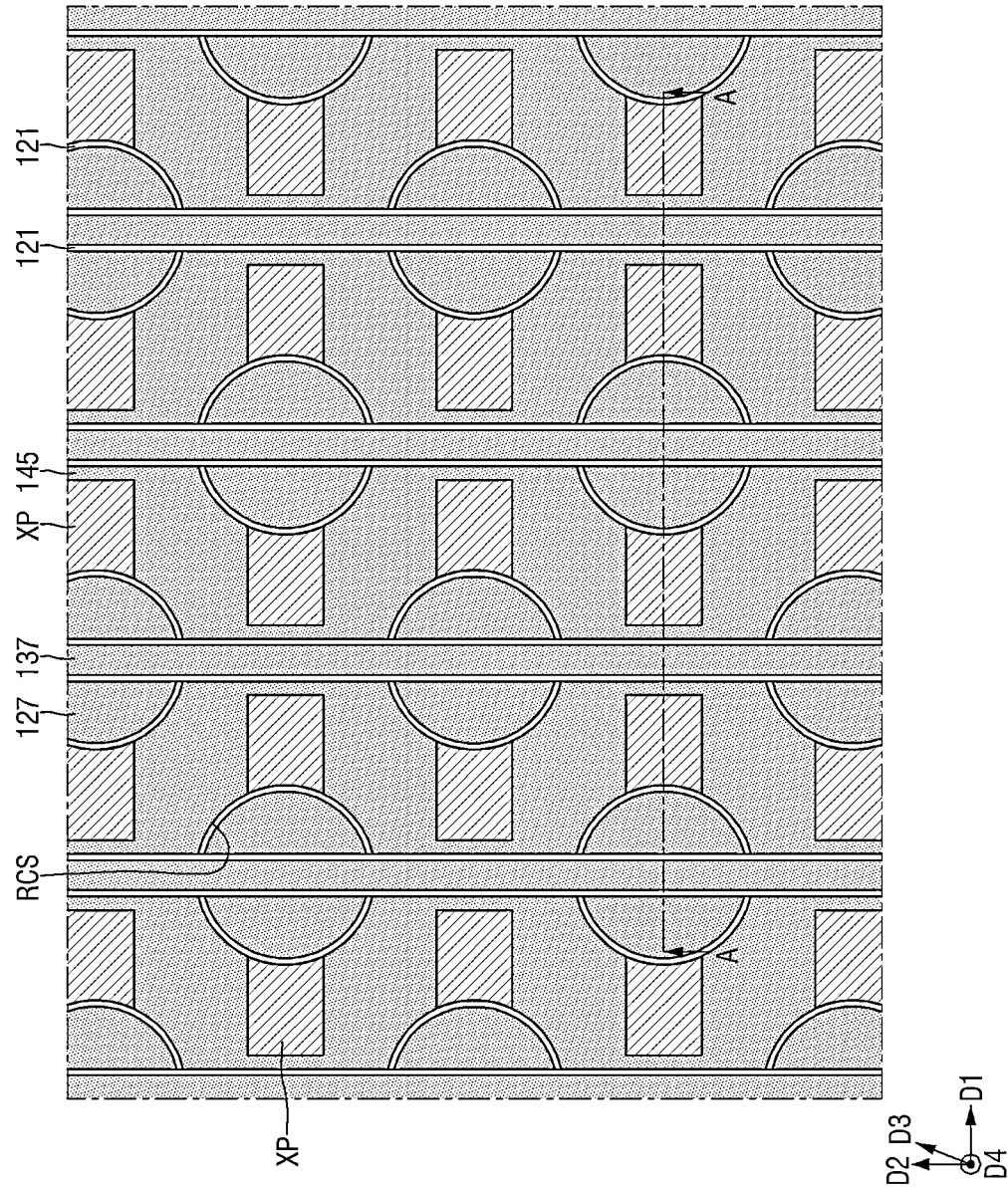
Figure 36:
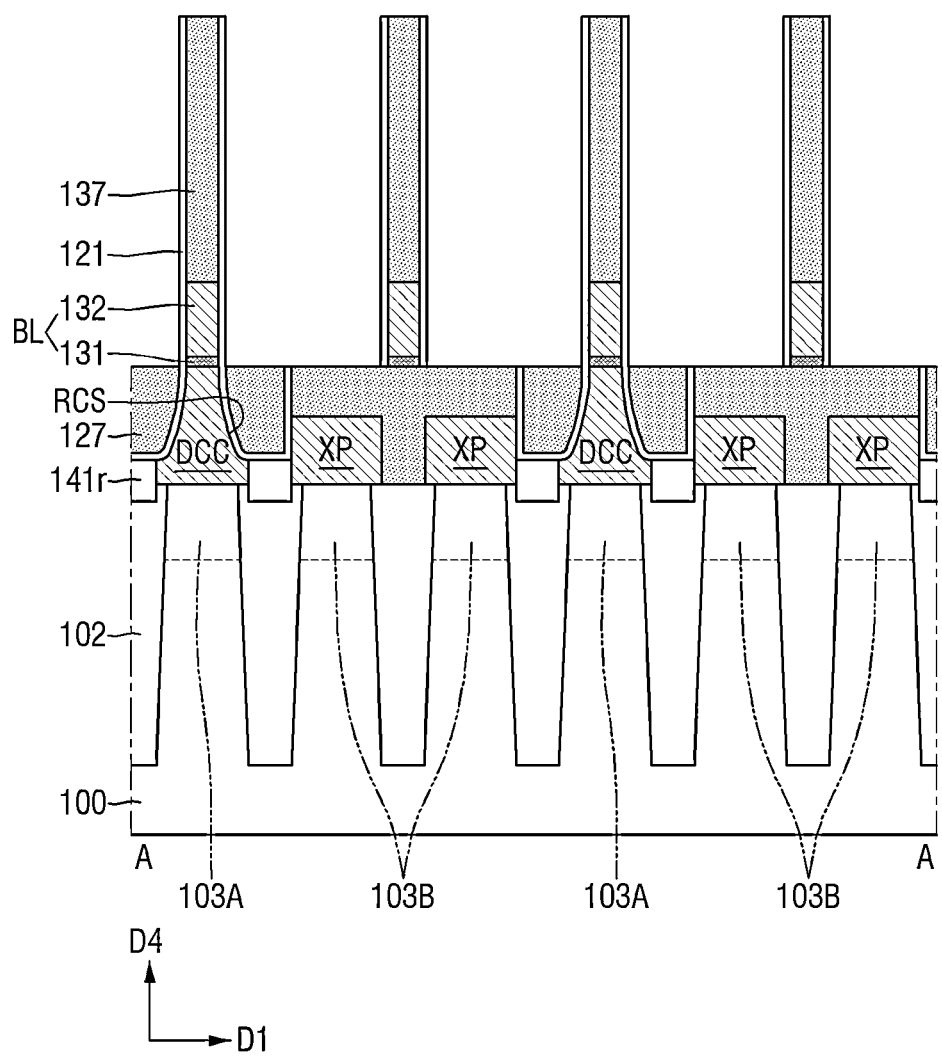

Referring to FIGS. 35 and 36, spacer liners 121 may be formed on the substrate 100.

Buried insulating films may be formed on the spacer liners 121. The buried insulating films may fill the recess regions RCS. Buried insulating patterns 127 may be formed in the recess regions RCS by etching back the buried insulating films. While the buried insulating patterns 127 are being formed, the upper surfaces of the pad separation patterns 145 may be exposed.

Figure 37:
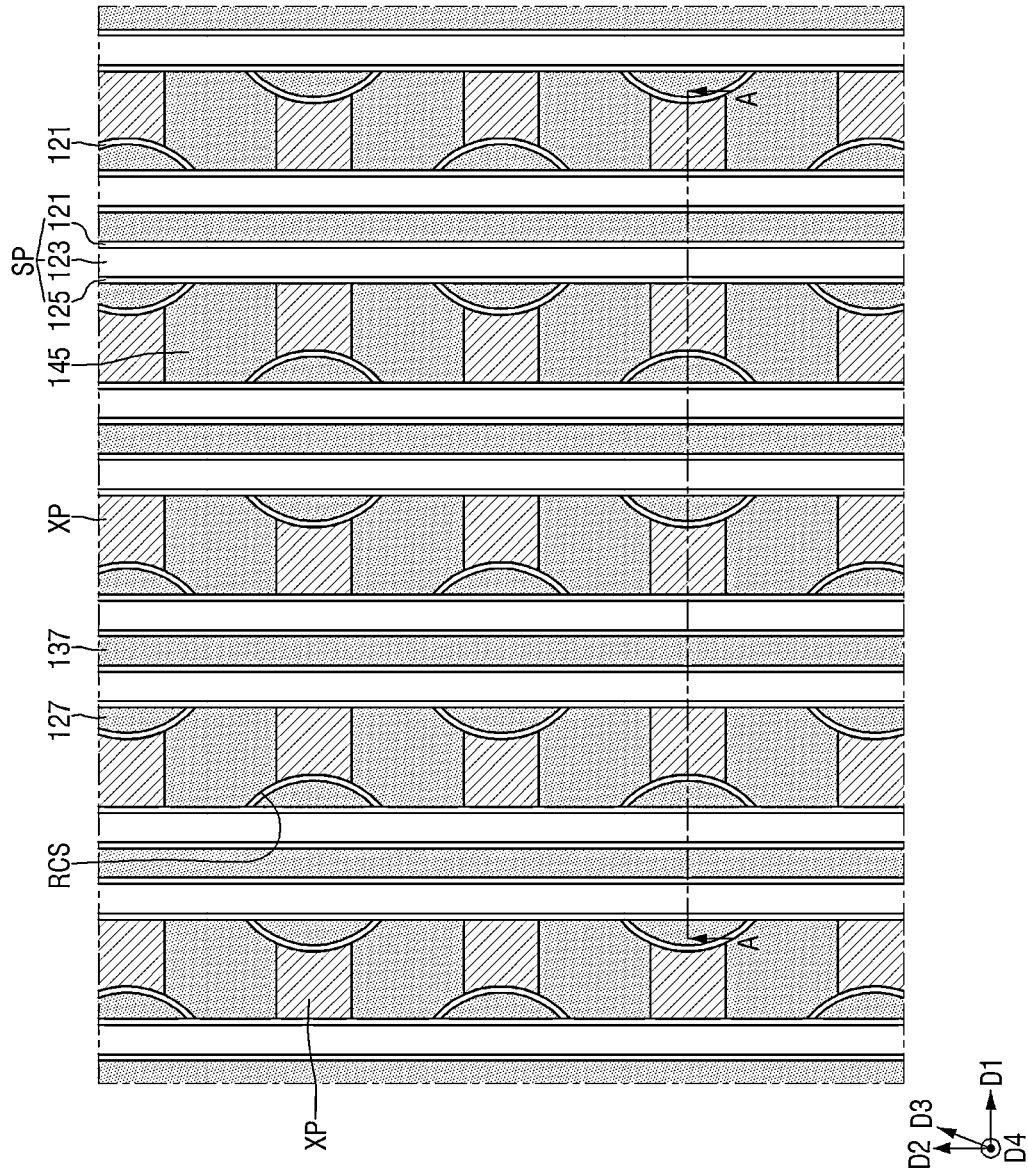
Figure 38:
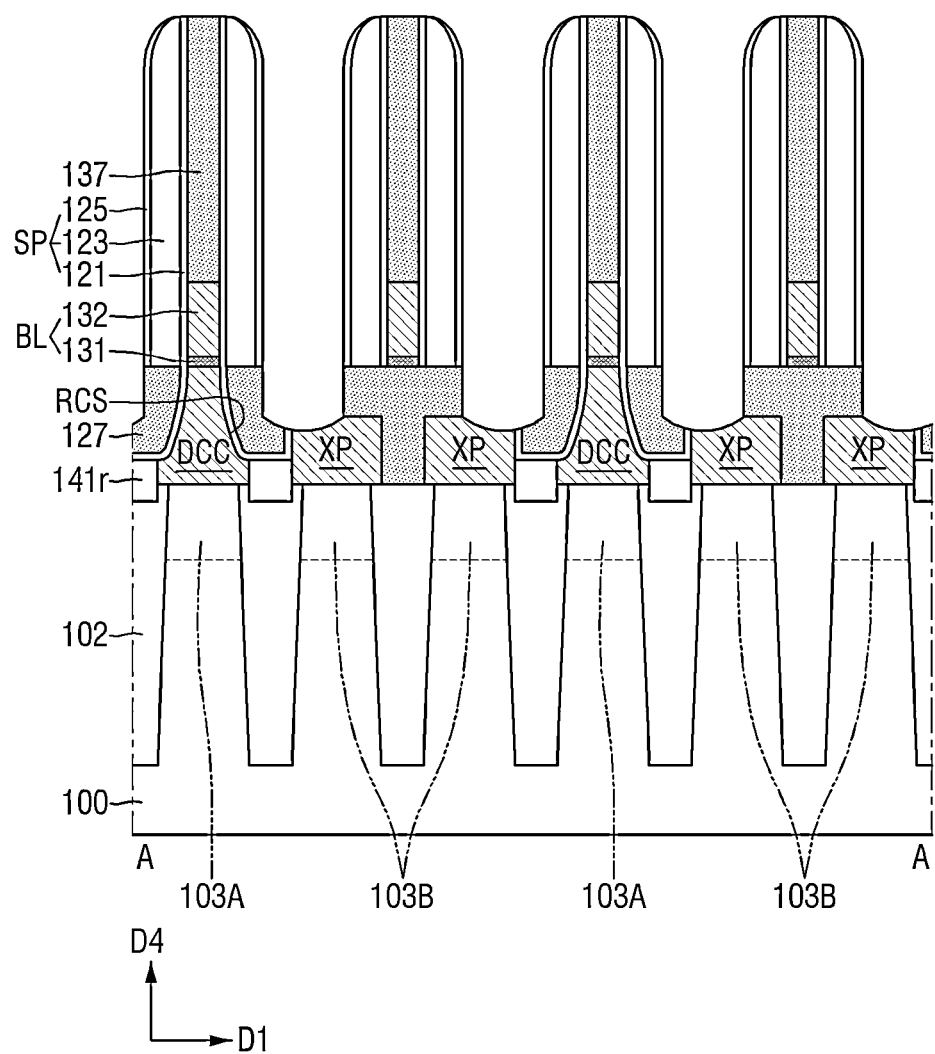

Referring to FIGS. 37 and 38, first spacers 123, which cover sidewalls of the spacer liners 121, may be formed. Also, second spacers 125, which cover sidewalls of the first spacers 123, may be formed. As a result, bit line spacers SP may be formed on sidewalls of the bit lines BL.

During the formation of the second spacers 125, the buried insulating patterns 127 and the pad separation patterns 145 may be partially removed so that the node pads XP may be partially exposed.

In some example embodiments, during the formation of the second spacers 125, the buried insulating patterns 127 and the pad separation patterns 145 may be partially etched, but the node pads XP may not be exposed.

In some example embodiments, during the formation of the second spacers 125, the buried insulating patterns 127 and the pad separation patterns 145 may not be etched.

Figure 39:
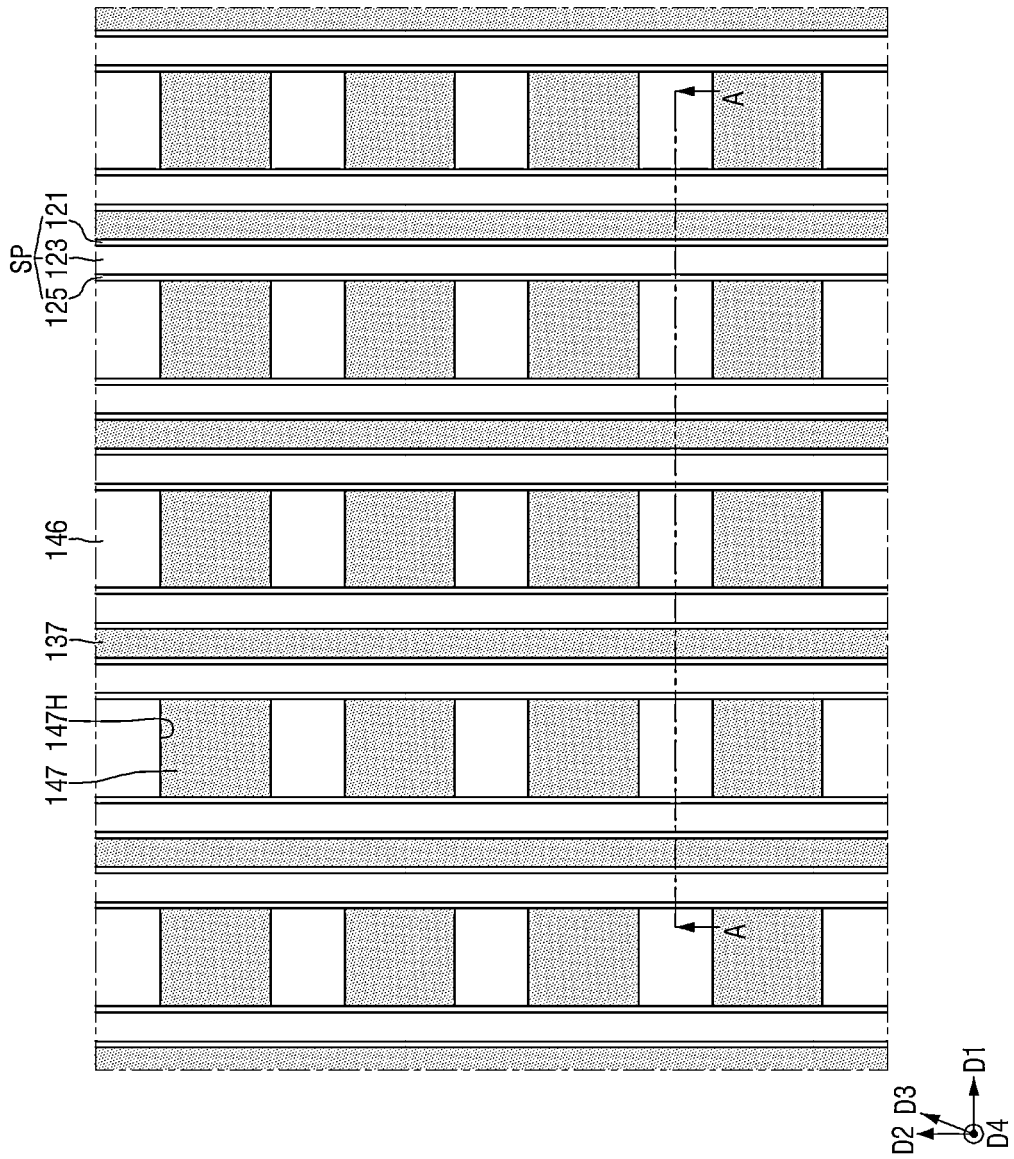
Figure 40:
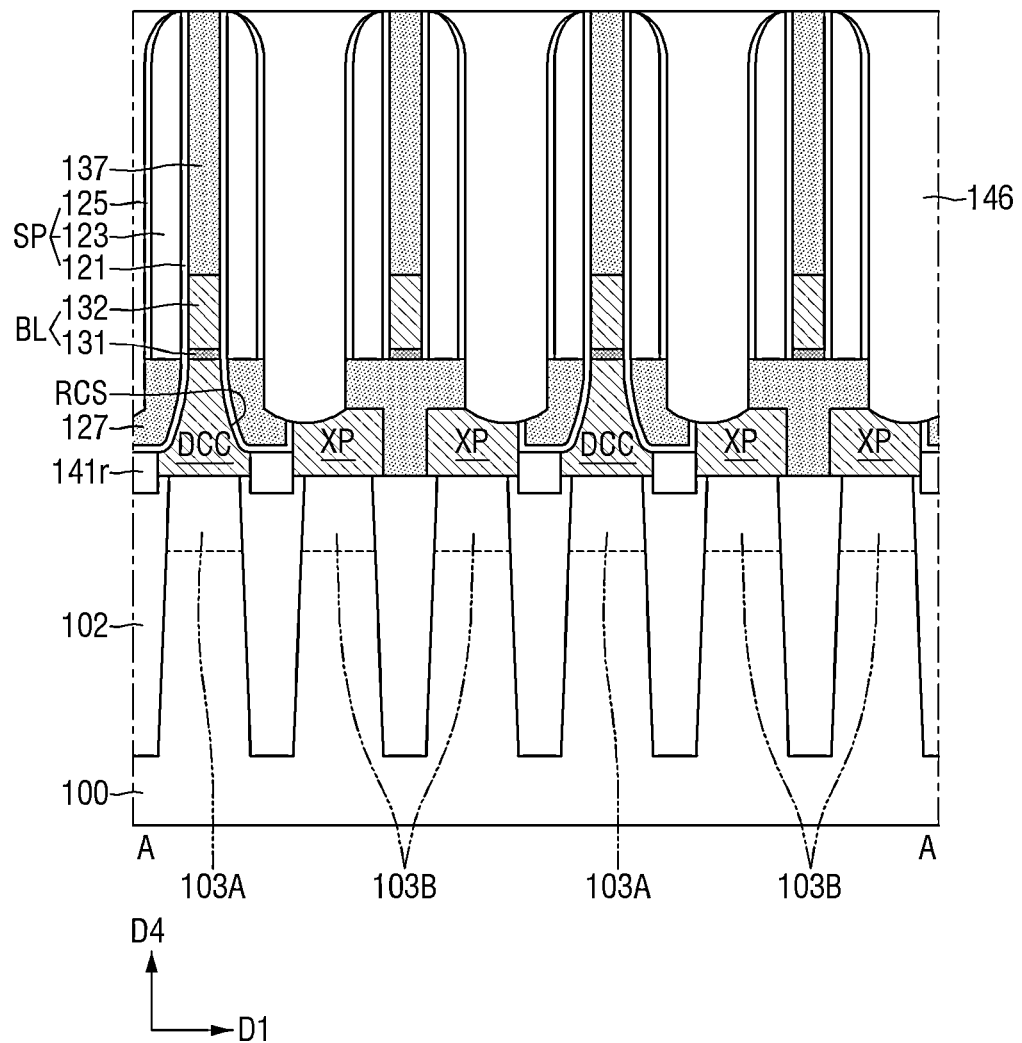

Referring to FIGS. 39 and 40, sacrificial buried films, which fill the gaps between the bit lines BL, may be formed on the substrate 100. Sacrificial buried patterns 146 may be formed between the bit lines BL by etching back and patterning the sacrificial buried films. The sacrificial buried patterns 146 may include, for example, an oxide-based insulating material.

Node separation holes 147H may be formed between the bit lines BL and between the sacrificial buried patterns 146. The sacrificial buried patterns 146 may overlap with the node pads XP. Node separation patterns 147, which fill the node separation holes 147H, may be formed on the substrate 100. The node separation patterns 147 may include, for example, silicon nitride.

Referring to FIGS. 41 and 42, storage contact holes BCH may be formed by removing the sacrificial buried patterns 146. The storage contact holes BCH may expose the node pads XP.

Referring to FIGS. 37 and 38, in a case where the node pads XP are not exposed, the buried insulating patterns 127 and the pad separation patterns 145 may be partially etched after the removal of the sacrificial buried patterns 146. As a result, the node pads XP may be exposed.

Referring again to FIGS. 1 and 4, storage contacts BC, which fill the storage contact holes BCH, may be formed.

Thereafter, landing pads LP may be formed by stacking a conductive film on the storage contacts BC and the bit line capping films 137 and etching the conductive film. Landing pad separation trenches may be formed between the landing pads LP. Landing pad separation patterns LPSP may be formed by filling the landing pad isolation trenches with an insulating film.

Figure 43:
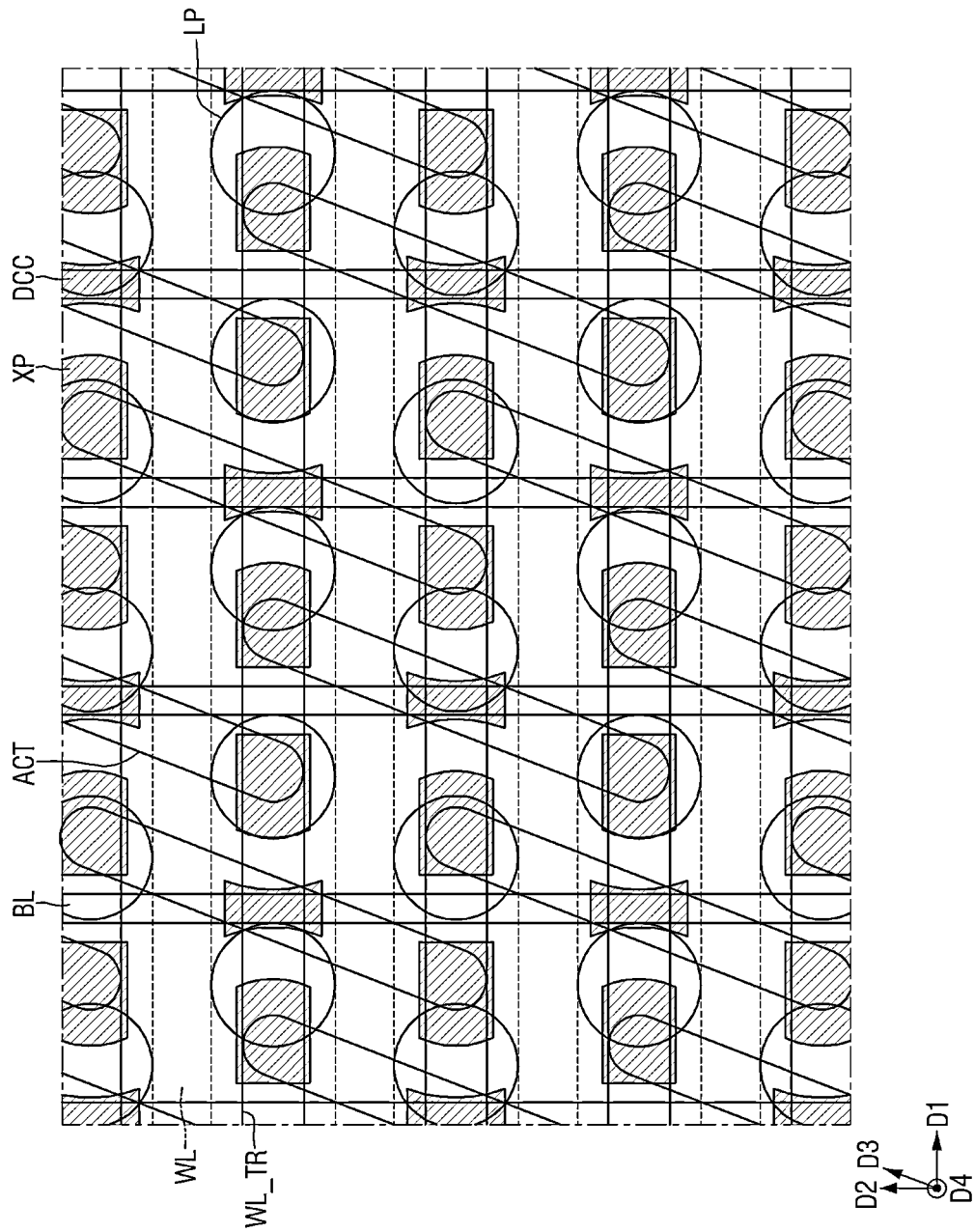
FIG. 43 is a plan view of a cell region of a semiconductor memory device according to some example embodiments of the present disclosure.

FIG. 43 is a plan view of a cell region of a semiconductor memory device according to some example embodiments of the present disclosure.

Referring to FIG. 43, bit line contacts DCC may have a rectangle-like shape in a plan view. Two opposing sidewalls (in a first direction D1) of each of the bit line contacts DCC may be inwardly recessed. Each of the bit line contacts DCC may have a pair of concave sidewalls that are opposite to each other in the first direction D1.

In a plan view, sidewalls of node contacts XP that face the bit line contacts DCC may protrude toward the bit line contacts DCC. The sidewalls of node contacts XP that face the bit line contacts DCC may be convexly curved.

Figure 44:
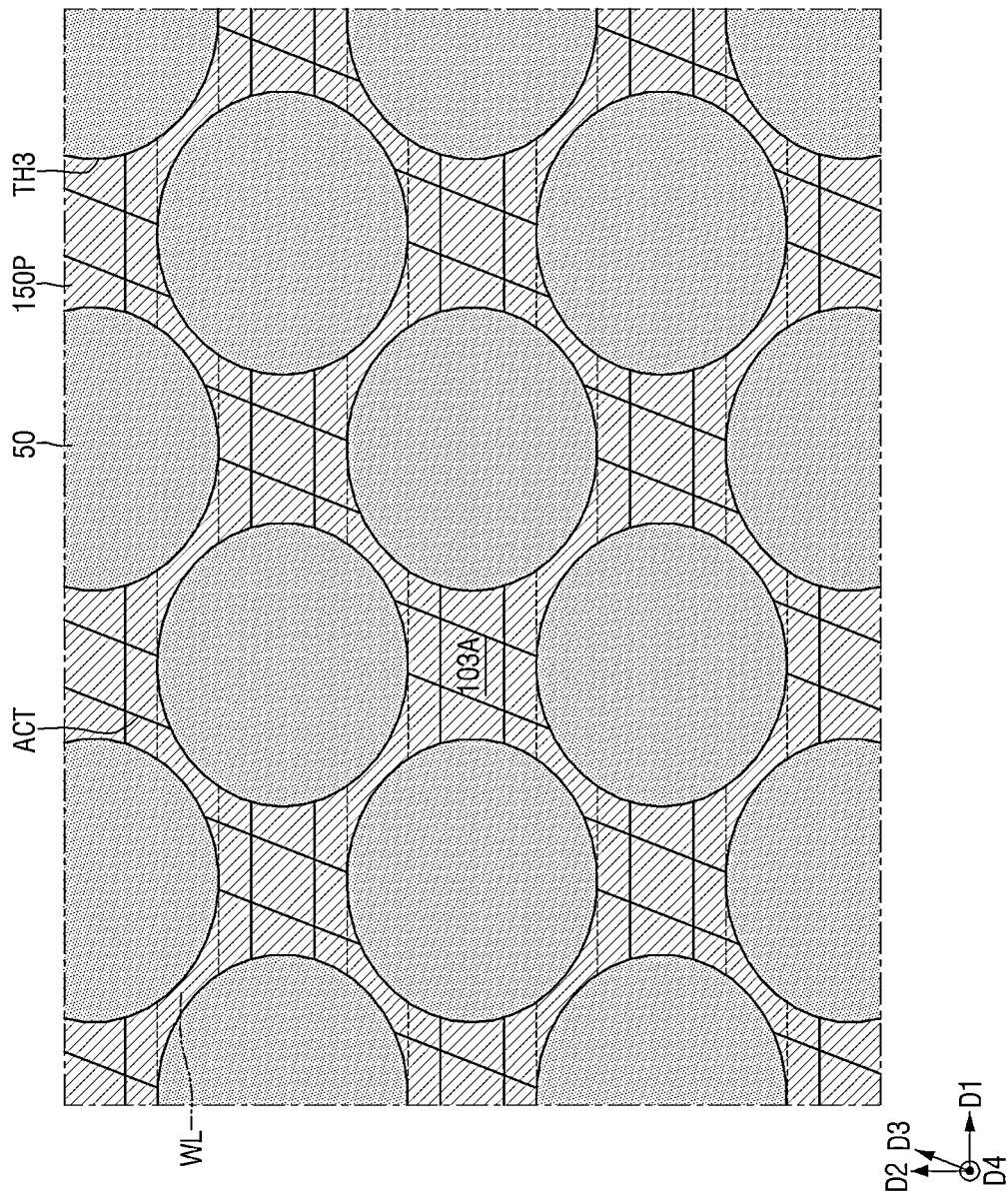
FIG. 44 is a plan view illustrating how to fabricate the semiconductor memory device of FIG. 43.

FIG. 44 is a plan view illustrating how to fabricate the semiconductor memory device of FIG. 43.

Referring to FIG. 44, first mask patterns 50 may be formed as islands that are spaced apart from one another, rather than being formed as a mesh.

The first mask patterns 50 may expose parts of the upper surface of a stack conductive film 150P that overlap first parts 103A of cell active regions ACT. The parts of the upper surface of the stack conductive film 150P, exposed by the first mask patterns 50, may form a mesh shape. Subsequent processes may be the same as, or similar to, their respective counterparts described above with reference to FIGS. 18 through 42.

In concluding the detailed description, those skilled in the art will appreciate that many variations and modifications may be made to the some example embodiments without substantially departing from the principles of the present inventive concepts. Therefore, the disclosed example embodiments of the invention are used in a generic and descriptive sense only and not for purposes of limitation.

What is claimed is:
1. A semiconductor memory device, comprising:
a substrate including an active region defined by a device separation film, the active region including a first part and second parts, the second parts being on two opposite sides of the first part, respectively;
a bit line on the substrate and extending across the active region; and
a bit line contact between the substrate and the bit line and connected to the first part of the active region,
wherein
the bit line contact includes a first ruthenium pattern, and
a width of the first ruthenium pattern gradually increases from an upper portion of the first ruthenium pattern to a lower portion of the first ruthenium pattern.

2. The semiconductor memory device of claim 1, wherein the bit line contact further includes a graphene pattern between the first ruthenium pattern and the substrate.

3. The semiconductor memory device of claim 2, wherein the bit line contact further includes a silicide pattern between the graphene pattern and the substrate.

4. The semiconductor memory device of claim 3, wherein the bit line contact further includes a polysilicon pattern between the substrate and the silicide pattern.

5. The semiconductor memory device of claim 2, wherein a part of the graphene pattern extends along an upper surface of the device separation film.

6. The semiconductor memory device of claim 1, wherein
the bit line contact further includes a conductive barrier film and a silicide pattern that are between the first ruthenium pattern and the substrate, and
the conductive barrier film is between the silicide pattern and the first ruthenium pattern.

7. The semiconductor memory device of claim 6, wherein the bit line contact further includes a polysilicon pattern between the substrate and the silicide pattern.

8. The semiconductor memory device of claim 1, further comprising:
a node pad on the substrate and connected to a corresponding one of the second parts of the active region, wherein
the node pad includes a second ruthenium pattern, and
an upper surface of the node pad is lower than an upper surface of the first ruthenium pattern.

9. The semiconductor memory device of claim 8, wherein the node pad has a same stack structure as the bit line contact.

10. The semiconductor memory device of claim 8, further comprising:
a pad separation pattern on the substrate and covering the upper surface of the node pad.

11. The semiconductor memory device of claim 10, wherein an upper surface of the pad separation pattern is on a same plane as the upper surface of the bit line contact.

12. The semiconductor memory device of claim 8, further comprising:
a contact separation pattern between the node pad and the bit line contact.

13. A semiconductor memory device, comprising:
a substrate including a plurality of active regions defined by a device separation film, each of the active regions including a first part and second parts, the second parts being on two opposite sides of the first part, respectively;
a first node pad and a second node pad connected to the second parts of a corresponding one of the active regions, respectively;
a pad separation pattern on the substrate and interposed between an adjacent pair of the first node pad and the second node pad to provide separation therebetween, the pad separation pattern covering an upper surface of the first node pad and an upper surface of the second node pad;
a bit line contact on the substrate and spaced apart from the first node pad in a first direction, and the bit line contact connected to the first part of the active region;
a first bit line on the pad separation pattern and extending in a second direction, the second direction being different from the first direction; and
a second bit line connected to an upper surface of the bit line contact and spaced apart from the first bit line in the first direction,
wherein each of the bit line contact, the first node pad, and the second node pad includes a ruthenium pattern, and
the upper surface of the first node pad and the upper surface of the second node pad are higher than a bottom surface of the pad separation pattern.

14. The semiconductor memory device of claim 13, wherein the bit line contact further includes graphene pattern between the ruthenium pattern and the substrate.

15. The semiconductor memory device of claim 13, wherein
the bit line contact further includes a conductive barrier film and a silicide pattern that are between the ruthenium pattern and the substrate, and
the conductive barrier film is between the silicide pattern and the ruthenium pattern.

16. The semiconductor memory device of claim 13, wherein the first node pad and the second node pad have a same stack structure as the bit line contact.

17. The semiconductor memory device of claim 13, wherein an upper surface of the pad separation pattern is on a same plane as the upper surface of the bit line contact.

18. The semiconductor memory device of claim 13, wherein in a plan view, the bit line contact has a circular shape or an elliptical shape or have concave sidewalls.

19. A semiconductor memory device, comprising:
a substrate including active region defined by a device separation film, the active region including a first part and second parts, the second parts being on two opposite sides of the first part, respectively;
a word line extending in a first direction between the first part and a corresponding one of the second parts of the active region, the word line being in the substrate and the device separation film;
a bit line contact connected to the first part of the active region;
a node pad connected to a corresponding one of the second parts of the active region;
a bit line on the bit line contact, connected to the bit line contact, and extending in a second direction, the second direction being different from the first direction;
a storage contact connected to the node pad; and
a capacitor connected to the storage contact,
wherein
the bit line contact has a same stack structure as the node pad,
each of the bit line contact and the node pad includes a ruthenium pattern,
an upper surface of the node pad is lower than an upper surface of the bit line contact, and
a width of the bit line contact gradually increases from an upper portion of the bit line contact to a lower portion of the bit line contact.

20. The semiconductor memory device of claim 19, wherein the bit line includes a ruthenium line.

* * * * *